(12) United States Patent
Lee

(10) Patent No.: US 10,797,246 B2
(45) Date of Patent: Oct. 6, 2020

(54) ORGANIC LIGHT-EMITTING DEVICE

(71) Applicant: SAMSUNG DISPLAY CO., LTD., Yongin-si, Gyeonggi-do (KR)

(72) Inventor: Jungsub Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/133,047

(22) Filed: Apr. 19, 2016

(65) Prior Publication Data

US 2017/0054083 A1 Feb. 23, 2017

(30) Foreign Application Priority Data

Aug. 21, 2015 (KR) .................... 10-2015-0118276

(51) Int. Cl.
| | |
|---|---|
| H01L 51/00 | (2006.01) |
| H01L 51/50 | (2006.01) |
| H01L 51/52 | (2006.01) |
| C09K 11/06 | (2006.01) |
| C09K 11/02 | (2006.01) |

(52) U.S. Cl.
CPC ........ H01L 51/0072 (2013.01); C09K 11/025 (2013.01); C09K 11/06 (2013.01); H01L 51/006 (2013.01); H01L 51/0052 (2013.01); H01L 51/0058 (2013.01); H01L 51/0061 (2013.01); H01L 51/0071 (2013.01); H01L 51/0073 (2013.01); H01L 51/0074 (2013.01); H01L 51/0085 (2013.01); H01L 51/5064 (2013.01); C09K 2211/185 (2013.01); H01L 51/506 (2013.01); H01L 51/5036 (2013.01); H01L 51/5206 (2013.01); H01L 51/5221 (2013.01)

(58) Field of Classification Search
CPC .................................. H01L 51/0071–0072
See application file for complete search history.

(56) References Cited

U.S. PATENT DOCUMENTS

| | | | |
|---|---|---|---|
| 2006/0033422 A1* | 2/2006 | Chao | H01L 27/3216 313/500 |
| 2012/0202997 A1 | 8/2012 | Parham et al. | |
| 2012/0292576 A1 | 11/2012 | Parham et al. | |
| 2012/0326141 A1* | 12/2012 | Pflumm | C09K 11/06 257/40 |
| 2013/0026422 A1 | 1/2013 | Parham et al. | |
| 2013/0234118 A1 | 9/2013 | Kwon et al. | |
| 2013/0313532 A1* | 11/2013 | Watanabe | H01L 51/0071 257/40 |
| 2014/0117329 A1* | 5/2014 | Lee | H01L 51/0067 257/40 |
| 2015/0053937 A1 | 2/2015 | Kim et al. | |
| 2015/0090962 A1 | 4/2015 | Kim et al. | |
| 2015/0207075 A1 | 7/2015 | Mujica-Fernaud et al. | |

FOREIGN PATENT DOCUMENTS

| | | |
|---|---|---|
| JP | 2008120769 A * | 5/2008 |
| JP | 2012-234873 A | 11/2012 |
| JP | 2013-243299 A | 12/2013 |
| KR | 10-2012-0087935 A | 8/2012 |
| KR | 10-2012-0129922 | 11/2012 |
| KR | 10-2013-0009614 A | 1/2013 |
| KR | 10-2013-0101830 | 9/2013 |
| KR | 10-2014-0141970 A | 12/2014 |
| KR | 10-2015-0022529 A | 3/2015 |

(Continued)

OTHER PUBLICATIONS

Machine Translation of JP2008-120769A. May 29, 2008. (Year: 2008).*

(Continued)

*Primary Examiner* — Stephen E Rieth

(74) *Attorney, Agent, or Firm* — Lewis Roca Rothgerber Christie LLP

(57) ABSTRACT

An organic light-emitting device includes: a first electrode; a second electrode; and an organic layer including an emission layer and a hole transport region between the first electrode and the second electrode, wherein the hole transport region is between the first electrode and the emission layer, and the hole transport region includes a first compound represented by Formula 1 and a second compound represented by Formula 2:

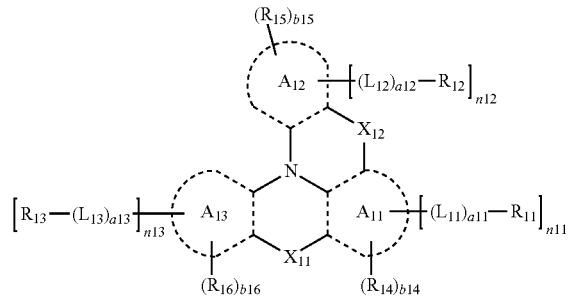

Formula 1

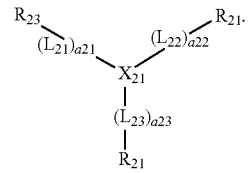

Formula 2

10 Claims, 2 Drawing Sheets

(56) References Cited

FOREIGN PATENT DOCUMENTS

| KR | 10-2015-0035317 A | | 4/2015 |
|---|---|---|---|
| KR | 10-2015-0038193 A | | 4/2015 |
| KR | 20150033272 A | * | 4/2015 |

OTHER PUBLICATIONS

Machine Translation of KR20150033272A. Apr. 1, 2015. (Year: 2015).*
EPO Extended Search Report dated Jan. 10, 2017, for corresponding European Patent Application No. 16182069.1 (6 pages).

* cited by examiner

ORGANIC LIGHT-EMITTING DEVICE

CROSS-REFERENCE TO RELATED APPLICATION

This application claims priority to and the benefit of Korean Patent Application No. 10-2015-0118276, filed on Aug. 21, 2015, in the Korean Intellectual Property Office, the entire disclosure of which is incorporated herein by reference.

BACKGROUND

1. Field

One or more aspects of example embodiments of the present disclosure relate to an organic light-emitting device.

2. Description of the Related Art

Organic light emitting devices are self-emission devices that have wide viewing angles, high contrast ratios, short response times, and excellent brightness, driving voltage, and response speed characteristics, and can produce full-color images.

An organic light-emitting device may include a first electrode disposed (e.g., positioned) on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as the holes and electrons, may then recombine in the emission layer to produce excitons. These excitons change from an excited state to a ground state, thereby generating light.

SUMMARY

One or more aspects of example embodiments of the present disclosure are directed toward an organic light-emitting device.

Additional aspects will be set forth in part in the description which follows and, in part, will be apparent from the description, or may be learned by practice of the presented example embodiments.

According to one or more example embodiments, an organic light-emitting device includes: a first electrode; a second electrode; and an organic layer including an emission layer and a hole transport region between the first electrode and the second electrode, wherein the hole transport region is between the first electrode and the emission layer, and the hole transport region includes a first compound represented by Formula 1 and a second compound represented by Formula 2:

Formula 1

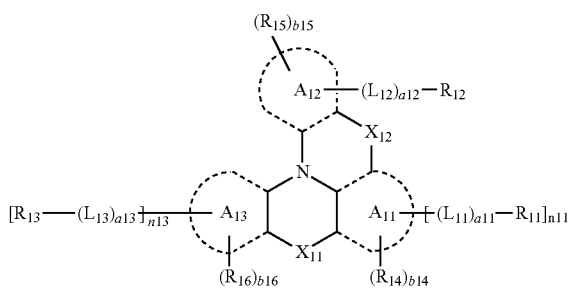

-continued

Formula 2

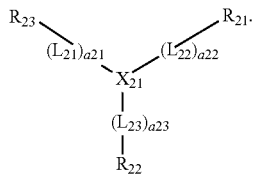

In Formulae 1 and 2, $X_{11}$ may be selected from a single bond, $N(R_{17})$, $P(R_{17})$, $P(R_{17})(R_{18})$, $C(R_{17})(R_{18})$, $Si(R_{17})(R_{18})$, O, and S;

$X_{12}$ may be selected from a single bond, $N(R_{19})$, $P(R_{19})$, $P(R_{19})(R_{20})$, $C(R_{19})(R_{20})$, $Si(R_{19})(R_{20})$, O, and S;

where $X_{11}$ and $X_{12}$ are not both a single bond at the same time;

$X_{21}$ may be selected from B, N, and P;

$A_{11}$ to $A_{13}$ may be each independently selected from a $C_5$-$C_{20}$ cyclic group and a $C_1$-$C_{20}$ heterocyclic group;

$L_{11}$ to $L_{13}$ and $L_{21}$ to $L_{23}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 and a21 to a23 may be each independently selected from 0, 1, 2, 3, 4, and 5;

$R_{11}$ to $R_{13}$ and $R_{21}$ to $R_{23}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{14}$ to $R_{20}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b14 to b16 may be each independently selected from 1, 2, 3, and 4; and n11 to n13 may be each independently selected from 0, 1, and 2, provided that the sum of n11 to n13 is selected from 1, 2, 3, 4, 5, and 6.

According to one or more example embodiments, an organic light-emitting device includes:

a substrate which is divided according to a first sub-pixel region, a second sub-pixel region, and a third sub-pixel region;

a plurality of first electrodes in the first sub-pixel region, the second sub-pixel region, and the third sub-pixel region of the substrate;

a second electrode facing the plurality of first electrodes; and an organic layer including an emission layer and a hole transport region between the second electrode and the plurality of first electrodes, wherein the hole transport region is between the emission layer and the plurality of first electrodes, and the hole transport region includes a first compound represented by Formula 1 and a second compound represented by Formula 2:

Formula 1

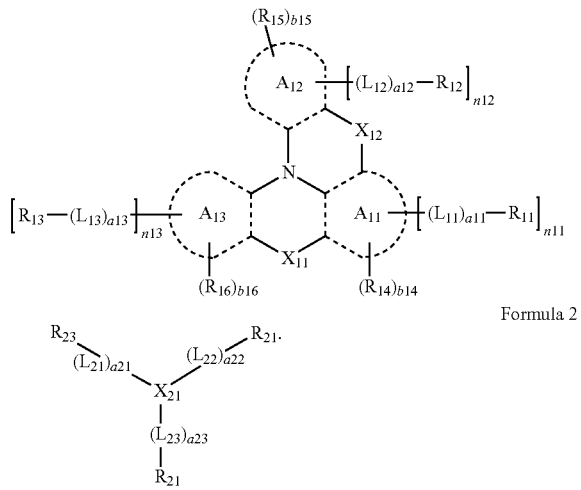

Formula 2

In Formulae 1 and 2, $X_{11}$ may be selected from a single bond, $N(R_{17})$, $P(R_{17})$, $P(R_{17})(R_{18})$, $C(R_{17})(R_{18})$, $Si(R_{17})(R_{18})$, O, and S;

$X_{12}$ may be selected from a single bond, $N(R_{19})$, $P(R_{19})$, $P(R_{19})(R_{20})$, $C(R_{19})(R_{20})$, $Si(R_{19})(R_{20})$, O, and S;

where $X_{11}$ and $X_{12}$ are not both a single bond at the same time;

$X_{21}$ may be selected from B, N, and P;

$A_{11}$ to $A_{13}$ may be each independently selected from a $C_5$-$C_{20}$ cyclic group and a $C_1$-$C_{20}$ heterocyclic group;

$L_{11}$ to $L_{13}$ and $L_{21}$ to $L_{23}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 and a21 to a23 may be each independently selected from 0, 1, 2, 3, 4, and 5;

$R_{11}$ to $R_{13}$ and $R_{21}$ to $R_{23}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{14}$ to $R_{20}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b14 to b16 may be each independently selected from 1, 2, 3, and 4; and n11 to n13 may be each independently selected from 0, 1, and 2, provided that the sum of n11 to n13 is selected from 1, 2, 3, 4, 5, and 6.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
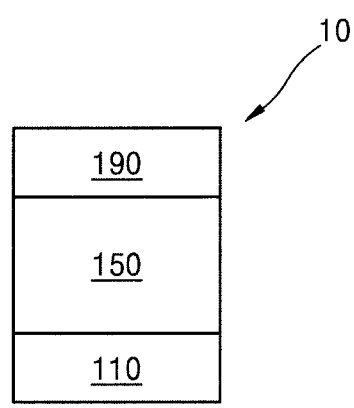
FIG. 1 is a schematic cross-sectional view of an organic light-emitting device according to an example embodiment.

The present disclosure will now be described more fully with reference to example embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages and features of the present invention, and how to achieve them, will become more apparent by reference to the embodiments that will be described later in more detail, together with the accompanying drawings. This invention may, however, be embodied in many different forms and should not be limited to the example embodiments.

Hereinafter, embodiments are described in more detail by referring to the attached drawings, and in the drawings, like reference numerals denote like elements throughout, and thus repeated explanations thereof will not be provided herein.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The expression "(an organic layer) includes an amine-based compound" used herein may refer to (an organic layer) including one or more of the same amine-based compound represented by Formula 1, and (an organic layer) including two or more different amine-based compounds represented by Formula 1.

The term "organic layer" used herein may refer to a single layer and/or a plurality of layers disposed between a first electrode and a second electrode of an organic light-emitting device. A material included in the "organic layer" is not limited to an organic material.

Expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention."

FIG. 1 is a schematic view of an organic light-emitting device 10 according to an embodiment of the present disclosure. The organic light-emitting device 10 includes a first electrode 110, an organic layer 150, and a second electrode 190.

Hereinafter, the structure of an organic light-emitting device according to an embodiment and a method of manufacturing an organic light-emitting device, according to an embodiment, will be described in connection with FIG. 1.

In FIG. 1, a substrate may be additionally disposed (e.g., positioned) under the first electrode 110 or above the second electrode 190. The substrate may be a glass substrate or transparent plastic substrate, each with excellent mechanical strength, thermal stability, transparency, surface smoothness, ease of handling, and/or water-resistance.

The first electrode 110 may be formed by depositing or sputtering a material for forming the first electrode 110 on the substrate. When the first electrode 110 is an anode, the material for the first electrode 110 may be selected from materials with a high work function so as to facilitate hole injection. The first electrode 110 may be a reflective electrode or a transmissive electrode. The material for the first electrode 110 may be a transparent and highly conductive material, and non-limiting examples of such material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode 110, at least one selected from magnesium (Mg), aluminum (Al), aluminum-lithium(Al—Li), calcium (Ca), magnesium-indium (Mg—In), and magnesium-silver (Mg—Ag) may be used.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

The organic layer 150 may be disposed (e.g., positioned) on the first electrode 110. The organic layer 150 may include an emission layer.

The organic layer 150 may further include a hole transport region disposed between the first electrode 110 and the emission layer. The organic layer 150 may further include an electron transport region disposed between the emission layer and the second electrode 190.

The hole transport region may include at least one selected from a hole injection layer, a hole transport layer, a buffer layer; and an electron blocking layer, and the electron transport region may include at least one selected from a hole blocking layer, an electron transport layer, and an electron injection layer; but they are not limited thereto.

The hole transport region may have a single-layered structure including a single material, a single-layered structure including a plurality of different materials, or a multi-layered structure having a plurality of layers formed of a plurality of different materials.

For example, the hole transport region may have a single-layered structure including a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein the layers of each structure are sequentially stacked from the first electrode 110 in this stated order, but the structure of the hole transport region is not limited thereto.

When the hole transport region includes a hole injection layer, the hole injection layer may be formed on the first electrode 110 by using one or more methods selected from vacuum deposition, spin coating, casting, a Langmuir-Blodgett (LB) method, ink-jet printing, laser-printing, and laser-induced thermal imaging.

When a hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, by taking into account a compound for the hole injection layer to be deposited and the structure of the hole injection layer to be formed.

When a hole injection layer is formed by spin coating, for example, the spin coating may be performed at a coating rate of about 2000 rpm to about 5000 rpm and at a temperature of about 80° C. to 200° C., by taking into account a compound for the hole injection layer to be deposited and the structure of the hole injection layer to be formed.

When the hole transport region includes a hole transport layer, the hole transport layer may be formed on the first electrode 110 or the hole injection layer by using one or more methods selected from vacuum deposition, spin coating, casting, an LB method, ink-jet printing, laser-printing, and laser-induced thermal imaging. When the hole transport layer is formed by vacuum deposition and/or spin coating, deposition and coating conditions for the hole transport layer may be the same as or similar to the deposition and coating conditions for the hole injection layer.

The hole transport region may include a first compound represented by Formula 1 and a second compound represented by Formula 2:

Formula 1

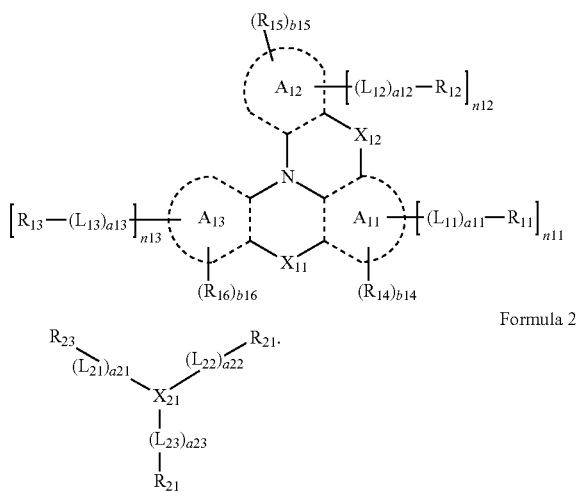

Formula 2

$$R_{23} \diagdown_{(L_{21})_{a21}} \diagup^{R_{21'}}_{(L_{22})_{a22}}$$
$$X_{21}$$
$$|$$
$$(L_{23})_{a23}$$
$$|$$
$$R_{21}$$

In Formula 1, $X_{11}$ may be selected from $N(R_{17})$, $P(R_{17})$, $P(R_{17})(R_{18})$, $C(R_{17})(R_{18})$, $Si(R_{17})(R_{18})$, O, and S, and $R_{17}$ and $R_{18}$ will be described below.

For example, $X_{11}$ in Formula 1 may be selected from $N(R_{17})$, $C(R_{17})(R_{18})$, O, and S, but is not limited thereto. $R_{17}$ and $R_{18}$ will be described below.

$X_{12}$ in Formula 1 may be selected from a single bond, $N(R_{19})$, $P(R_{19})$, $P(R_{19})(R_{20})$, $C(R_{19})(R_{20})$, $Si(R_{19})(R_{20})$, O, and S, and $R_{19}$ and $R_{20}$ will be described below.

For example, $X_{12}$ in Formula 1 may be a single bond, but is not limited thereto.

$X_{21}$ in Formula 2 may be selected from B, N, and P.

For example, $X_{21}$ in Formula 2 may be N, but is not limited thereto.

$A_{11}$ to $A_{13}$ in Formula 1 may be each independently selected from a $C_5$-$C_{20}$ cyclic group and a $C_1$-$C_{20}$ heterocyclic group.

For example, $A_{11}$ to $A_{13}$ in Formula 1 may be each independently selected from a benzene, a naphthalene, a fluorene, a phenanthrene, an anthracene, a triphenylene, a pyrene, a chrysene, a furan, a thiophene, a pyrrole, a pyridine, a pyrazine, a pyrimidine, a pyridazine, a quinoline, an isoquinoline, a quinoxaline, a quinazoline, a benzofuran, a benzothiophene, a dibenzofuran, a dibenzothiophene, and a carbazole, but are not limited thereto.

In some embodiments, $A_{11}$ to $A_{13}$ in Formula 1 may be each independently selected from a benzene, a naphthalene, a fluorene, a phenanthrene, an anthracene, a pyridine, a quinoline, an isoquinoline, and a carbazole, but are not limited thereto.

In some embodiments, $A_{11}$ to $A_{13}$ in Formula 1 may be each independently selected from a benzene, a naphthalene, and a pyridine, but are not limited thereto.

In some embodiments, $A_{11}$ and $A_{12}$ in Formula 1 may be each independently selected from a benzene and a naphthalene; and
$A_{13}$ may be selected from a benzene, a naphthalene, and a pyridine, but are not limited thereto.

In some embodiments, $A_{11}$ to $A_{13}$ in Formula 1 may be each independently selected from a benzene and a naphthalene, but are not limited thereto.

In some embodiments, $A_{11}$ to $A_{13}$ in Formula 1 may be a benzene, but are not limited thereto.

$L_{11}$ to $L_{13}$ and $L_{21}$ to $L_{23}$ in Formulae 1 and 2 may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, $L_{11}$ to $L_{13}$ and $L_{21}$ to $L_{23}$ in Formulae 1 and 2 may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but are not limited thereto.

In some embodiments, $L_{11}$ to $L_{13}$ and $L_{21}$ to $L_{23}$ in Formulae 1 and 2 may be each independently selected from a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzoimidazolylene group, a benzofuranylene group, a benzothiophenylene group, a triazolylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

In some embodiments, $L_{11}$ to $L_{13}$ and $L_{21}$ to $L_{23}$ in Formulae 1 and 2 may be each independently a group represented by any one of Formulae 3-1 to 3-19, but are not limited thereto:

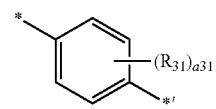

3-1

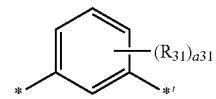

3-2

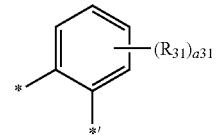

3-3

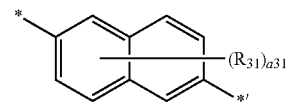

3-4

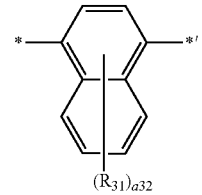

3-5

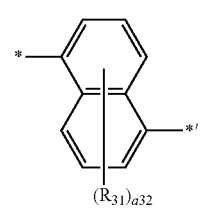

3-6

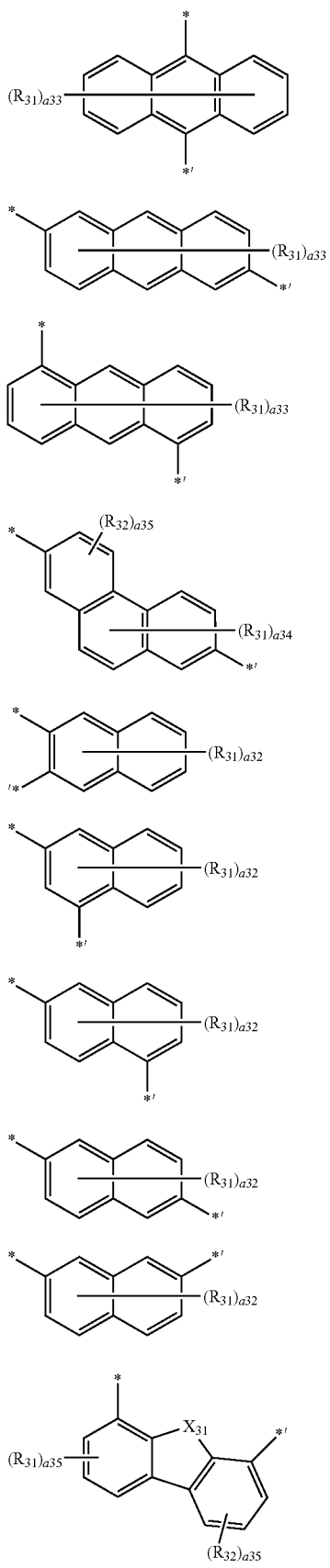
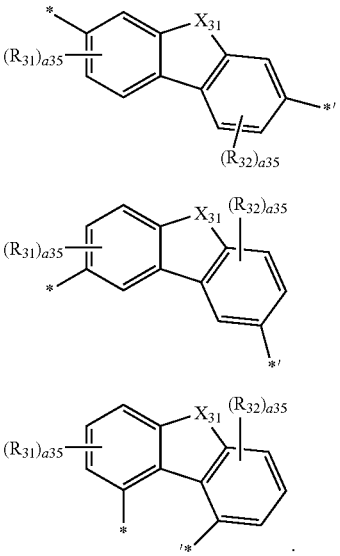

In Formulae 3-1 to 3-19, $X_{31}$ may be selected from O, S, and $C(R_{33})(R_{34})$;

$R_{31}$ to $R_{34}$ may be each independently selected from hydrogen, deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' may be each independently a binding site to a neighboring atom.

a11 in Formula 1 indicates the number of $L_{11}$(s), and a11 may be selected from 0, 1, 2, 3, 4, and 5. When a11 is 0, $(L_{11})_{a11}$ is a single bond. When a11 is 2 or more, a plurality of $L_{11}$(s) may be identical to or different from each other.

a12, a13 and a21 to a23 in Formulae 1 and 2 may be each independently understood by referring to the description of a11 and corresponding formulae. For example, a12, a13 and a21 to a23 in Formulae 1 and 2 may be each independently selected from 0, 1, 2, 3, 4, and 5.

For example, a11 to a13 and a21 to a23 in Formulae 1 and 2 may be each independently selected from 0, 1, and 2, but are not limited thereto.

For example, $(L_{11})_{a11}$, $(L_{12})_{a12}$, $(L_{13})_{a13}$, $(L_{21})_{a21}$, $(L_{22})_{a22}$ and $(L_{23})_{a23}$ in Formulae 1 and 2 may be each independently a group represented by any one of Formulae 4-1 to 4-14, but are not limited thereto:

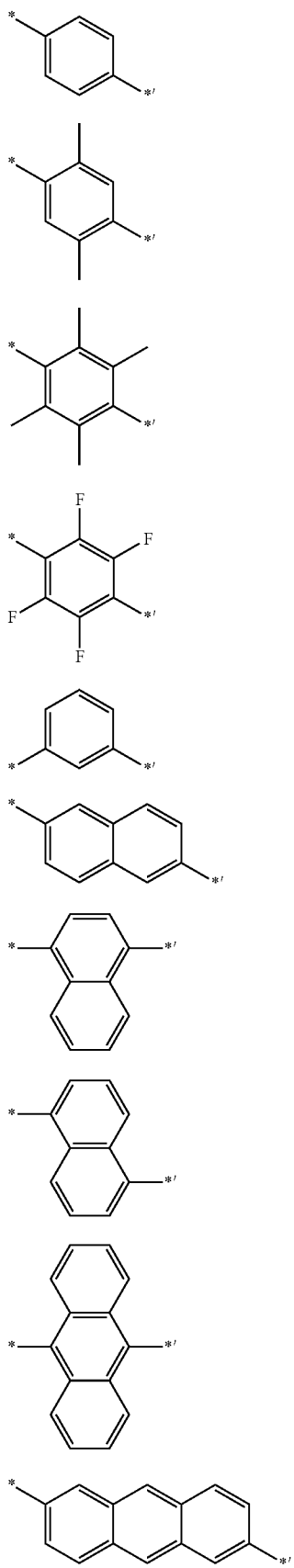

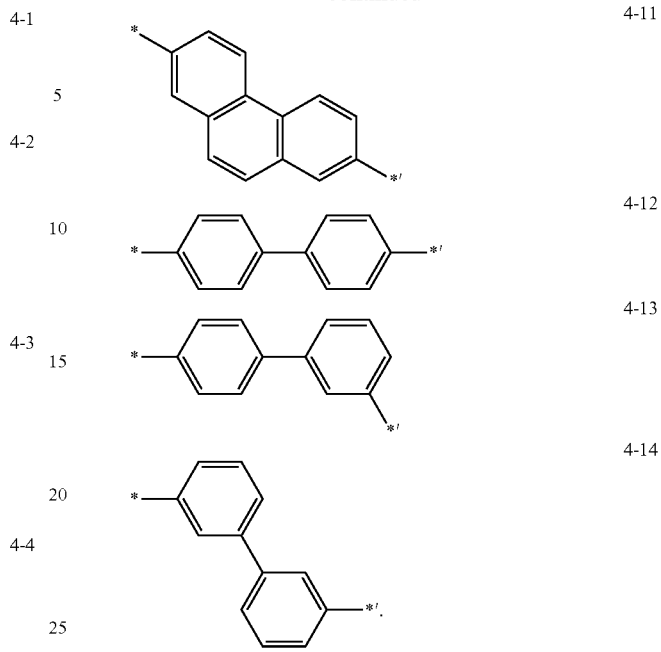

In Formulae 4-1 to 4-14,

* and *' may be each independently a binding site to a neighboring atom.

$R_{11}$ to $R_{13}$ and $R_{21}$ to $R_{23}$ in Formulae 1 and 2 may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $R_{11}$ to $R_{13}$ and $R_{21}$ to $R_{23}$ in Formulae 1 and 2 may be each independently selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a thianthrenyl group, a phenoxathinyl group, and a dibenzodioxinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyrimidinyl group, a thianthrenyl group, a phenoxathinyl group, and a dibenzodioxinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$); and $Q_{33}$ to $Q_{36}$ may be each independently selected from a $C_1$-$C_{60}$ alkyl group and a $C_6$-$C_{60}$ aryl group, but are not limited thereto.

In some embodiments, $R_{11}$ to $R_{13}$ and $R_{21}$ to $R_{23}$ in Formulae 1 and 2 may be each independently a hole transport group, but are not limited thereto.

In some embodiments, $R_{11}$ to $R_{13}$ and $R_{21}$ to $R_{23}$ in Formulae 1 and 2 may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a thianthrenyl group, a phenoxathinyl group, and a dibenzodioxinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, and a carbazolyl group, but are not limited thereto.

In some embodiments, $R_{11}$ to $R_{13}$ and $R_{21}$ to $R_{23}$ in Formulae 1 and 2 may be each independently selected from a phenyl group, a naphthyl group, a fluorenyl group, a spiro-fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group;

a phenyl group, a naphthyl group, a fluorenyl group, a spiro-fluorenyl group, a phenanthrenyl group, an anthracenyl group, a triphenylenyl group, a carbazolyl group, a benzofuranyl group, a benzothiophenyl group, a dibenzofuranyl group, a dibenzothiophenyl group, a thianthrenyl group, a phenoxathinyl group, and a dibenzodioxinyl group, each substituted with at least one selected from deuterium, a cyano group, a $C_1$-$C_{20}$ alkyl group, a $C_1$-$C_{20}$ alkoxy group, a phenyl group, a naphthyl group, a fluorenyl group, and a carbazolyl group, but are not limited thereto.

In some embodiments, $R_{11}$ to $R_{13}$ and $R_{21}$ to $R_{23}$ in Formulae 1 and 2 may be each independently selected from groups represented by Formulae 5-1 to 5-12, but are not limited thereto:

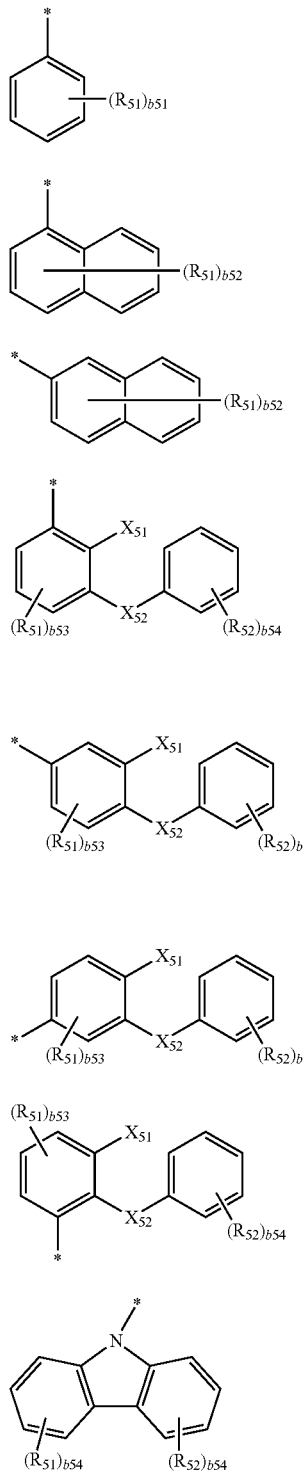

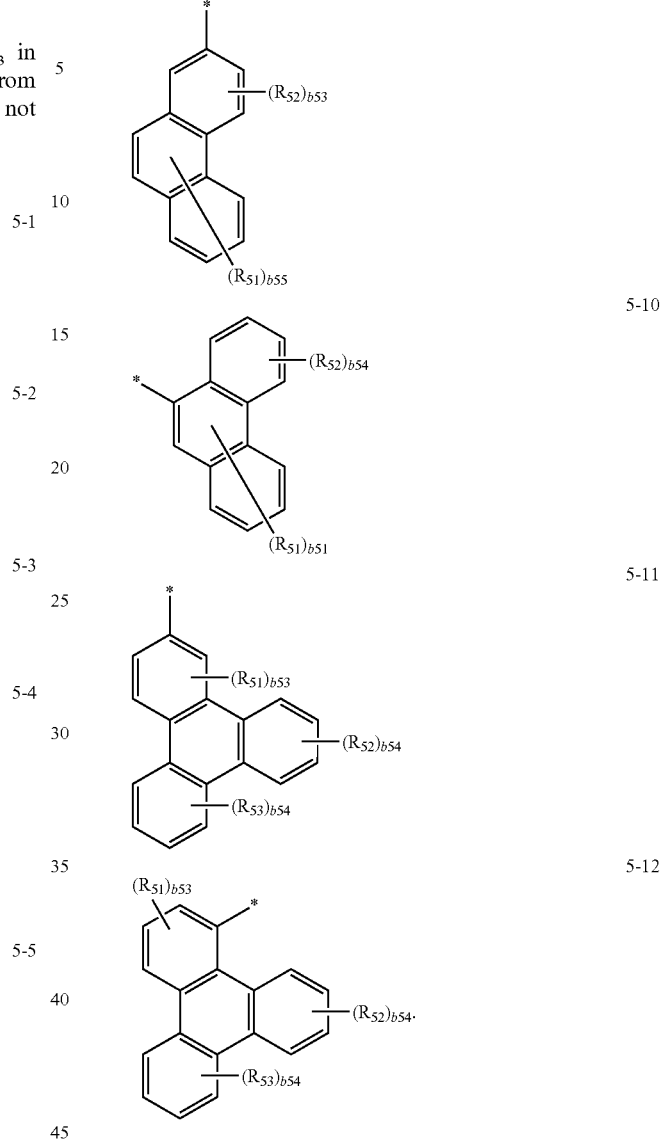

In Formulae 5-1 to 5-12, $X_{51}$ may be selected from a single bond, $N(R_{54})$, $C(R_{54})(R_{55})$, O, and S;

$X_{52}$ may be selected from $N(R_{56})$, $C(R_{56})(R_{57})$, O, and S;

$R_{51}$ to $R_{57}$ may be each independently selected from deuterium, a cyano group, a $C_1$-$C_{20}$ alkyl group, a phenyl group, a naphthyl group, a fluorenyl group, and a carbazolyl group; and $R_{54}$ and $R_{55}$ may optionally bind to each other to form a ring;

b51 may be selected from 1, 2, 3, 4, and 5;

b52 may be selected from 1, 2, 3, 4, 5, 6, and 7;

b53 may be selected from 1, 2, and 3;

b54 may be selected from 1, 2, 3, and 4;

b55 may be selected from 1, 2, 3, 4, 5, and 6; and

* indicates a binding site to a neighboring atom.

In some embodiments, $R_{11}$ to $R_{13}$ and $R_{21}$ to $R_{23}$ in Formulae 1 and 2 may be each independently selected from groups represented by Formulae 6-1 to 6-49, but are not limited thereto:

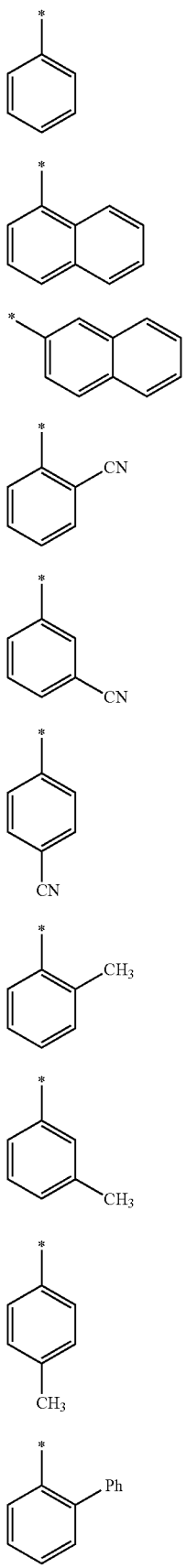
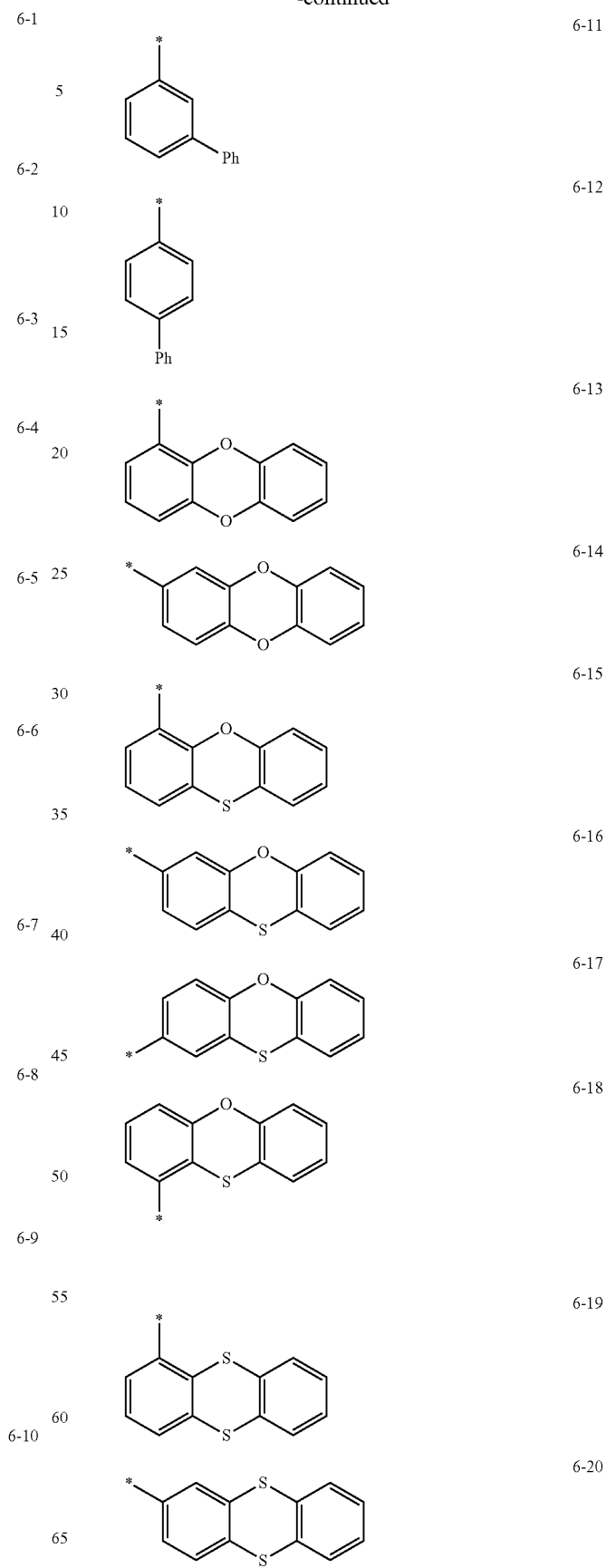

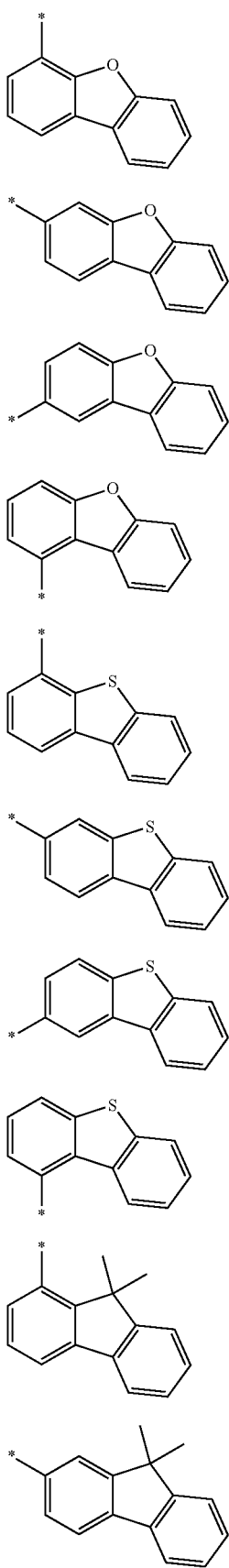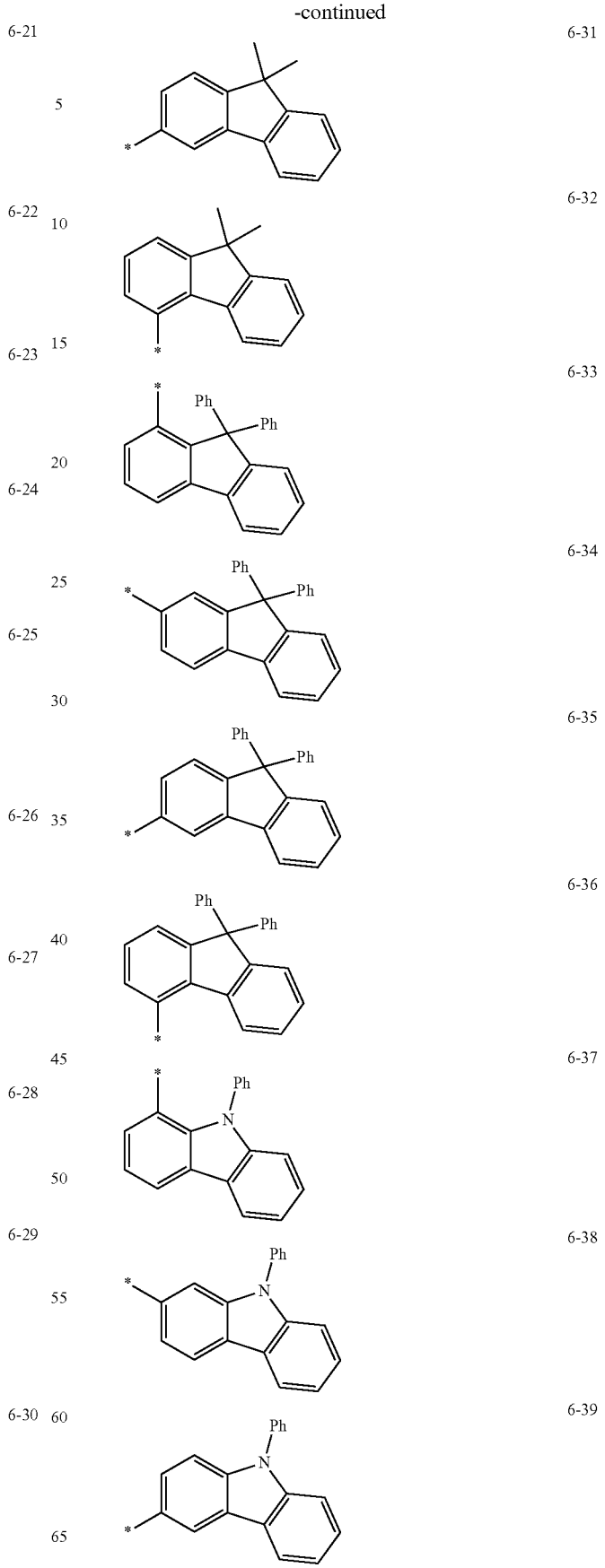

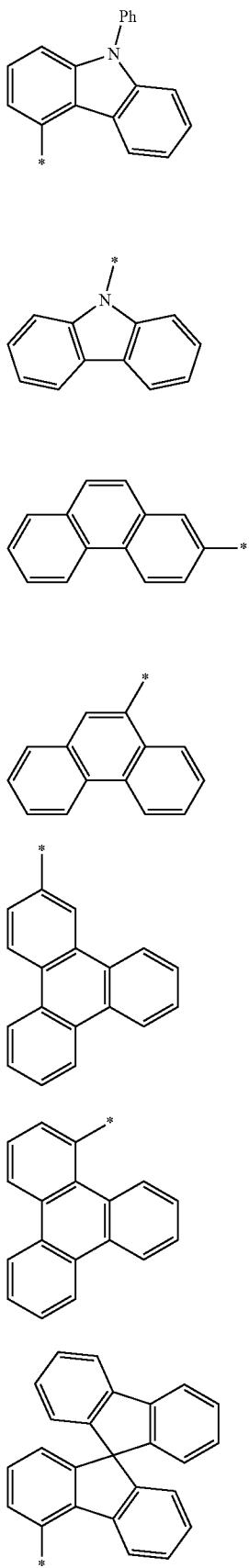

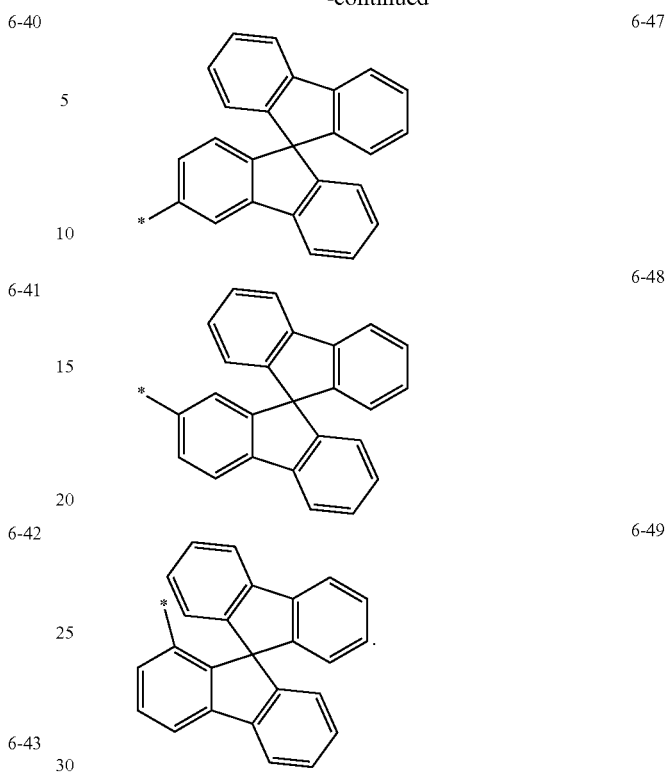

In Formulae 6-1 to 6-49,

Ph may refer to a phenyl group; and

\* indicates a binding site to a neighboring atom.

$R_{14}$ to $R_{20}$ in Formulae 1 and 2 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $R_{14}$ to $R_{20}$ in Formulae 1 and 2 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —Si($Q_1$)($Q_2$)($Q_3$); and $Q_1$ to $Q_3$ may be each independently selected from a $C_1$-$C_{60}$ alkyl group and a $C_6$-$C_{60}$ aryl group, but are not limited thereto.

In some embodiments, $R_{14}$ to $R_{20}$ in Formulae 1 and 2 may be each independently selected from a $C_1$-$C_{60}$ alkyl group, a $C_6$-$C_{60}$ aryl group, a monovalent non-aromatic condensed polycyclic group, and a monovalent non-aromatic condensed heteropolycyclic group, but are not limited thereto.

In some embodiments, $R_{14}$ to $R_{20}$ in Formulae 1 and 2 may be each independently selected from a methyl group, an ethyl group, an n-propyl group, an iso-propyl group, an n-butyl group, iso-butyl group, a sec-butyl group, a tert-butyl group, a phenyl group, a naphthyl group, a dibenzofuranyl group, and a dibenzothiophenyl group, but are not limited thereto.

b14 in Formula 1 indicates the number of $R_{14}$(s), and b14 may be selected from 1, 2, 3, and 4. When b14 is 2 or more, a plurality of $R_{14}$(s) may be identical to or different from each other.

b15 in Formula 1 indicates the number of $R_{15}$(s), and b15 may be selected from 1, 2, 3, and 4. When b15 is 2 or more, a plurality of $R_{15}$(s) may be identical to or different from each other.

b16 in Formula 1 indicates the number of $R_{16}$(s), and b16 may be selected from 1, 2, 3, and 4. When b16 is 2 or more, a plurality of $R_{16}$(s) may be identical to or different from each other.

n11 in Formula 1 indicates the number of groups represented by *-$(L_{11})_{a11}$-$R_{11}$, and n11 may be selected from 0, 1, and 2. When n11 is 2, two groups represented by *-$(L_{11})_{a11}$-$R_{11}$ may be identical to or different from each other.

n12 in Formula 1 indicates the number of groups represented by *-$(L_{12})_{a12}$-$R_{12}$, and n12 may be selected from 0, 1, and 2. When n12 is 2, two groups represented by *-$(L_{12})_{a12}$-$R_{12}$ may be identical to or different from each other.

n13 in Formula 1 indicates the number of groups represented by *-$(L_{13})_{a13}$-$R_{13}$, and n13 may be selected from 0, 1, and 2. When n13 is 2, two groups represented by *-$(L_{13})_{a13}$-$R_{13}$ may be identical to or different from each other.

The sum of n11 to n13 in Formula 1 may be selected from 1, 2, 3, 4, 5, and 6.

For example, n11 to n13 in Formula 1 may be selected from 0 and 1, provided that the sum of n11 to n13 is selected from 1 and 2, but they are not limited thereto.

In some embodiments, n11 to n13 in Formula 1 are each independently selected from 0 and 1, provided that the sum of n11 to n13 is 1, but they are not limited thereto.

In some embodiments, the first compound represented by Formula 1 may be represented by one of Formulae 1-1 to 1-3, but is not limited thereto:

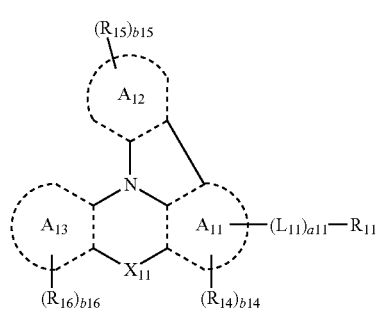

1-1

-continued

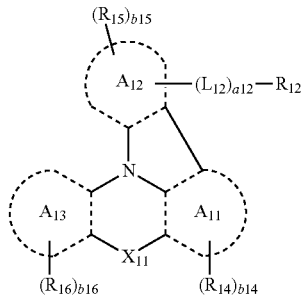

1-2

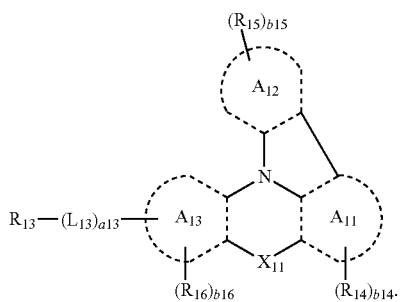

1-3

In Formulae 1-1 to 1-3, $X_{11}$ may be selected from $N(R_{17})$, $P(R_{17})$, $P(R_{17})(R_{18})$, $C(R_{17})(R_{18})$, $Si(R_{17})(R_{18})$, O, and S; and $A_{11}$ to $A_{13}$, $L_{11}$ to $L_{13}$, a11 to a13, $R_{11}$ to $R_{13}$, $R_{14}$ to $R_{16}$, and b14 to b16 may be the same as described herein in connection with Formula 1.

For example, $A_{11}$ to $A_{13}$ in Formulae 1-1 to 1-3 may be each independently selected from a benzene and a naphthalene, but are not limited thereto.

In some embodiments, in Formulae 1-1 to 1-3, $A_{11}$ and $A_{12}$ may be a benzene, and $A_{13}$ may be a naphthalene; in some embodiments, each of $A_{12}$ and $A_{13}$ may be a benzene, and $A_{11}$ may be a naphthalene; and in some embodiments, each of $A_{13}$ and $A_{11}$ may be a benzene, and $A_{12}$ may be a naphthalene, but are not limited thereto.

In some embodiments, $A_{11}$ to $A_{13}$ in Formulae 1-1 to 1-3 may each be a benzene, but are not limited thereto.

In some embodiments, the compound represented by Formula 1 may be represented by one of Formulae 1-11 to 1-13, but is not limited thereto:

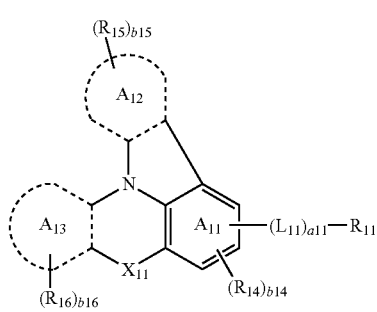

1-11

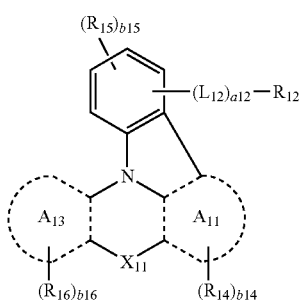
1-12
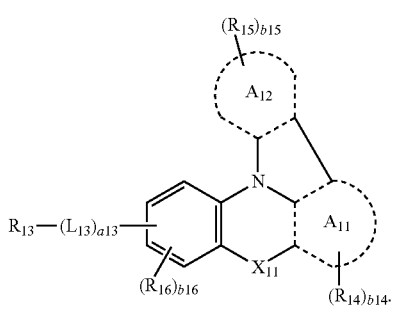
1-13
In Formulae 1-11 to 1-13,
$X_{11}$ may be selected from $N(R_{17})$, $P(R_{17})$, $P(R_{17})(R_{18})$, $C(R_{17})(R_{18})$, $Si(R_{17})(R_{18})$, O, and S; and
$A_{11}$ to $A_{13}$, $L_{11}$ to $L_{13}$, a11 to a13, $R_{11}$ to $R_{13}$, $R_{14}$ to $R_{16}$ and b14 to b16 may be the same as described herein in connection with Formula 1.
In some embodiments, the compound represented by Formula 1 may be represented by any one of Formulae 1-21 to 1-31, but is not limited thereto:
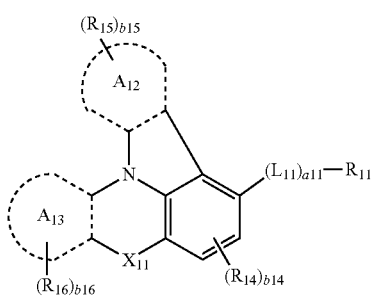
1-21
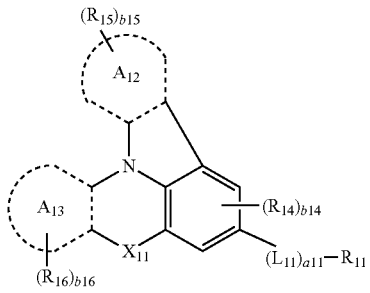
1-22
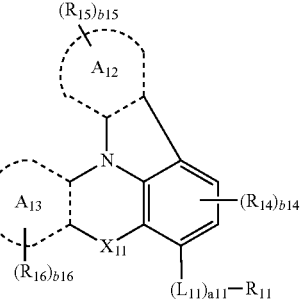
1-23
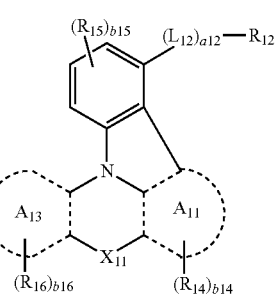
1-24
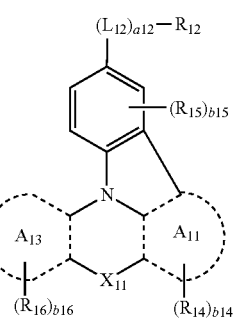
1-25
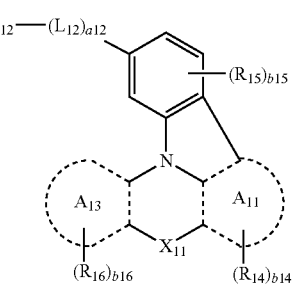
1-26
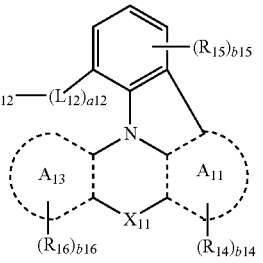
1-27

-continued

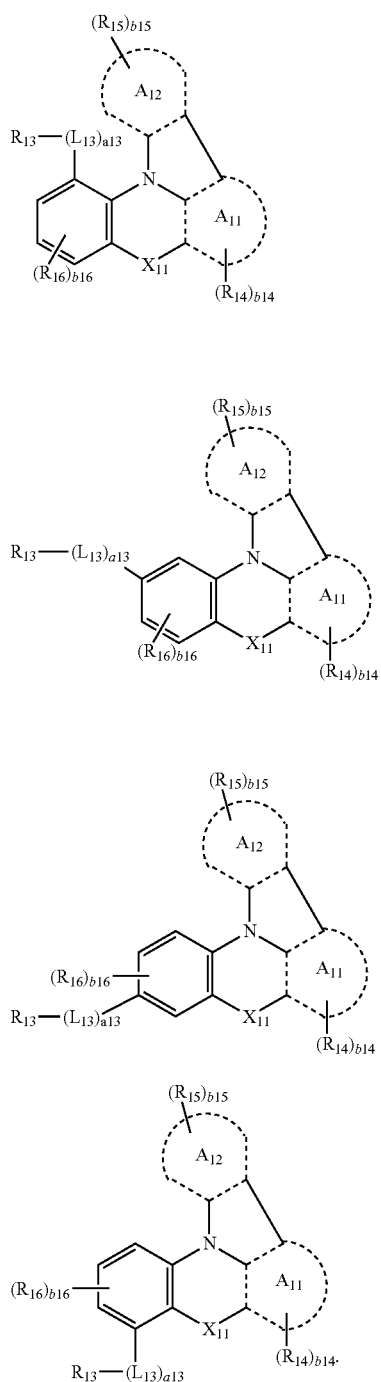

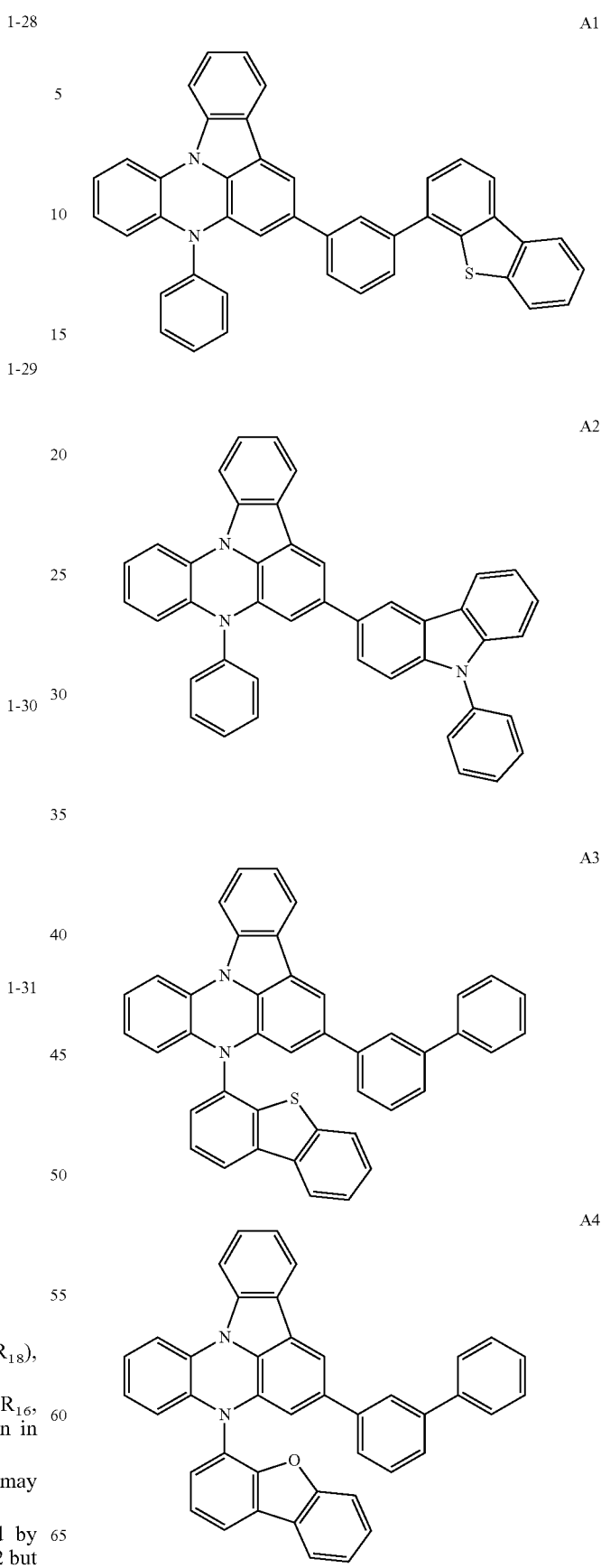

In Formulae 1-21 to 1-31, $X_{11}$ may be selected from $N(R_{17})$, $P(R_{17})$, $P(R_{17})(R_{18})$, $C(R_{17})(R_{18})$, $Si(R_{17})(R_{18})$, O, and S; and $A_{11}$ to $A_{13}$, $L_{11}$ to $L_{13}$, a11 to a13, $R_{11}$ to $R_{13}$, $R_{14}$ to $R_{16}$, and b14 to b16 may be the same as described herein in connection with Formula 1.

For example, $A_{11}$ to $A_{13}$ in Formulae 1-21 to 1-31 may each be a benzene, but are not limited thereto.

In some embodiments, the compound represented by Formula 1 may be selected from Compounds A1 to A52 but is not limited thereto:

A5
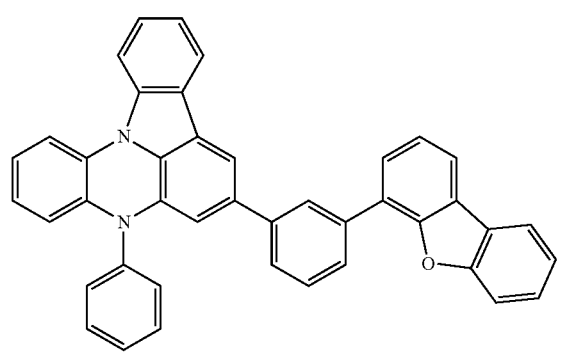
A9
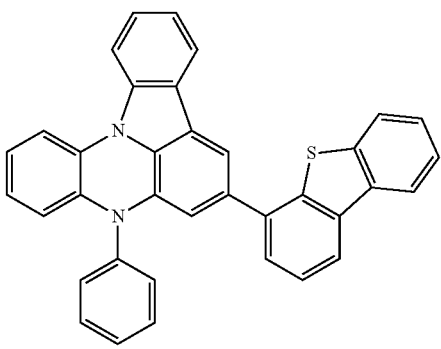
A6
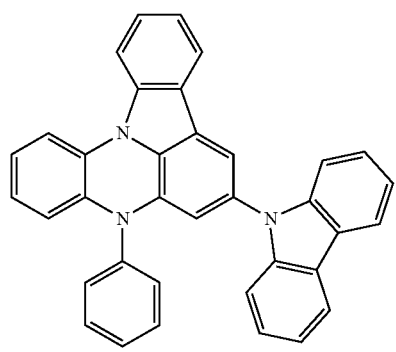
A10
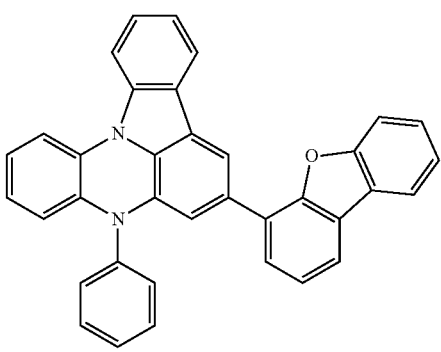
A7
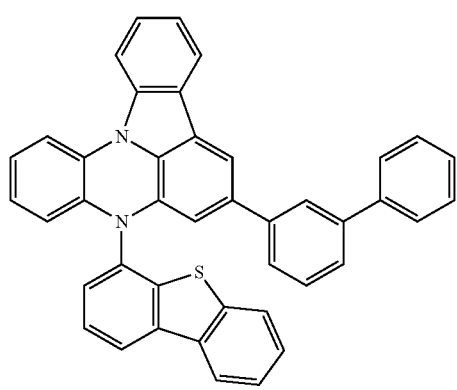
A11
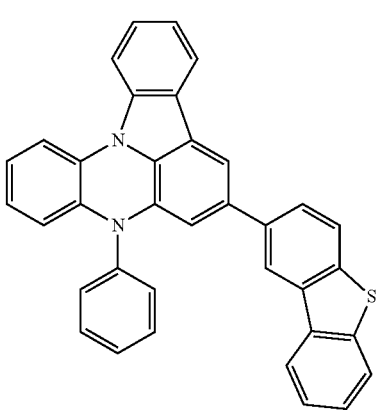
A8
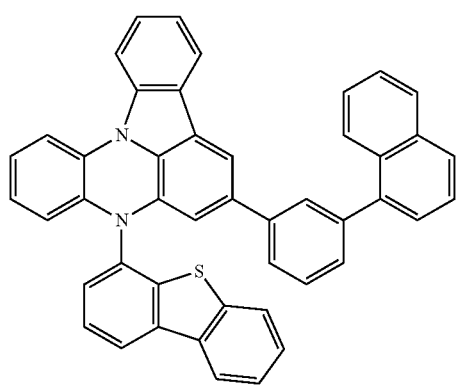
A12
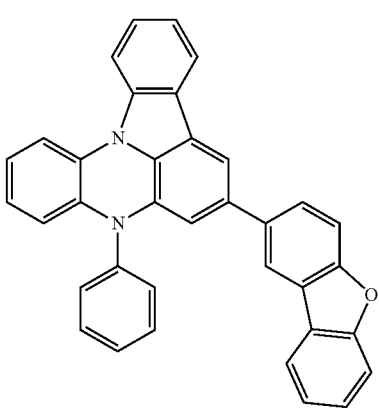

A13
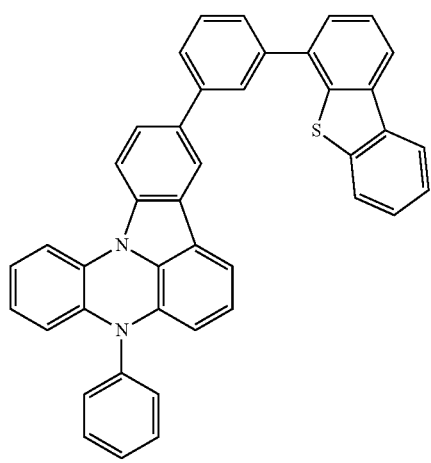
A14
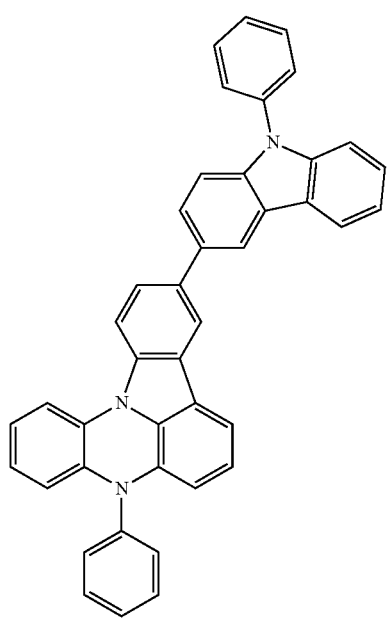
A15
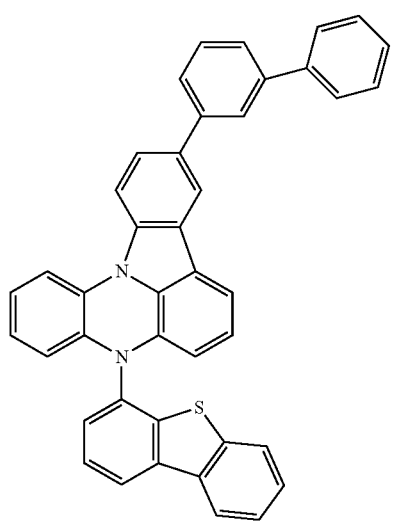
A16
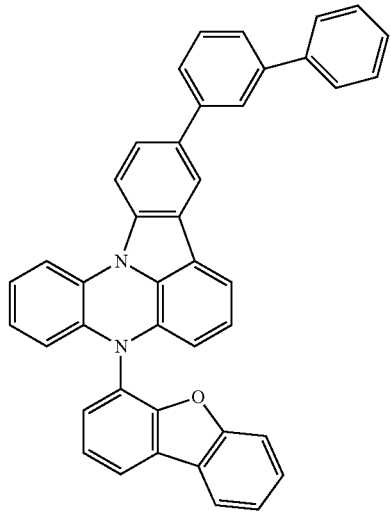
A17
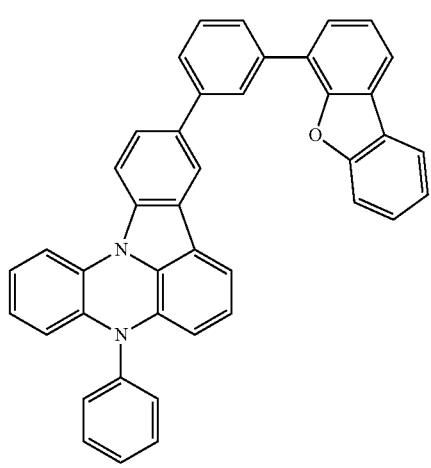
A18
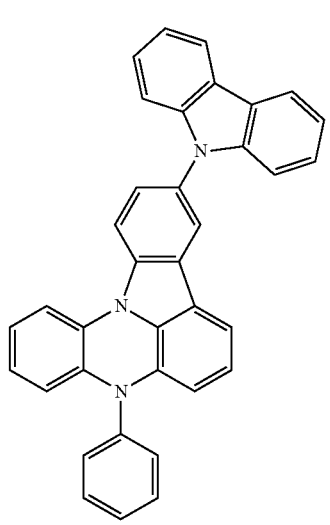

A19
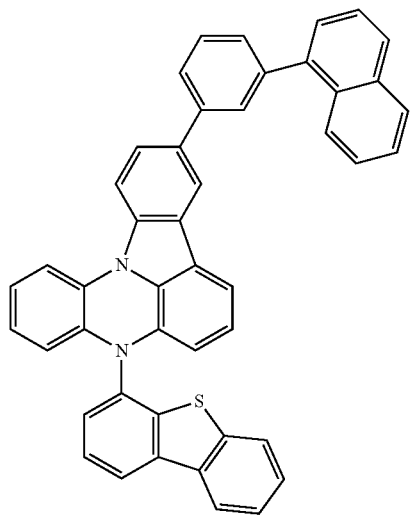
A20
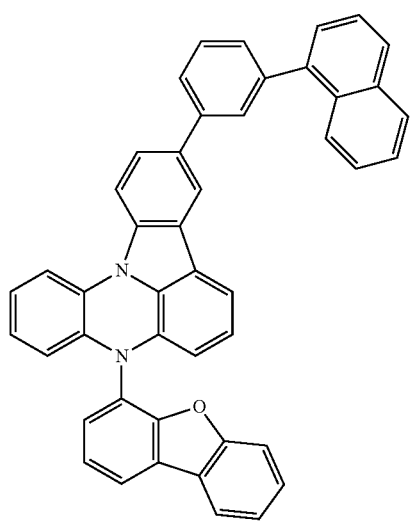
A21
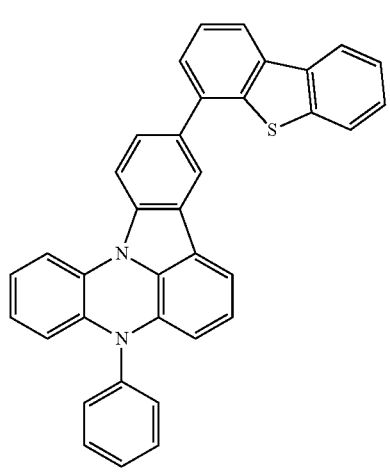
A22
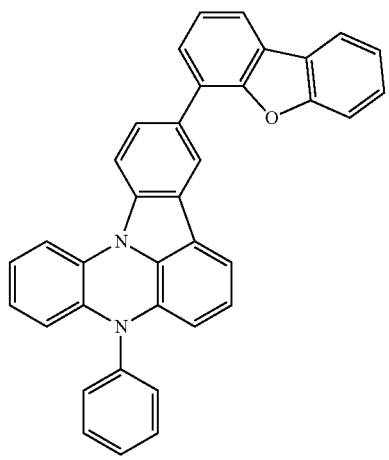
A23
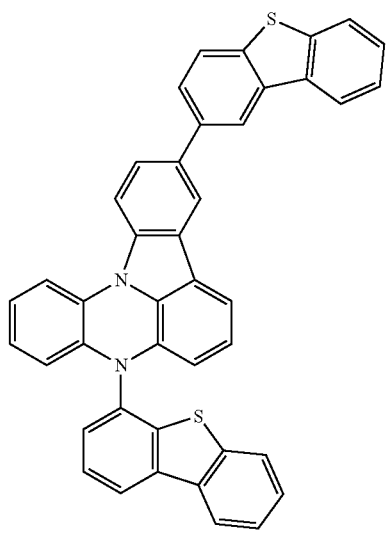
A24
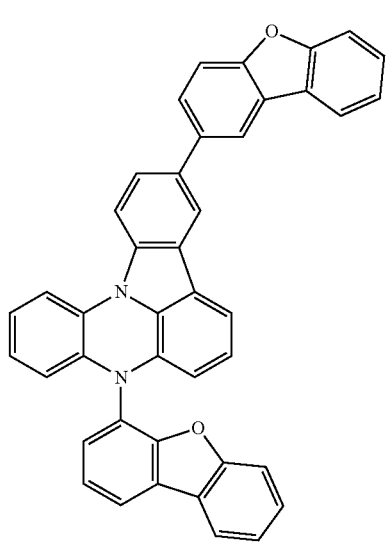

A25
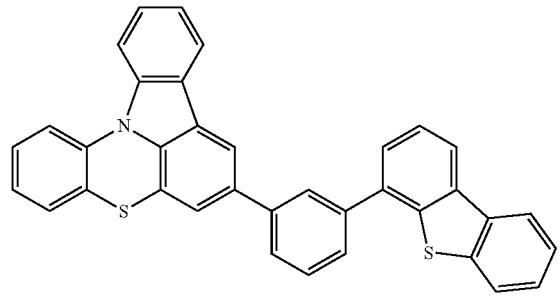
A26
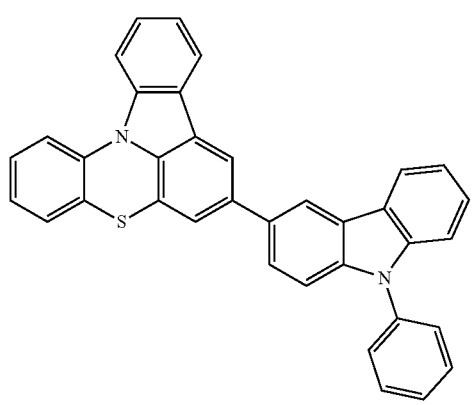
A27
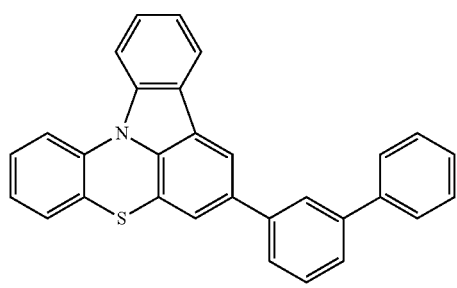
A28
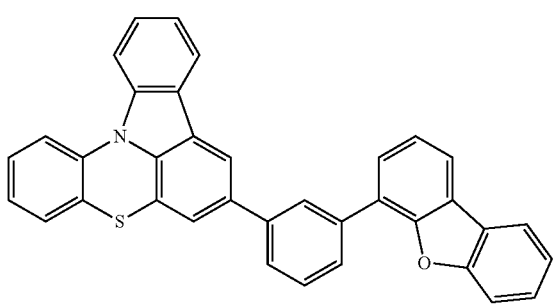
A29
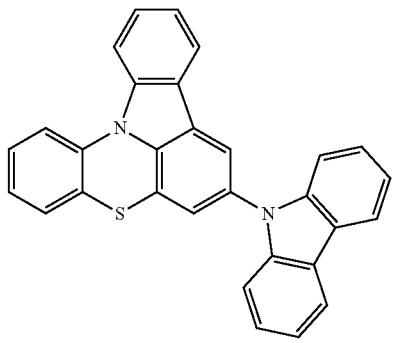
A30
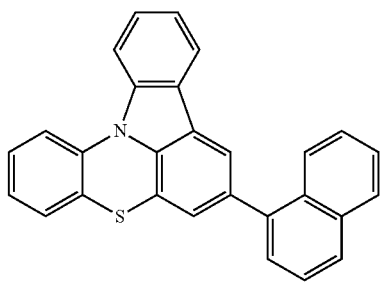
A31
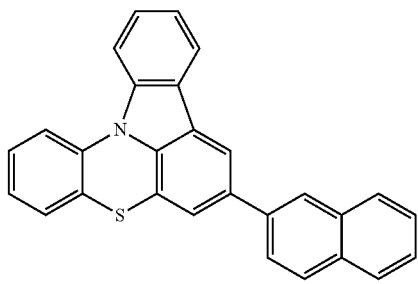
A32
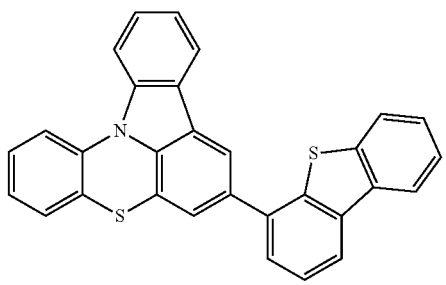
A33
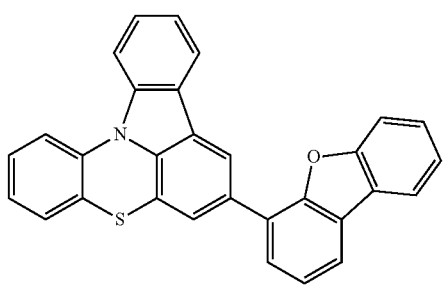

-continued
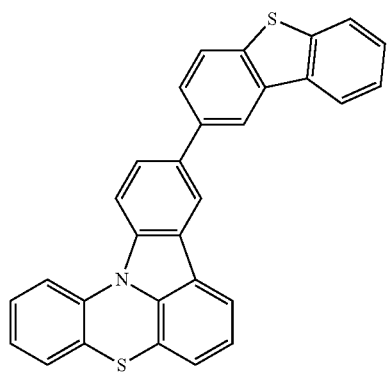
A34
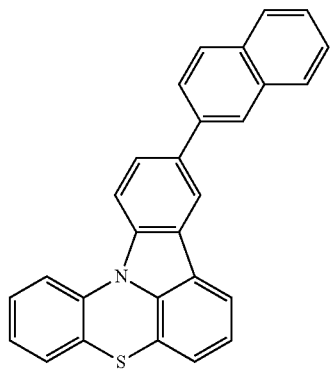
A38
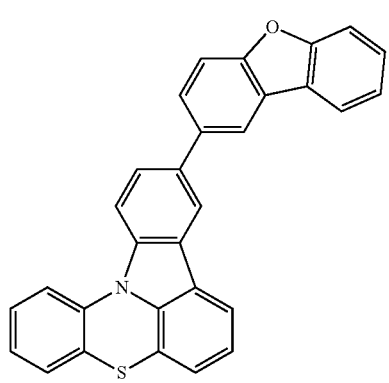
A35
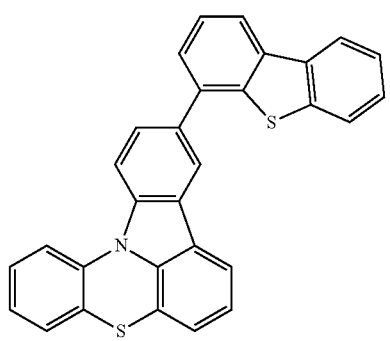
A39
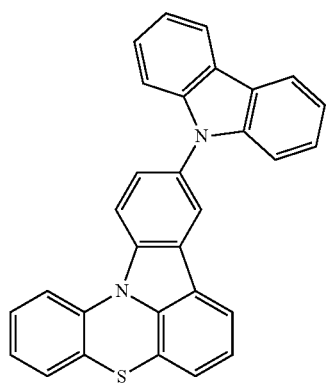
A36
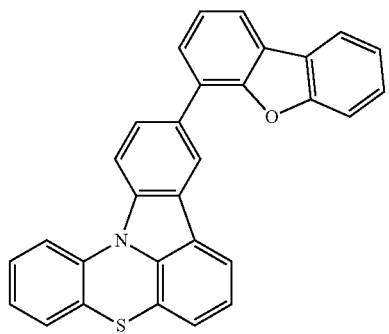
A40
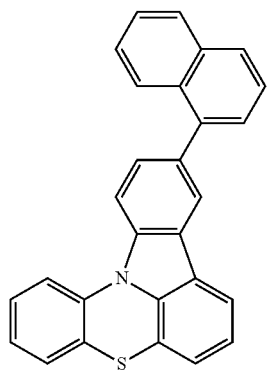
A37
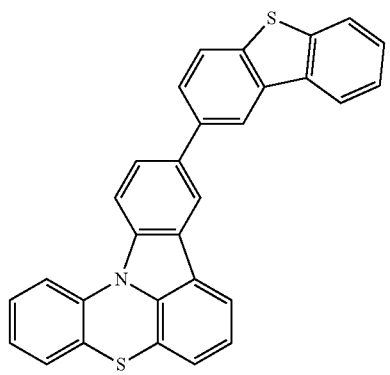
A41

A42
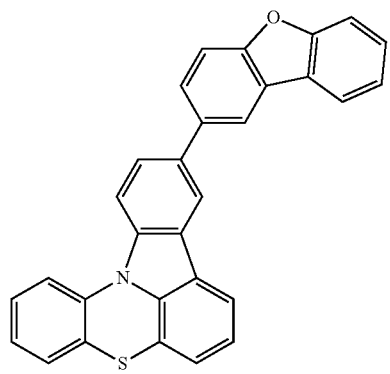
A43
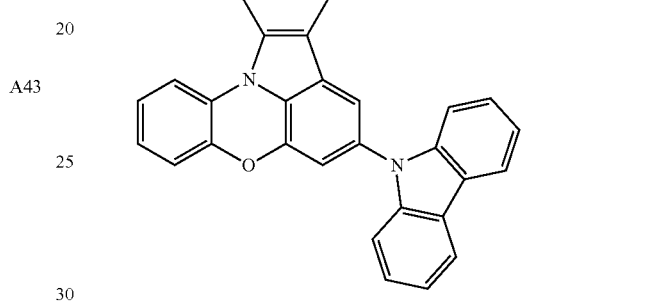
A44
A45
A46
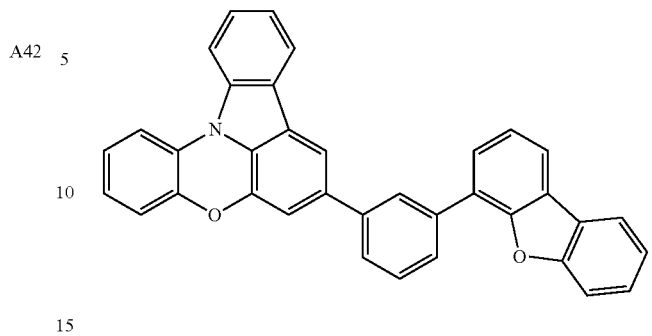
A47
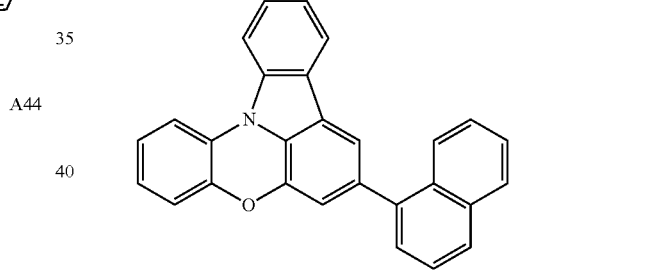
A48
A49
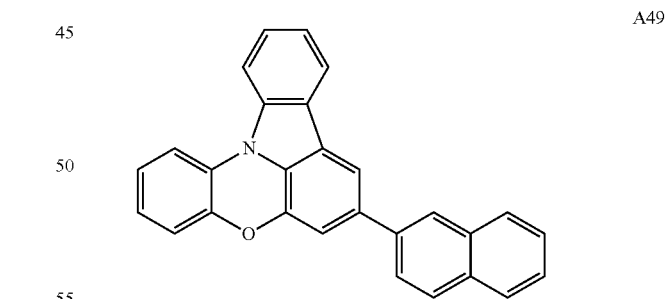
A50
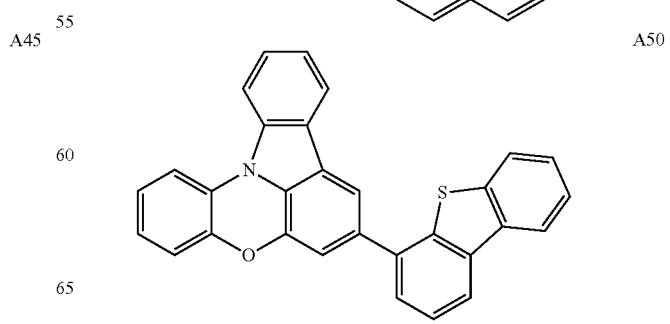

A51

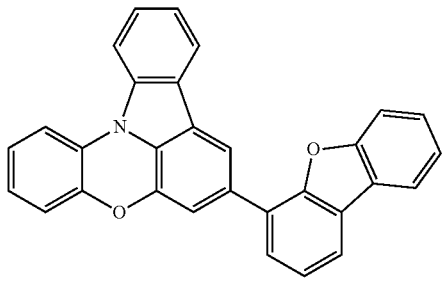

A52

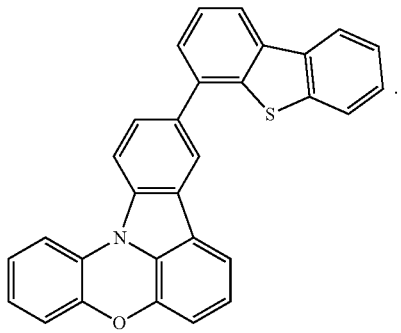

In some embodiments, the second compound represented by Formula 2 may be represented by Formula 2-1, but is not limited thereto:

Formula 2-1

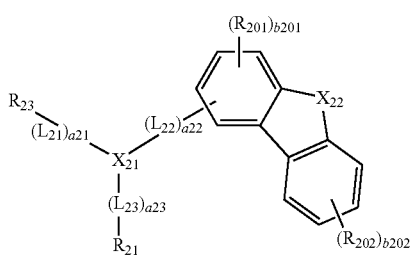

In Formula 2-1, $X_{21}$, $L_{21}$ to $L_{23}$, a21 to a23, $R_{22}$, and $R_{23}$ may be the same as described herein in connection with Formula 2;

$X_{22}$ may be selected from $N(R_{203})$, $C(R_{203})(R_{204})$, O, and S;

$R_{201}$ to $R_{204}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b201 may be selected from 1, 2, and 3; and b202 may be selected from 1, 2, 3, and 4.

In some embodiments, the second compound represented by Formula 2 may be represented by Formula 2-11, but is not limited thereto:

Formula 2-11

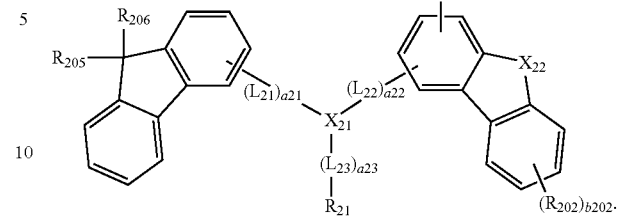

In Formula 2-11, $X_{12}$, $L_{21}$ to $L_{23}$, a21 to a23, and $R_{22}$ may be the same as described herein in connection with Formula 2;

$X_{22}$ may be selected from $N(R_{203})$, O, and S;

$R_{201}$ to $R_{203}$, $R_{205}$, and $R_{206}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b201 may be selected from 1, 2 and 3; and b202 may be selected from 1, 2, 3, and 4.

In some embodiments, the second compound represented by Formula 2 may be represented by any one of Formulae 2-21 to 2-36, but is not limited thereto:

2-21

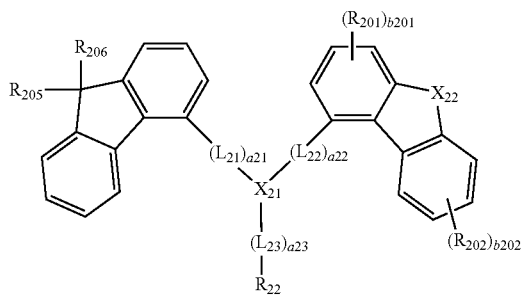

2-22

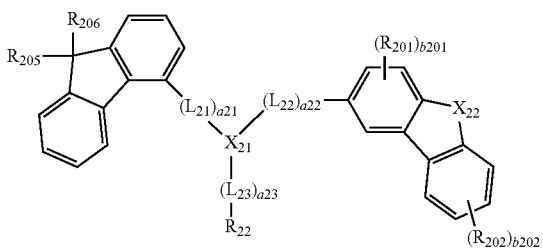

2-23
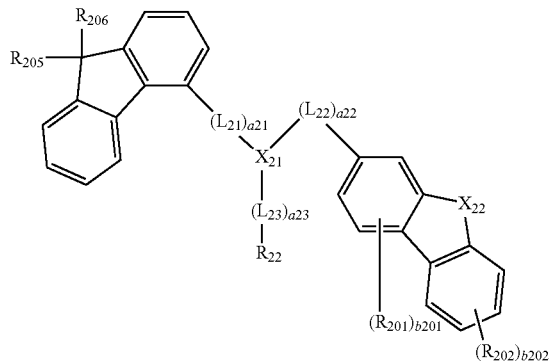
2-24
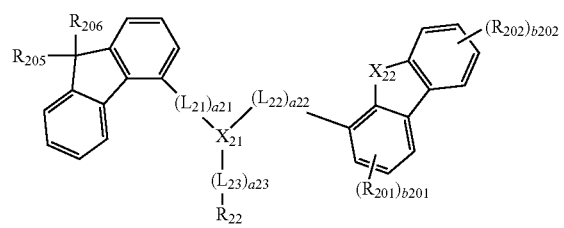
2-25
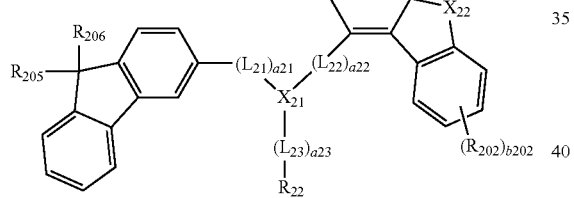
2-26
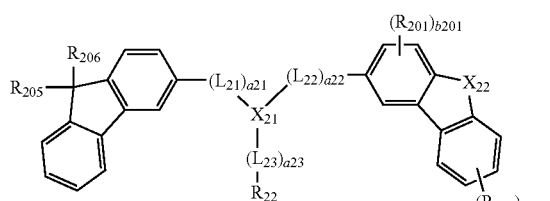
2-27
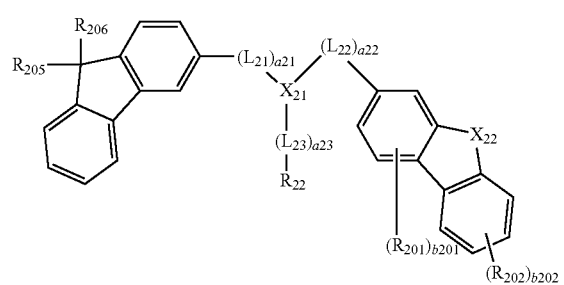
2-28
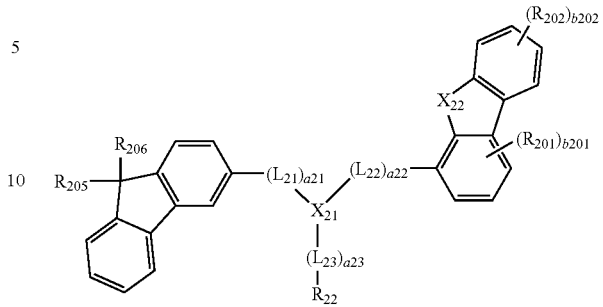
2-29
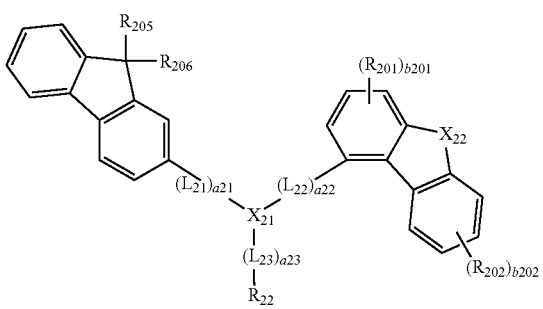
2-30
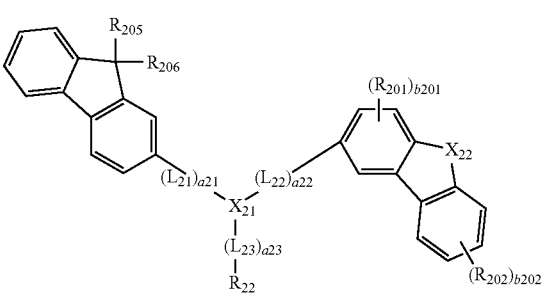
2-31
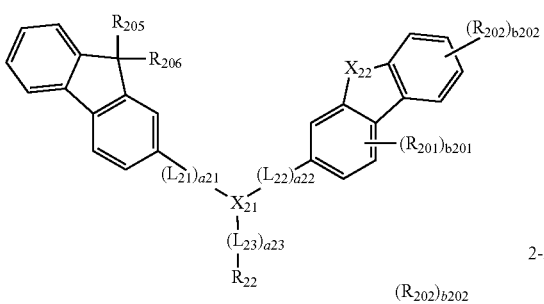
2-32
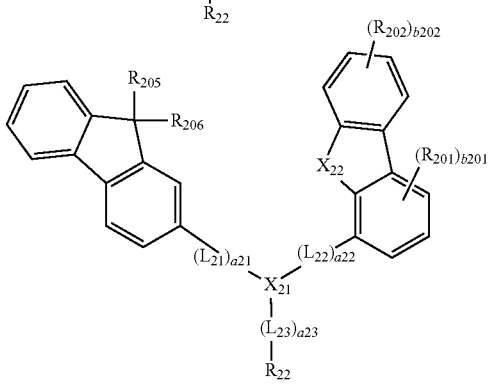

2-33

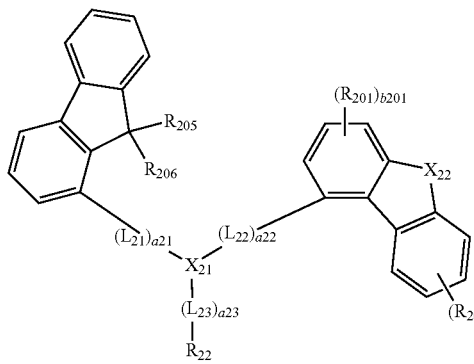

2-34

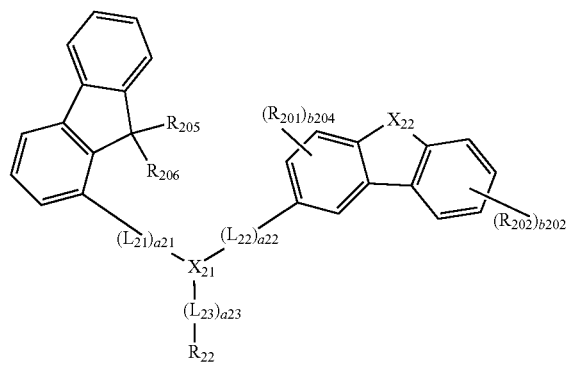

2-35

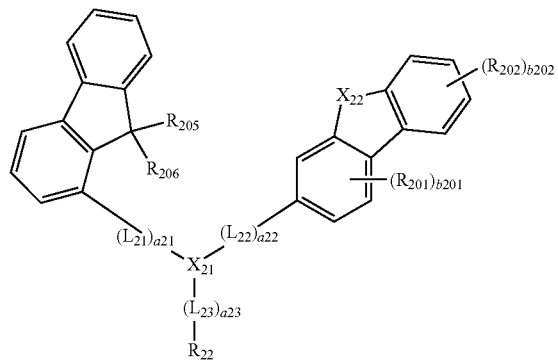

2-36

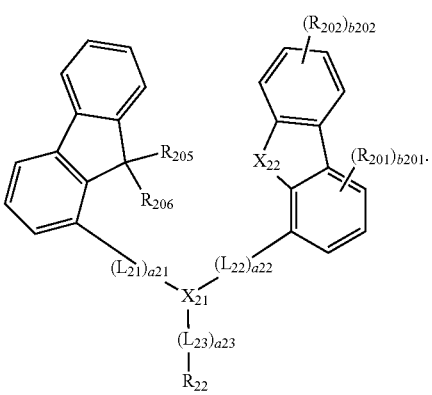

In Formulae 2-21 to 2-36, $X_{12}$, $L_{21}$ to $L_{23}$, a21 to a23, and $R_{22}$ may be the same as described herein in connection with Formula 2;

$X_{22}$ may be selected from $N(R_{203})$, O, and S;

$R_{201}$ to $R_{203}$, $R_{205}$, and $R_{206}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b201 may be selected from 1, 2, and 3; and b202 may be selected from 1, 2, 3, and 4.

In some embodiments, the second compound represented by Formula 2 may be represented by one of Formulae 2-41 to 2-44, but is not limited thereto:

2-41

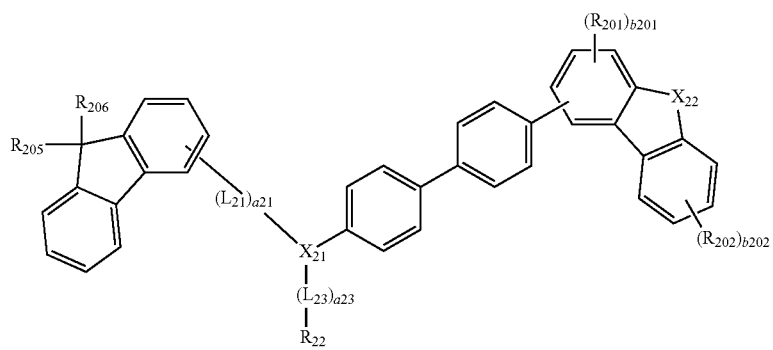

-continued 2-42

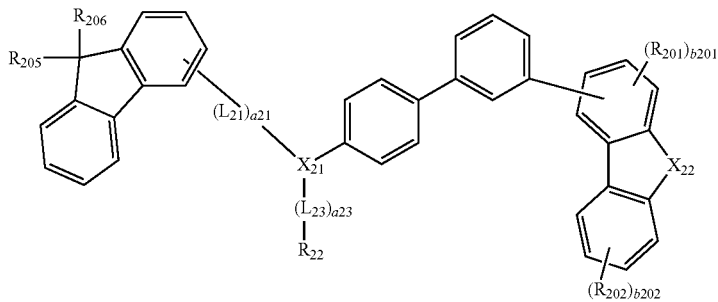

2-43

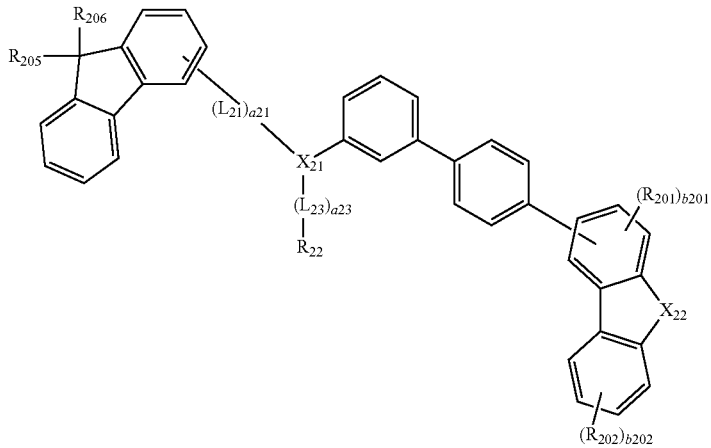

2-44

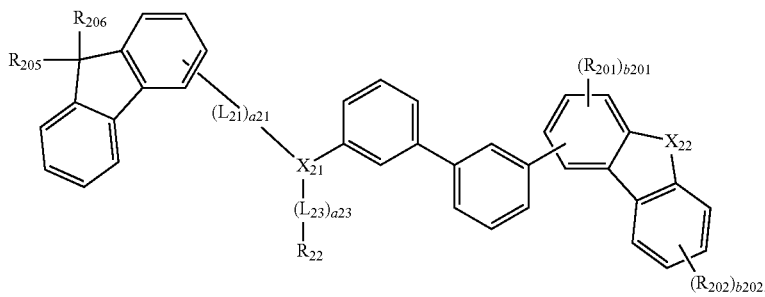

In Formulae 2-41 to 2-44, $X_{21}$, $L_{21}$, $L_{23}$, a21, a23, and $R_{22}$ may be the same as described herein in connection with Formula 2;

$X_{22}$ may be selected from $N(R_{203})$, O, and S;

$R_{201}$ to $R_{203}$, $R_{205}$, and $R_{206}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b201 may be selected from 1, 2, and 3; and b202 may be selected from 1, 2, 3, and 4.

In some embodiments, the second compound represented by Formula 2 may be selected from Compounds H-01 to H-36, but is not limited thereto:

H-01

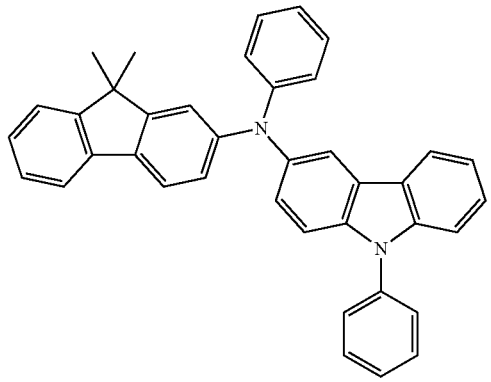

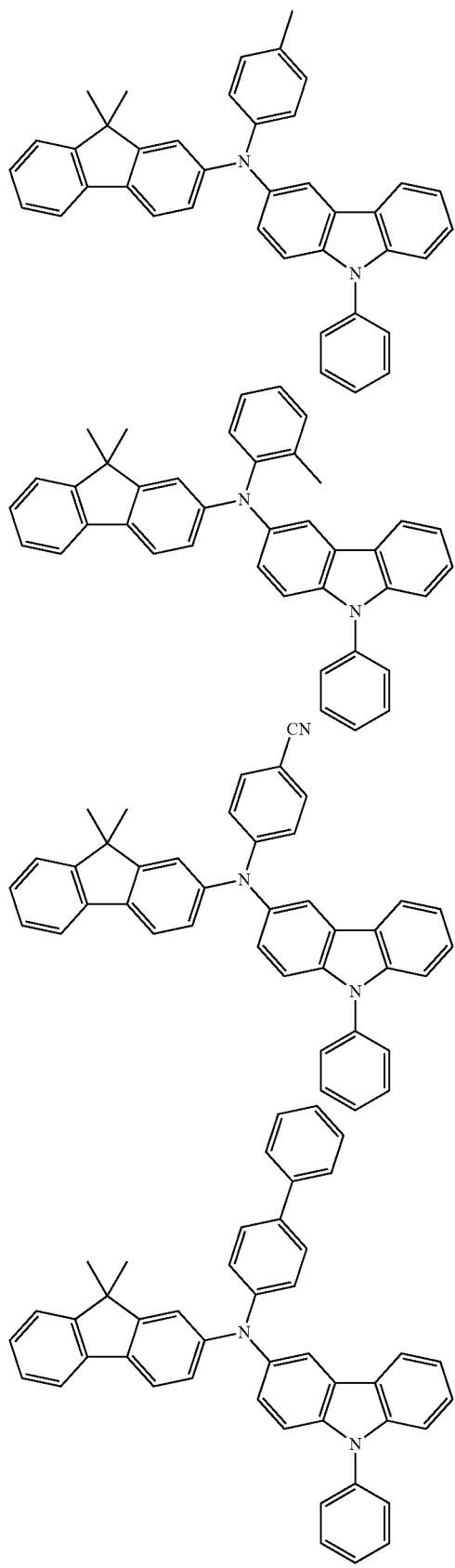
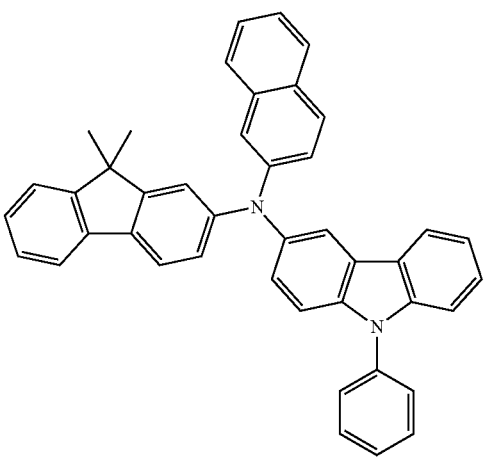
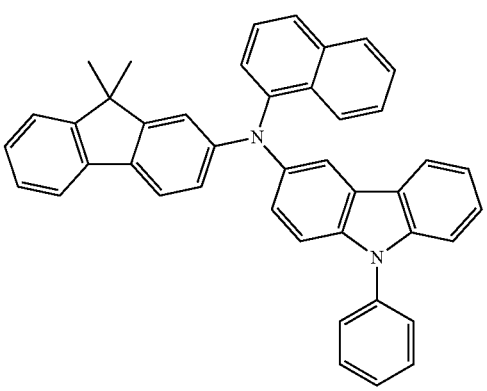
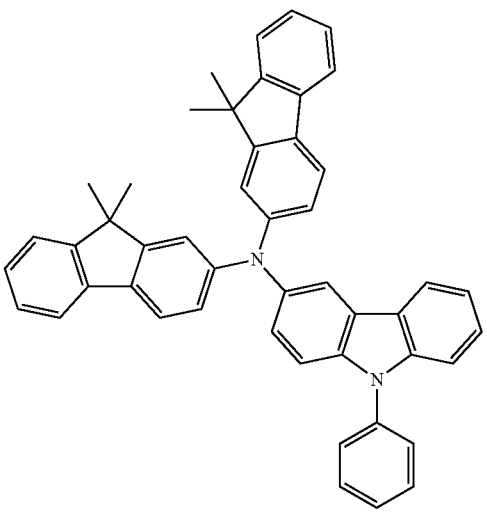

-continued
H-09
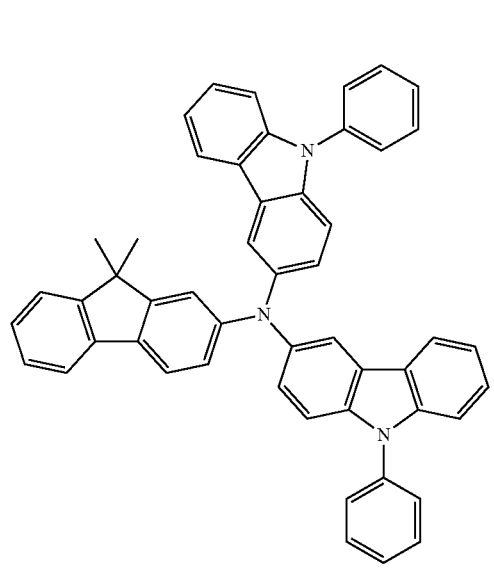
H-10
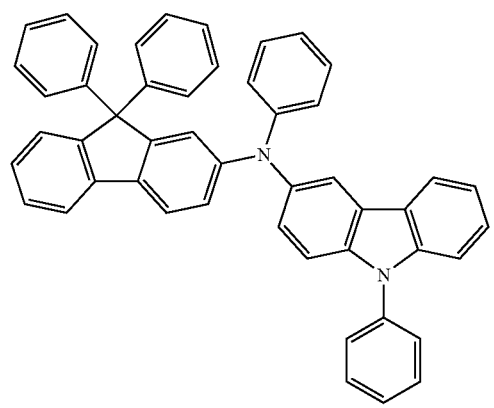
H-11
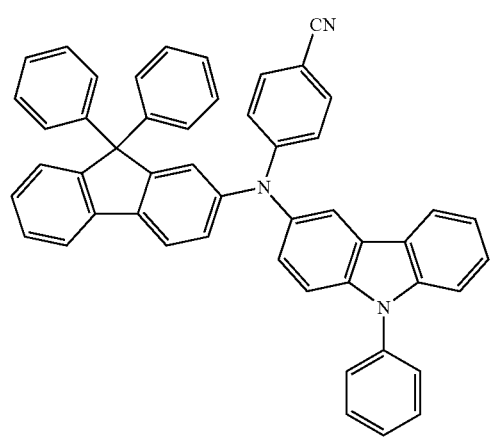
-continued
H-12
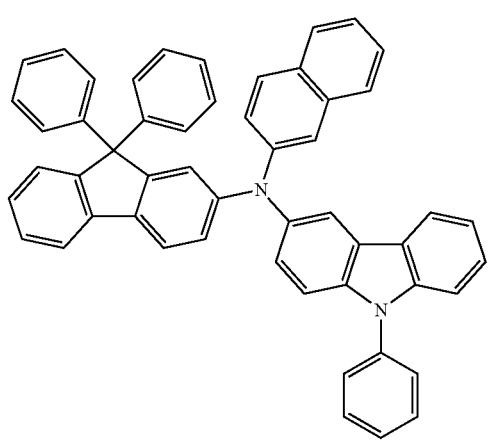
H-13
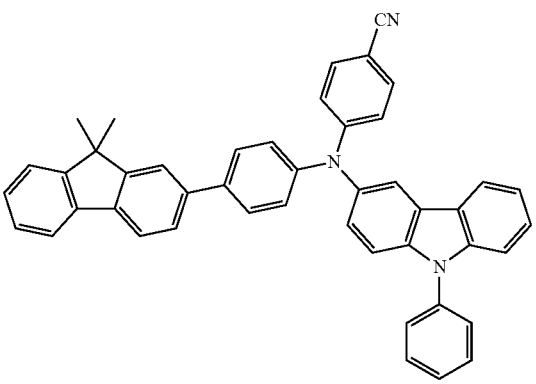
H-14

H-15
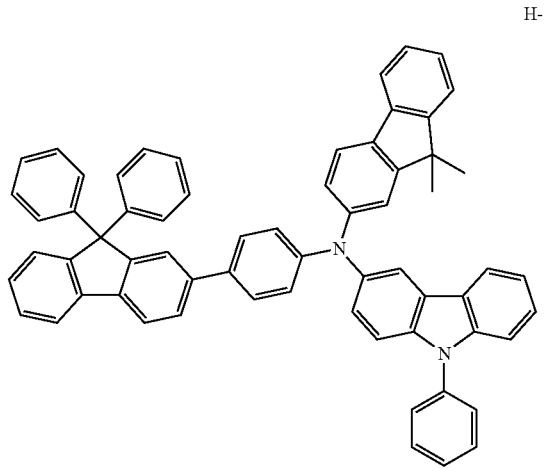
H-18
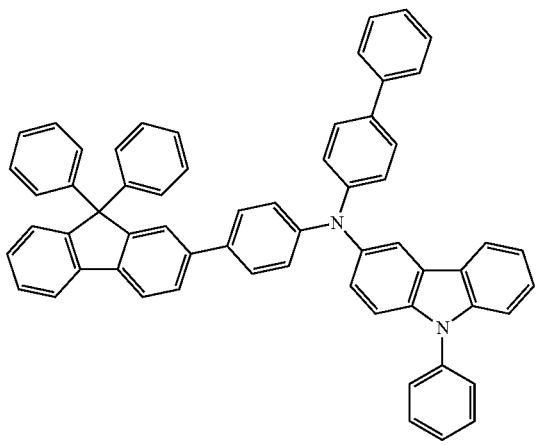
H-16
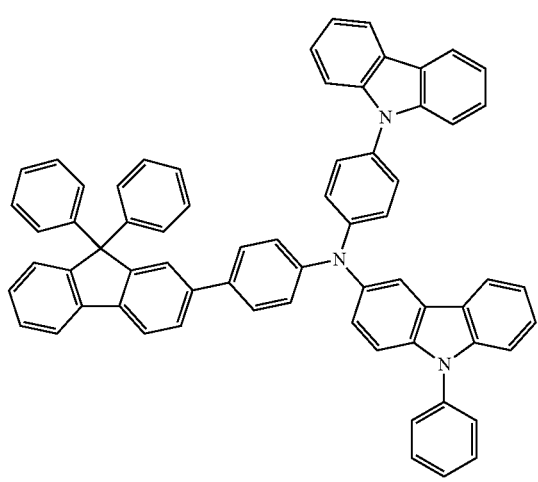
H-19
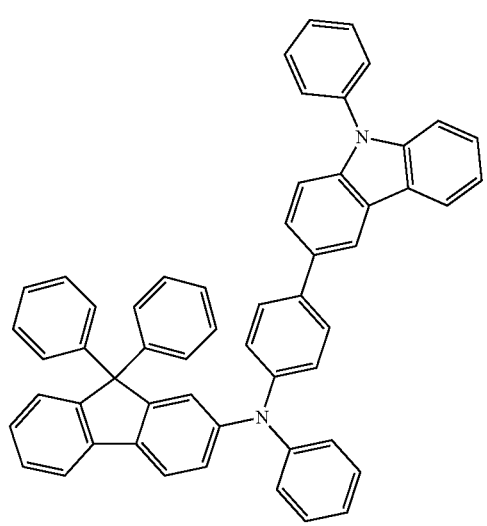
H-17
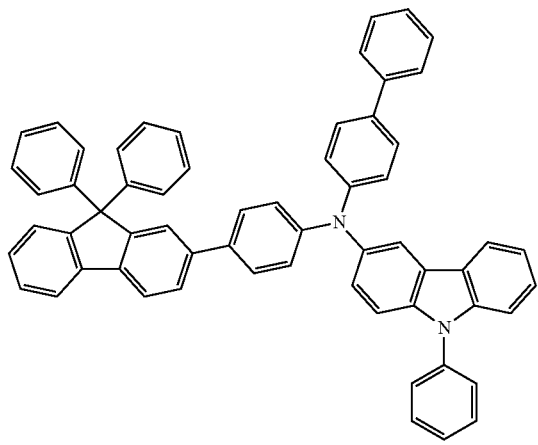
H-20
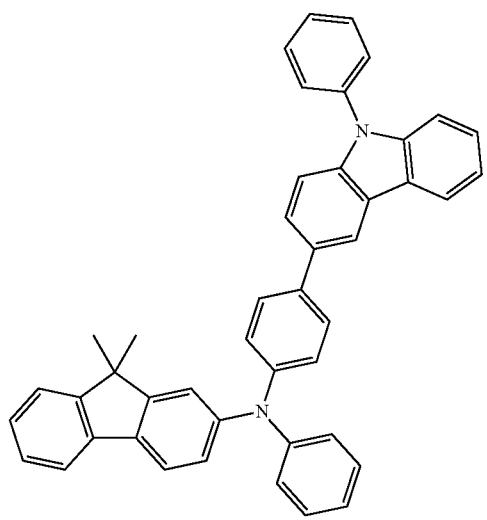

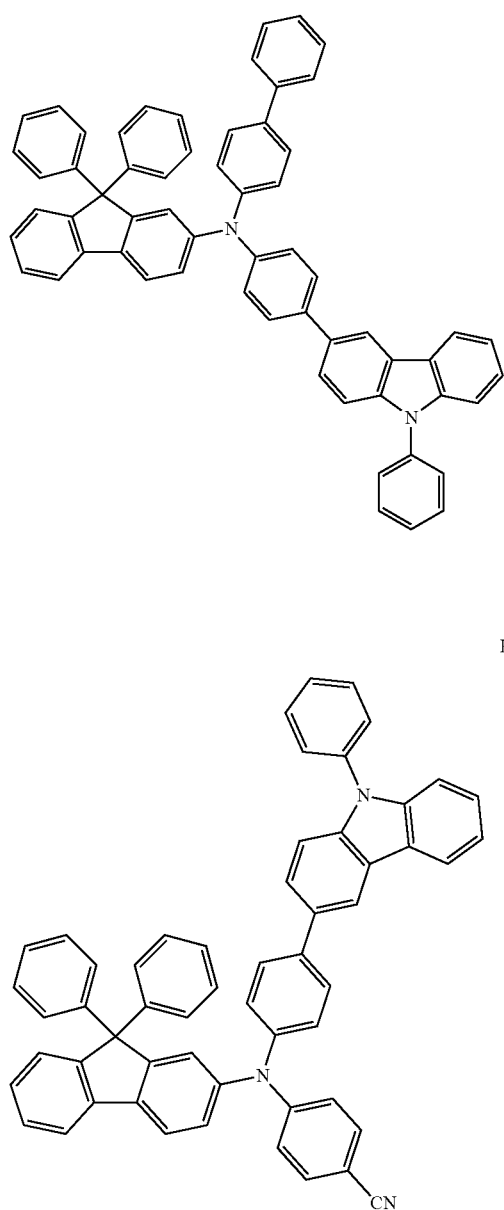
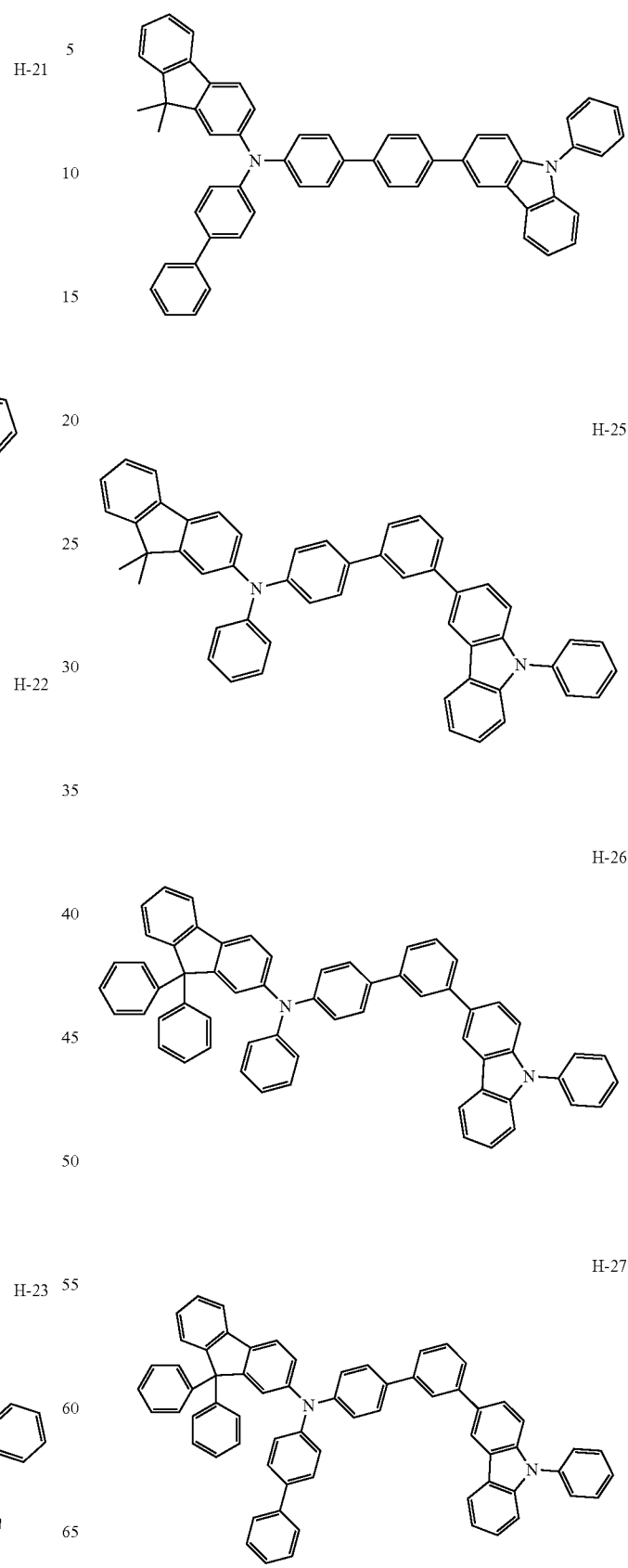

H-28
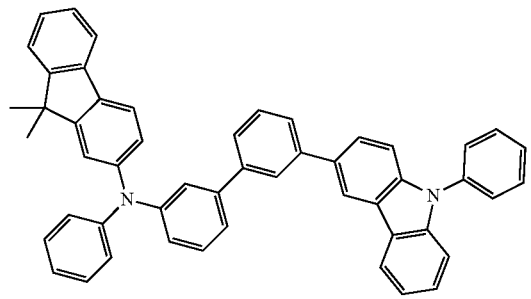
H-29
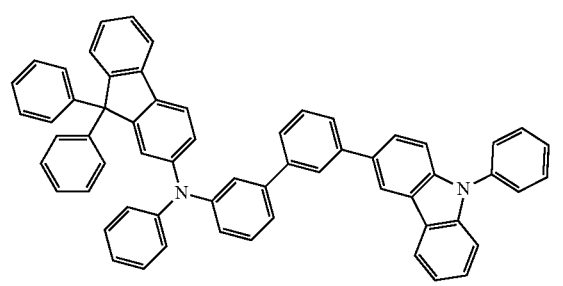
H-30
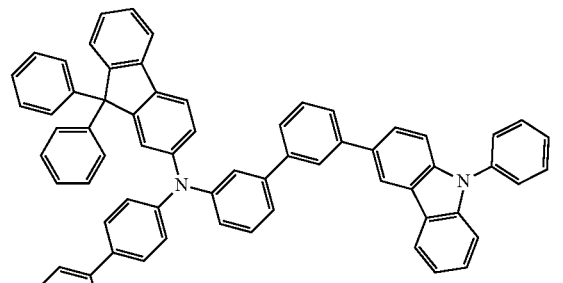
H-31
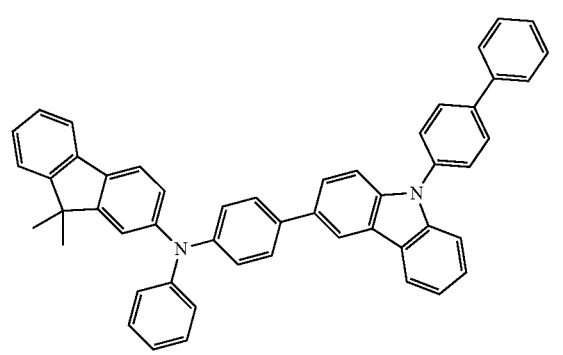
H-32
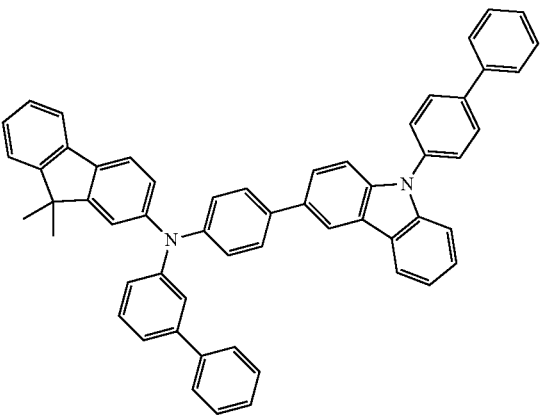
H-33
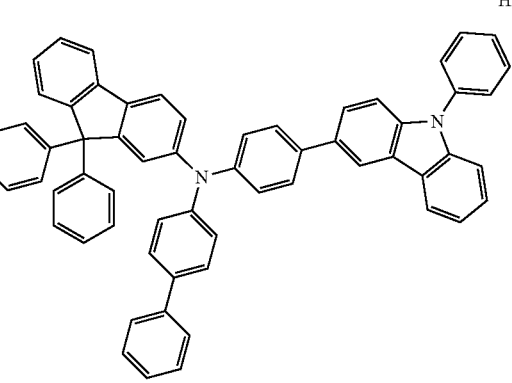
H-34
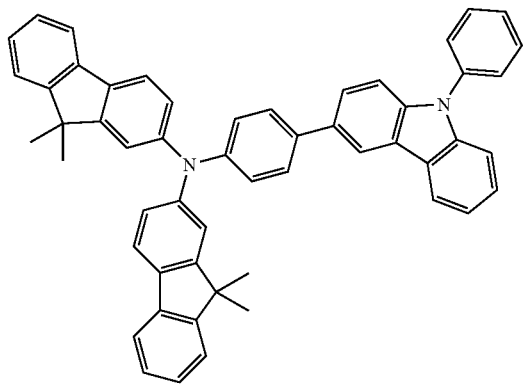
H-35
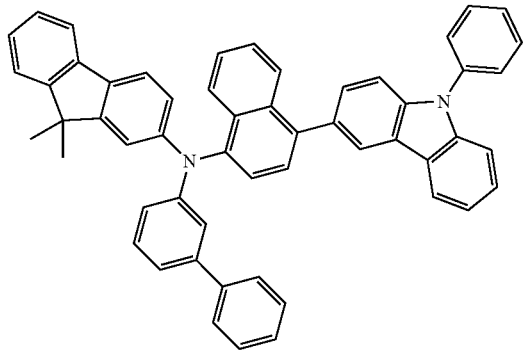

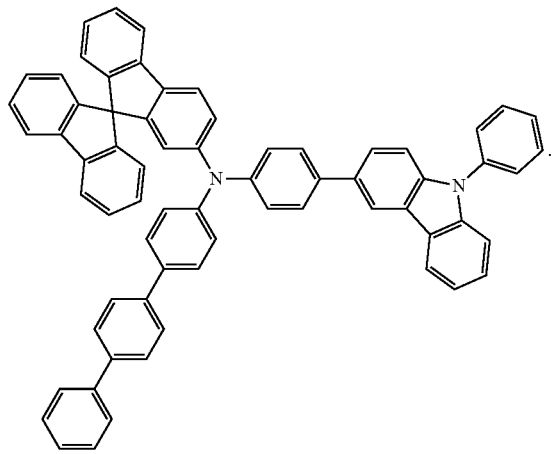

H-36

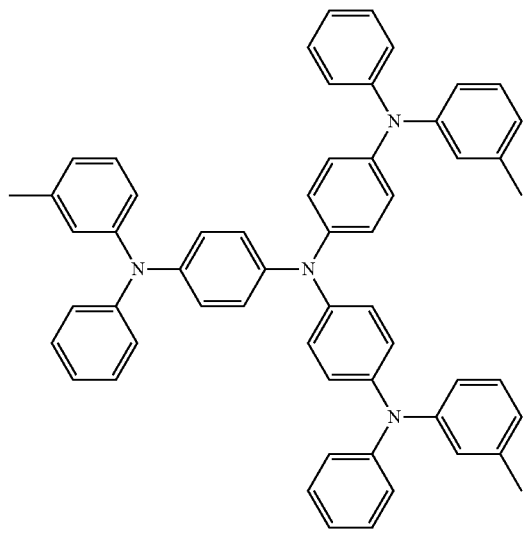

m-MTDATA

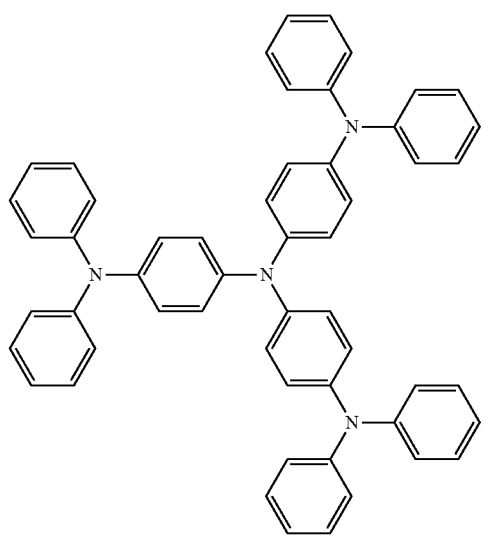

TDATA

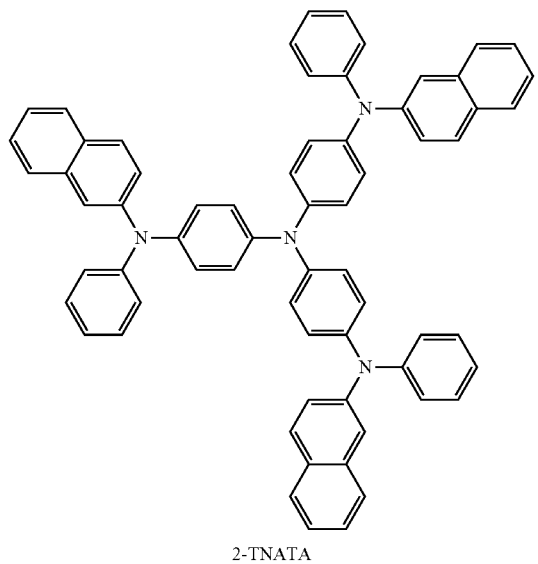

2-TNATA

When an organic light-emitting device includes an electron transport region in which electrons move relatively slowly, light may be emitted from a portion of an emission layer that is closer to an interface between the emission layer and the electron transport region than the remaining portion of the emission layer. Accordingly, due to excess holes provided to the electron transport region, the electron transport region may be damaged, leading to a decrease in the lifespan of the organic light-emitting device.

On the other hand, when an organic light-emitting device includes an electron transport region in which electrons move relatively quickly, light may be emitted from a portion of an emission layer that is closer to an interface between the emission layer and the hole transport region than the remaining portion of the emission layer. Accordingly, due to excess electrons provided to the hole transport region, the hole transport region may be damaged, leading to a short lifespan of the organic light-emitting device.

However, when the hole transport region of the organic light-emitting device includes one or more layers, holes and electrons may be easily balanced in the organic light-emitting device, leading to an increase in the efficiency and lifespan of the organic light-emitting device.

The compound represented by Formula 1 may have a high electron resisting capability, and may not be substantially deteriorated by electrons, and the second compound represented by Formula 2 may easily control a charge balance. Accordingly, when the compound of Formula 1 is used in a layer constituting the hole transport region that is near the emission layer and the compound of Formula 2 is used in a layer constituting the hole transport region that is far from the emission layer, the efficiency and lifespan of the organic light-emitting device may be increased.

The hole transport region may further include, in addition to the first compound represented by Formula 1 and the second compound represented by Formula 2, at least one selected from m-MTDATA, TDATA, 2-TNATA, NPB, β-NPB, TPD, Spiro-TPD, Spiro-NPB, methylated-NPB, TAPC, HMTPD, DNTPD, 4,4',4''-tris(N-carbazolyl)triphenylamine (TCTA), polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), (polyaniline)/poly(4-styrenesulfonate) (PANI/PSS, and a compound represented by Formula 202 below -continued

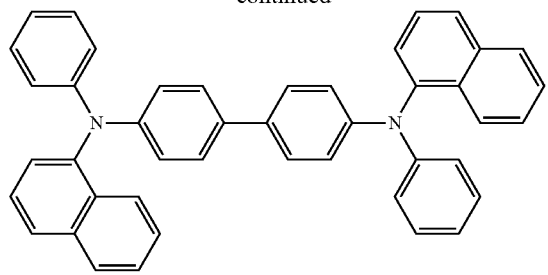

NPB

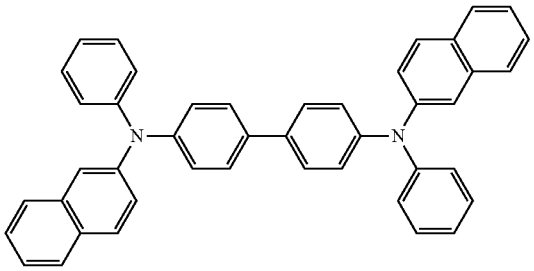

β-NPB

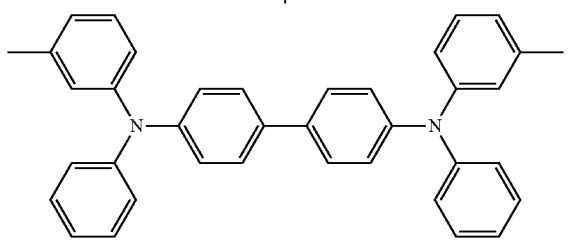

TPD

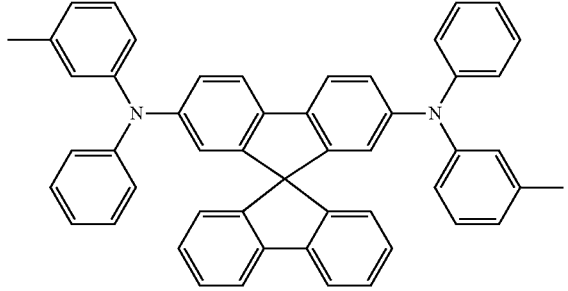

Spiro-TPD

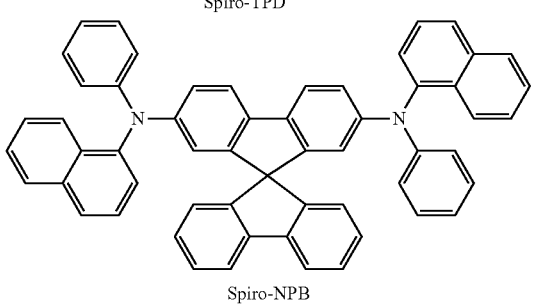

Spiro-NPB

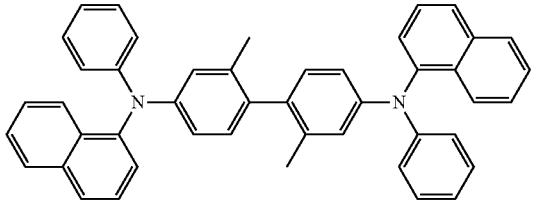

methylated NPB

-continued

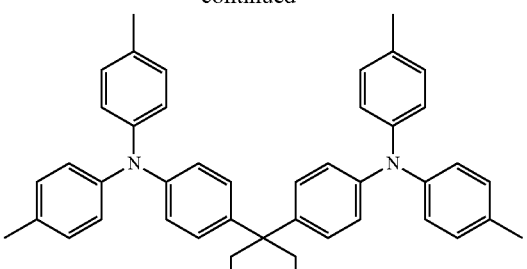

TAPC

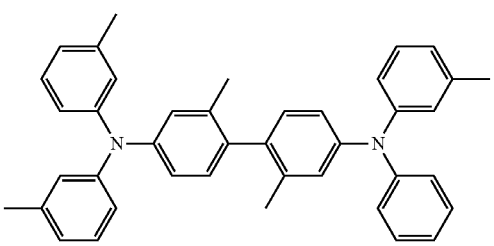

HMTPD

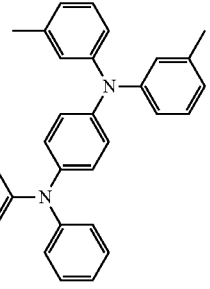

DNTPD

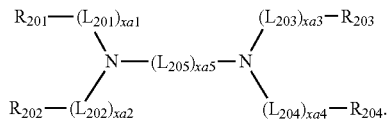

Formula 202

In Formula 202, $L_{201}$ to $L_{205}$ may be each independently understood by referring to the description of $L_{11}$ provided herein;

xa1 to xa4 may be each independently selected from 0, 1, 2, and 3;

xa5 may be selected from 1, 2, 3, 4, and 5; and $R_{201}$ to $R_{204}$ may be each independently understood by referring to the description of $R_{11}$.

The compound represented by Formula 202 may be represented by Formula 202A, but is not limited thereto:

Formula 202A

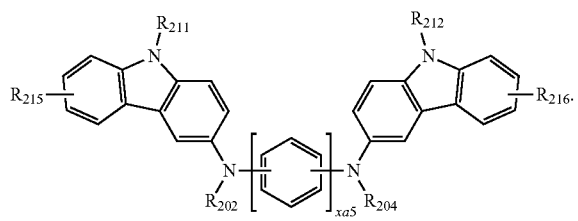

xa5, $R_{202}$ and $R_{204}$ in Formula 202A may be the same as described above, $R_{211}$ and $R_{212}$ may be each independently the same as described herein in connection with $R_{11}$, and $R_{215}$ and $R_{216}$ may be each independently the same as described herein in connection with $R_{14}$.

The compound represented by Formula 202 may be selected from Compounds HT13 to HT20, but is not limited thereto:

HT13

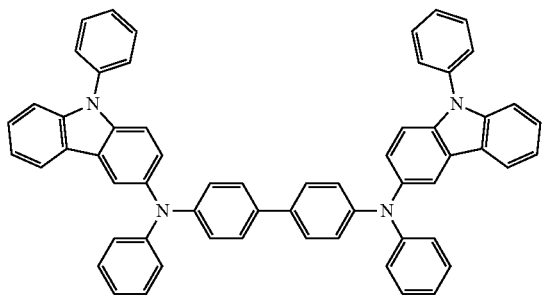

HT14

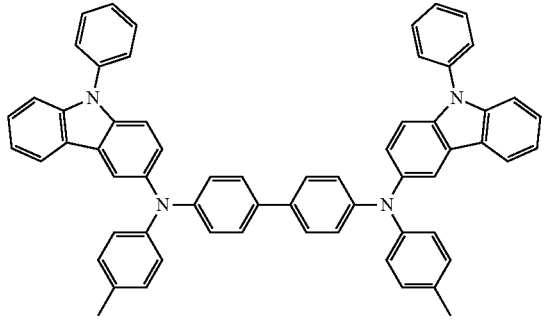

HT15

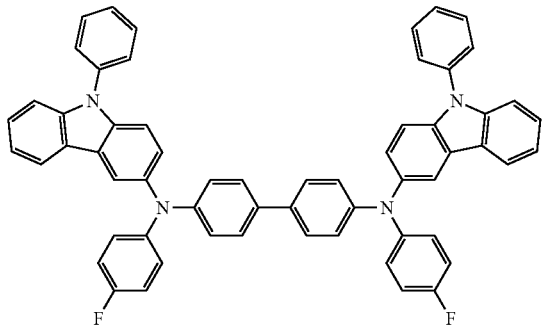

HT16

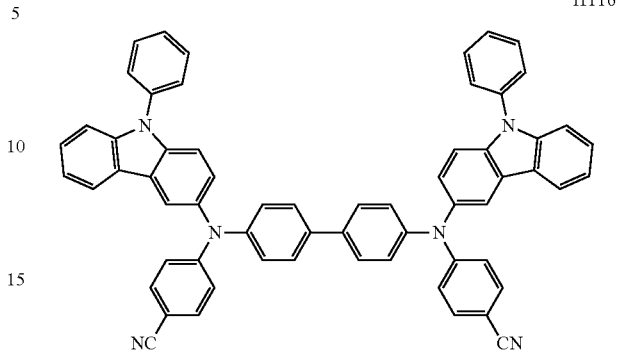

HT17

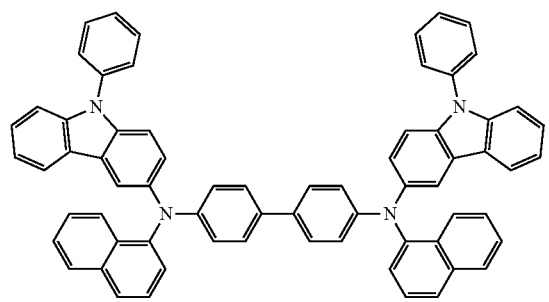

HT18

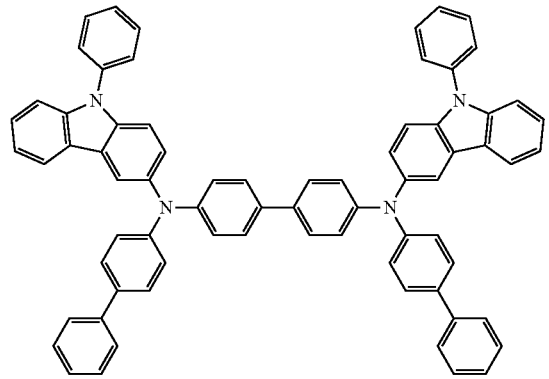

HT19

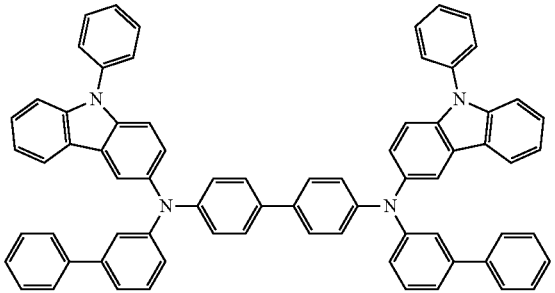

HT20

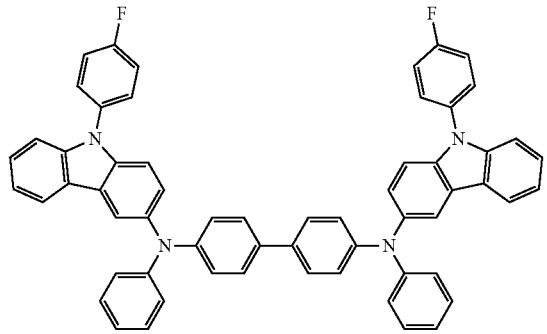

Compound HT-D1

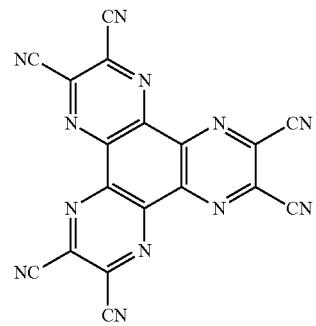

F4-TCNQ

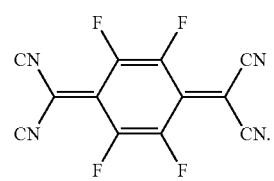 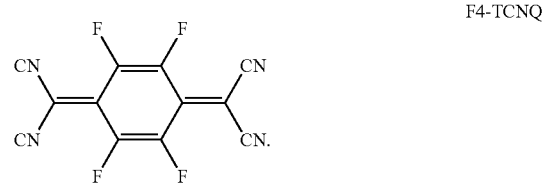

The hole transport region may include a first layer and a second layer; and the second layer may be disposed (e.g., positioned) between the first layer and a first electrode. The first layer may include the first compound according to embodiments of the present disclosure, and the second layer may include the second compound according to embodiments of the present disclosure.

A thickness of the hole transport region may be in a range of about 50 Å to about 10,000 Å, for example, about 100 Å or more, about 150 Å or more, about 2000 Å or less, or about 1500 Å or less. When the hole transport region includes the first layer and the second layer, a thickness of the second layer may be in a range of about 50 Å to about 10,000 Å, for example, about 50 Å to about 600 Å. When the hole transport region includes the first layer and the second layer, a thickness of the first layer may be in a range of about 50 Å to about 2000 Å, for example, about 100 Å to about 1500 Å. When the thicknesses of the hole transport region, the first layer, and the second layer are within any of these ranges, suitable hole transporting characteristics may be obtained without in a substantial increase in driving voltage.

The hole transport region may further include, in addition to the materials described above, a charge-generation material for the improvement of conductive properties. The charge-generation material may be homogeneously or unhomogeneously dispersed in the hole transport region. For example, the charge-generation material may be present at a high concentration in a portion of the hole transport region that is near the first electrode. In some embodiments, the charge-generation material may be present in a high concentration in a portion of the hole transport region that is near the emission layer.

The charge-generation material may be, for example, a p-dopant. The p-dopant may be one selected from a quinone derivative, a metal oxide, and a cyano group-containing compound, but embodiments are not limited thereto. Non-limiting examples of the p-dopant include quinone derivatives (such as tetracyanoquinonedimethane (TCNQ) and/or 2,3,5,6-tetrafluoro-tetracyano-1,4-benzoquinonedimethane (F4-TCNQ)); metal oxides (such as tungsten oxide and/or molybdenum oxide), 2-(7-dicyanomethylene-1,3,4,5,6,8,9,10-octafluoro-7H-pyrene-2-ylidene)-malonitrile, and Compound HT-D1 illustrated below.

The hole transport region may further include, in addition to the hole injection layer and the hole transport layer, at least one selected from a buffer layer and an electron blocking layer. Since the buffer layer may compensate for an optical resonance distance according to a wavelength of light emitted from the emission layer, light-emission efficiency of the formed organic light-emitting device may be improved. For use as a material included in the buffer layer, any of the materials that are included in the hole transport region may be used. The electron blocking layer may prevent or reduce the injection of electrons from the electron transport region.

An emission layer may be formed on the first electrode 110 or the hole transport region by using one or more methods selected from vacuum deposition, spin coating, casting, an LB method, ink-jet printing, laser-printing, and laser-induced thermal imaging. When an emission layer is formed by vacuum deposition and/or spin coating, deposition and coating conditions for the emission layer may be the same as or similar to those for the hole injection layer.

When the organic light-emitting device 10 is a full color organic light-emitting device, the emission layer may be patterned into a red emission layer, a green emission layer, or a blue emission layer, according to a sub-pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. In some embodiments, the emission layer may be a white emission layer, and may further include a color converting layer or a color filter to turn white light into light of a desired color.

The emission layer may include a host and a dopant.

The host may include at least one selected from TPBi, TBADN, ADN, CBP, CDBP, and TCP:

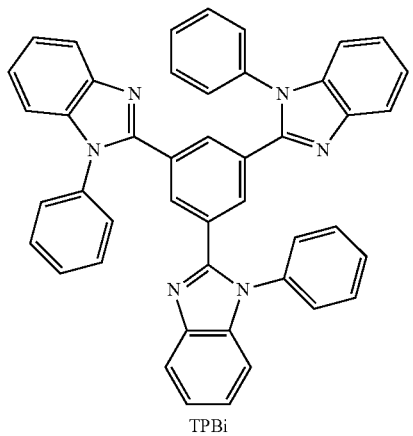

TPBi

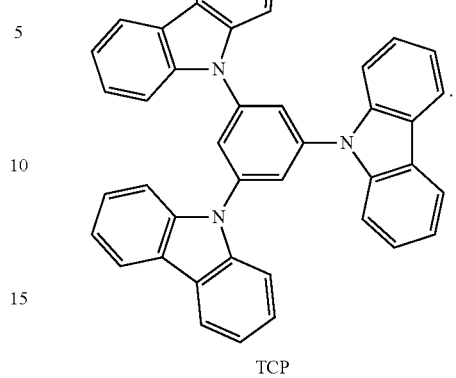

TCP

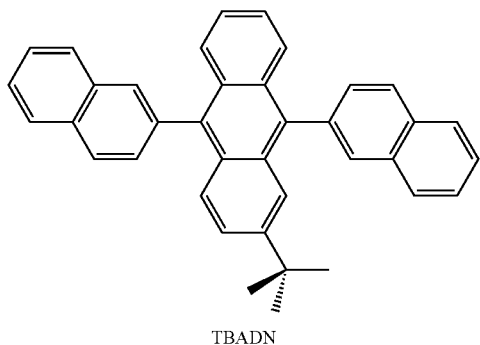

TBADN

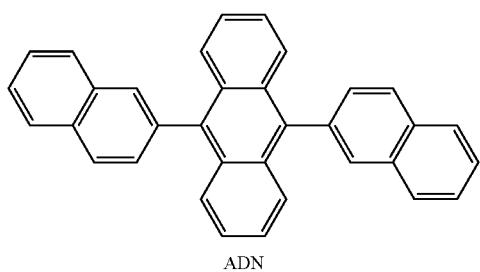

ADN

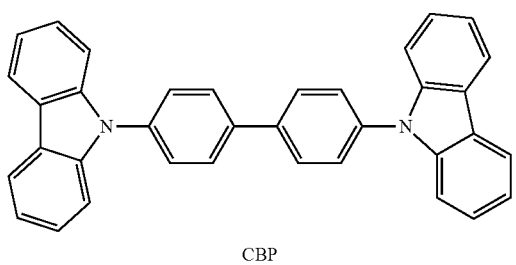

CBP

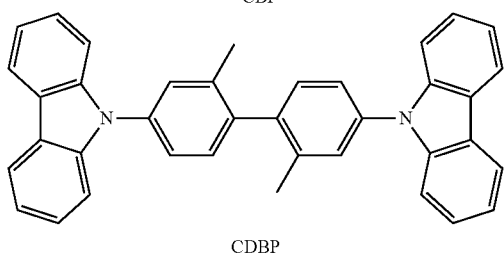

CDBP

In some embodiments, the host may include a compound represented by Formula 301 below.

$$Ar_{301}-[(L_{301})_{xb1}-R_{301}]_{xb2}.$$  Formula 301

In Formula 301, $Ar_{301}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (where $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

a description of $L_{301}$ may be understood by referring to the description provided in connection with $L_{201}$;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and
xb2 may be selected from 1, 2, 3, and 4.

In Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but is not limited thereto.

The compound represented by Formula 301 may include at least one of Compounds H1 to H42 (where "D" may refer to deuterium), but is not limited thereto:

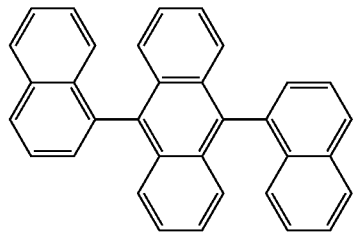

H1

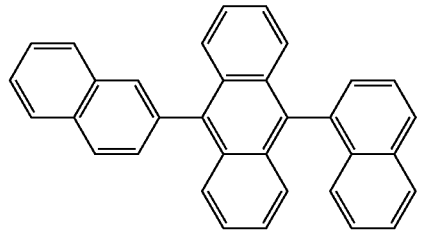

H2

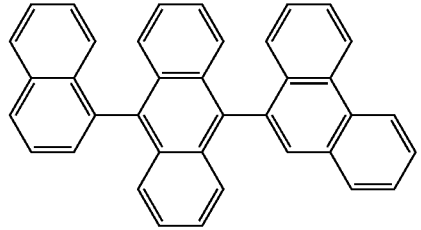

H3

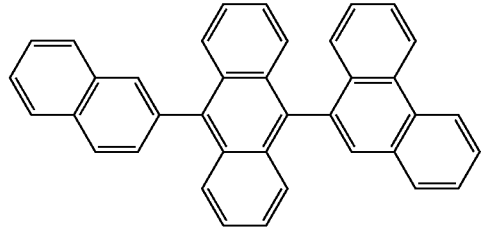

H4

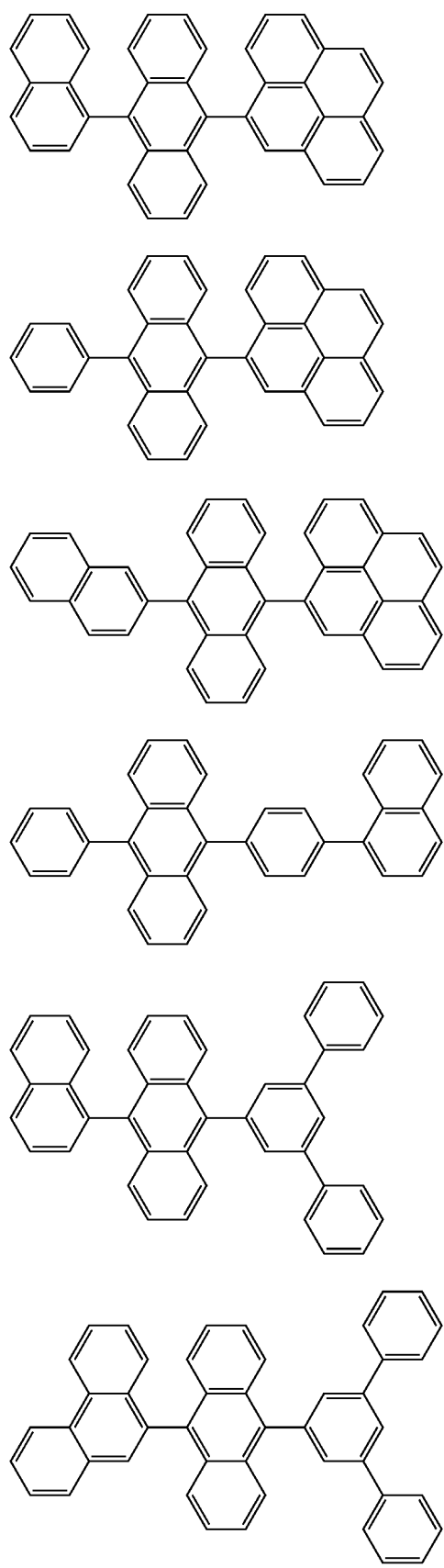
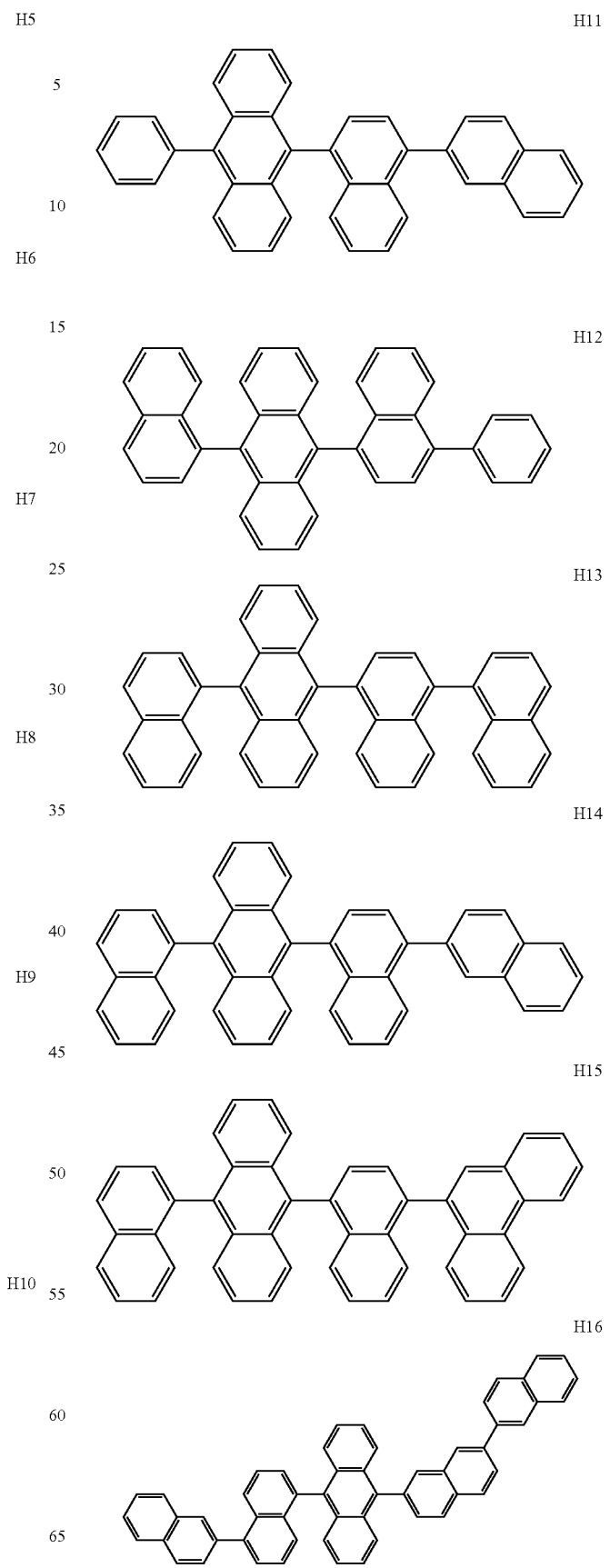

H17
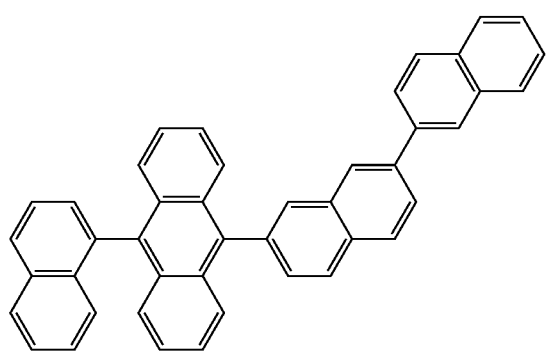
H18
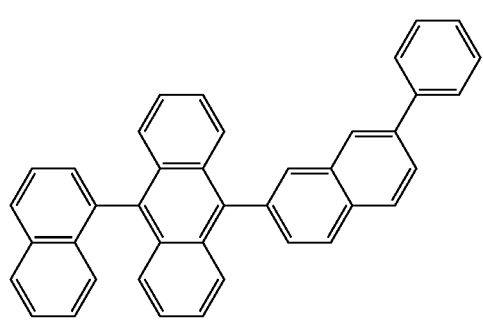
H19
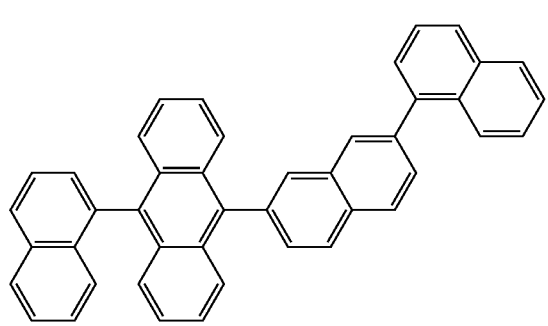
H20
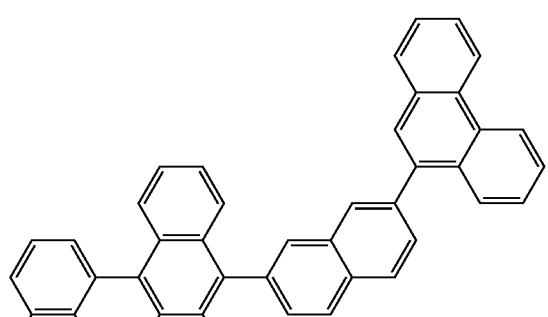
H21
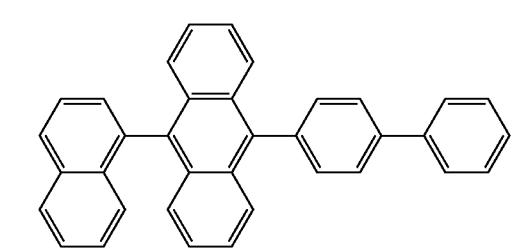
H22
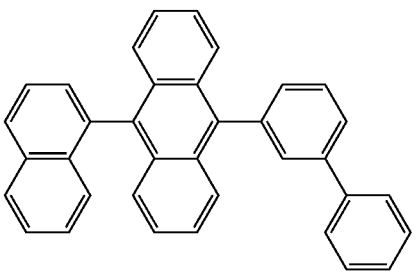
H23
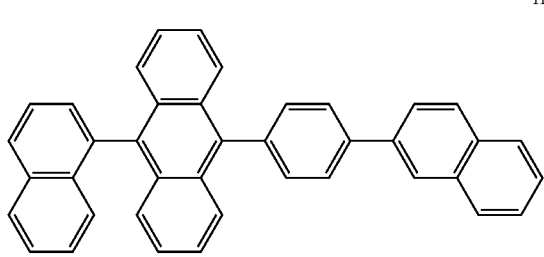
H24
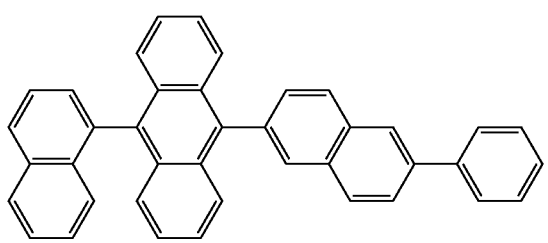
H25
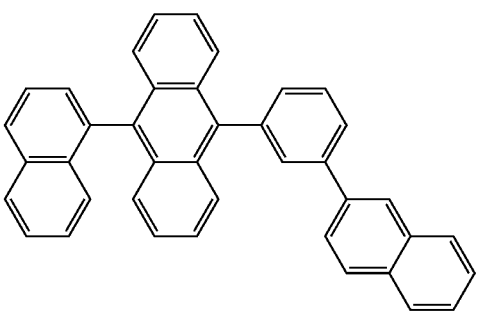
H26
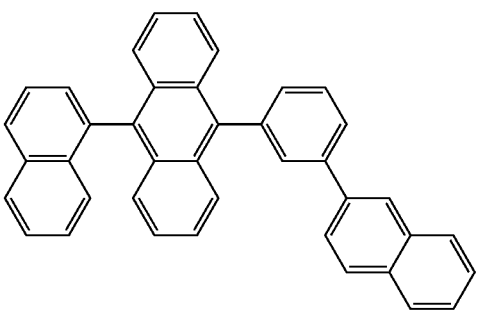

-continued
H27
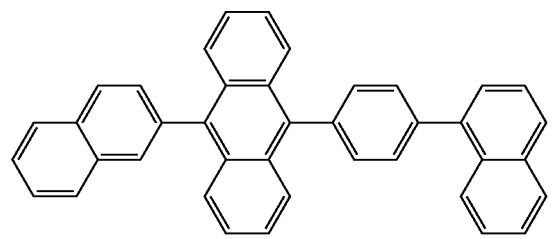
H28
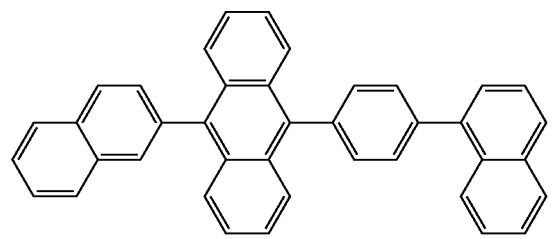
H29
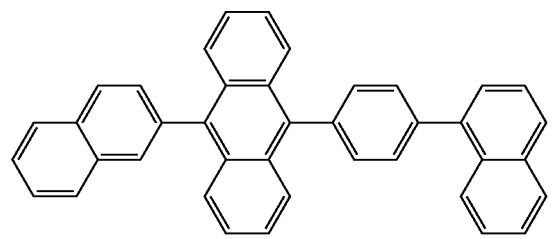
H30
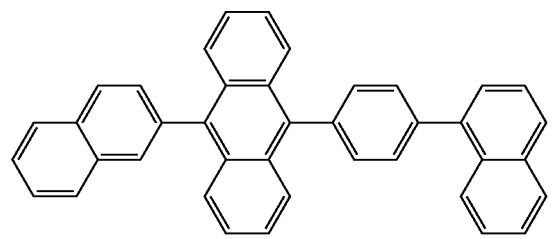
H31
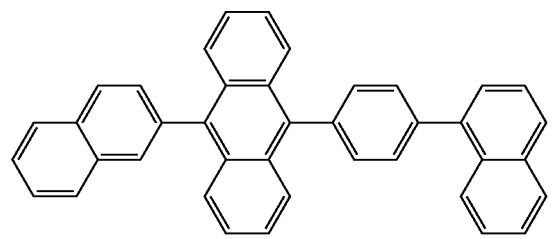
-continued
H32
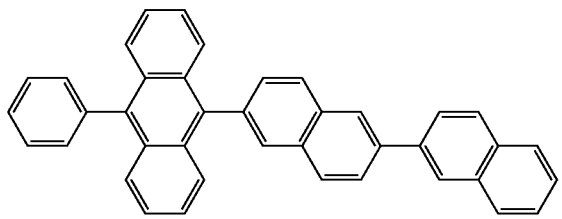
H33
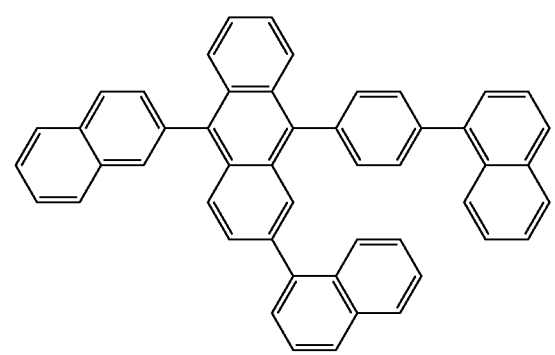
H34
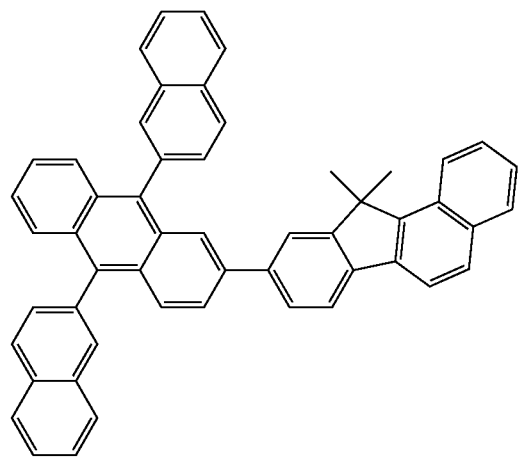
H35
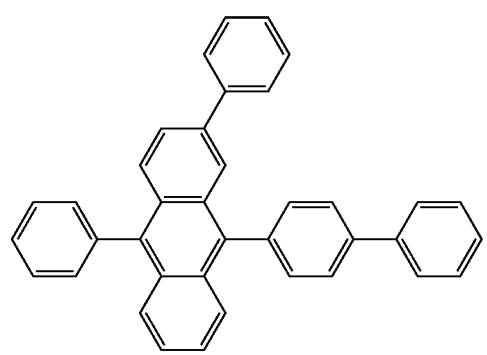

H36
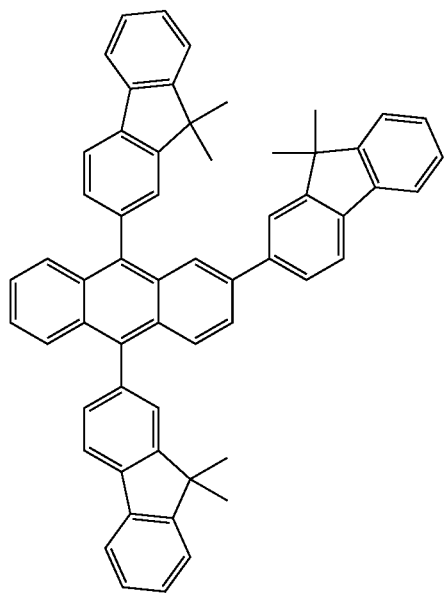
H37
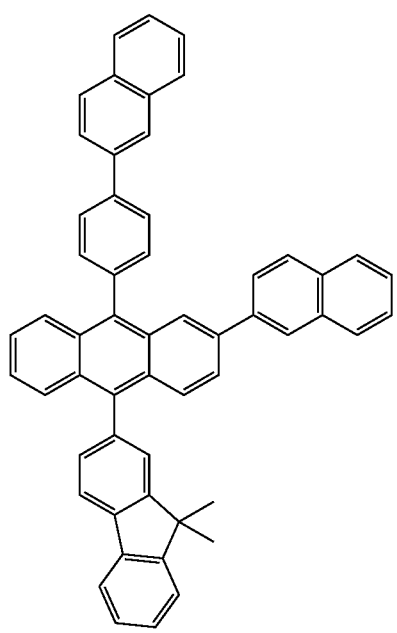
H38
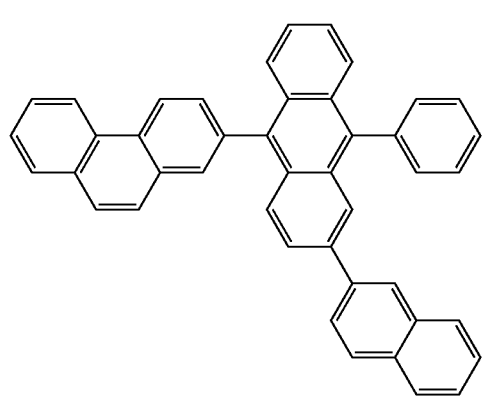
H39
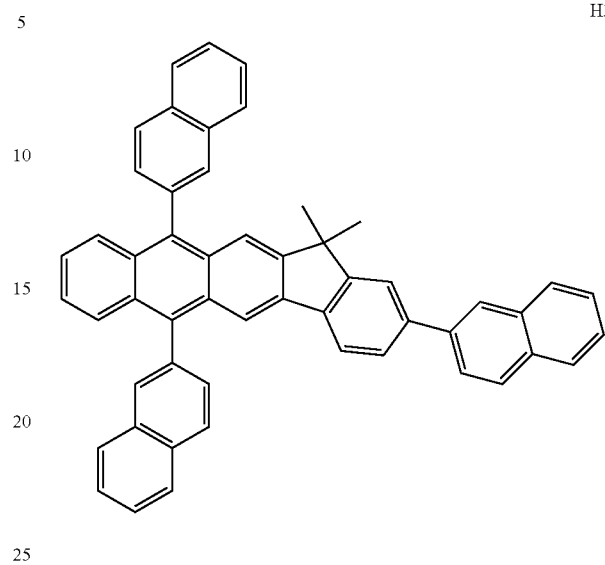
H40
H41

H42
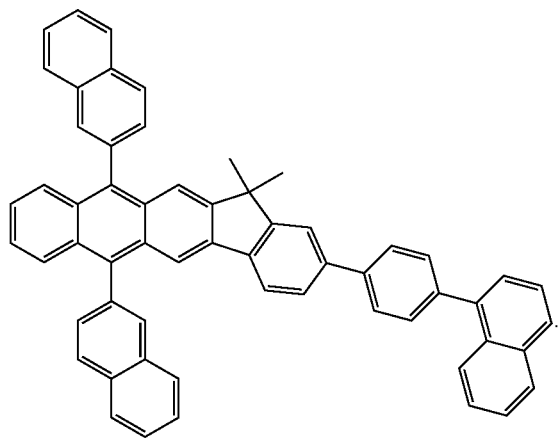
In some embodiments, the host may include at least one of Compounds H43 to H49 below, but is not limited thereto:
H43
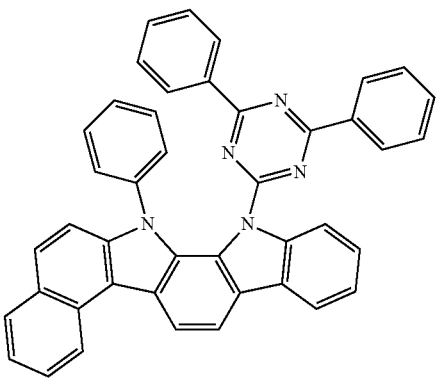
H44
H45
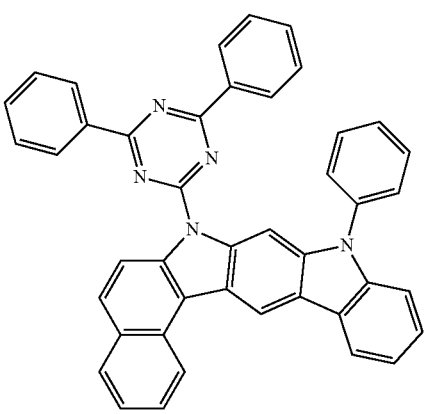
H46
H47
H48

H49

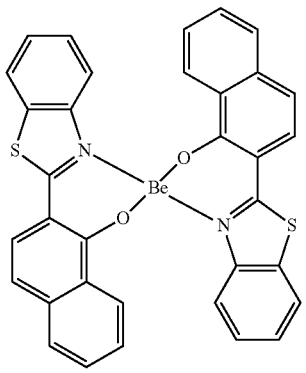

The dopant may include at least one selected from a fluorescent dopant and a phosphorescent dopant.

The phosphorescent dopant may include an organometallic complex represented by Formula 401 below:

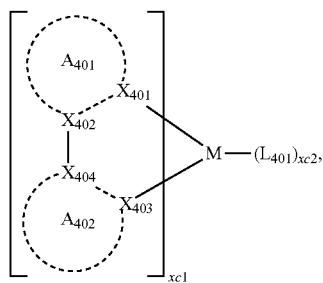

Formula 401

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

$A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; and at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkenyl group, a $C_1$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be 1, 2, or 3; and xc2 may be 0, 1, 2, or 3;

$Q_{401}$ to $Q_{407}$, $Q_{411}$ to $Q_{417}$, and $Q_{421}$ to $Q_{427}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

In Formula 401, $L_{401}$ may be a monovalent, divalent, or trivalent organic ligand. For example, $L_{401}$ may be selected from a halogen ligand (e.g., Cl and/or F), a diketone ligand (e.g., acetylacetonate, 1,3-diphenyl-1,3-propanedionate, 2,2,6,6-tetramethyl-3,5-heptanedionate, and/or hexafluoroacetonate), a carboxylic acid ligand (e.g., picolinate, dimethyl-3-pyrazolecarboxylate, and/or benzoate), a carbon monoxide ligand, an isonitrile ligand, a cyano ligand, and a phosphorous ligand (e.g., phosphine and/or phosphite), but is not limited thereto.

When $A_{401}$ in Formula 401 has two or more substituents, the substituents of $A_{401}$ may be linked to each other to form a saturated or unsaturated ring.

When $A_{402}$ in Formula 401 has two or more substituents, the substituents of $A_{402}$ may be linked to each other to form a saturated or unsaturated ring

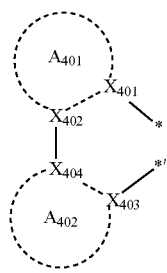

When xc1 in Formula 401 is two or more, a plurality of ligands in Formula 401 may be identical to or different from each other. When xc1 in Formula 401 is two or more, $A_{401}$ and $A_{402}$ of one ligand may be each independently connected to (e.g., coupled to) $A_{401}$ and $A_{402}$ of other neighboring ligands, respectively, either directly (e.g., via a bond such as a single bond) or via a linker (e.g., a $C_1$-$C_5$ alkylene group, a $C_2$-$C_5$ alkenylene group, —N(R')— (wherein R' may be a $C_1$-$C_{10}$ alkyl group or a $C_6$-$C_{20}$ aryl group) and/or —C(=O)—) therebetween.

The phosphorescent dopant may include at least one of Compounds PD1 to PD74 below, but is not limited thereto:

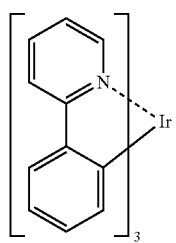

PD1

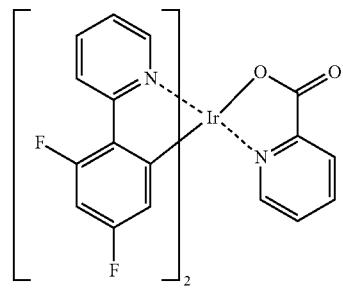

PD2

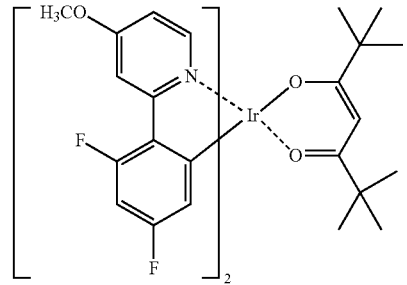

PD3

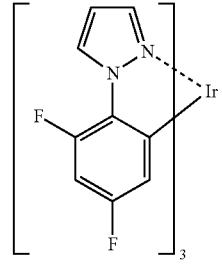

PD4

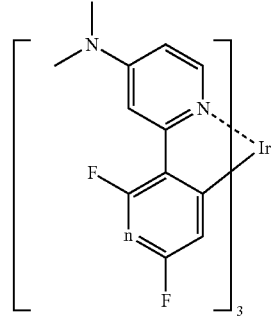

PD5

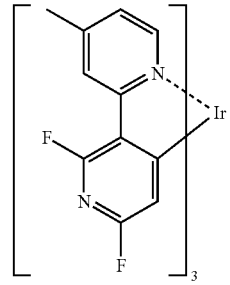

PD6

-continued
PD7
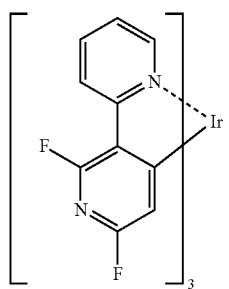
PD8
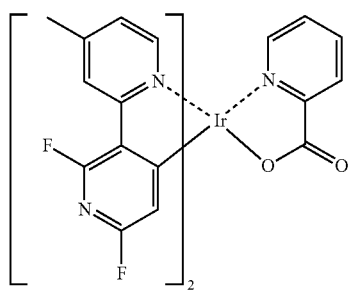
PD9
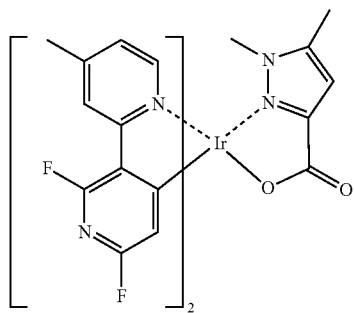
PD10
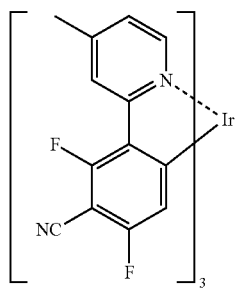
PD11
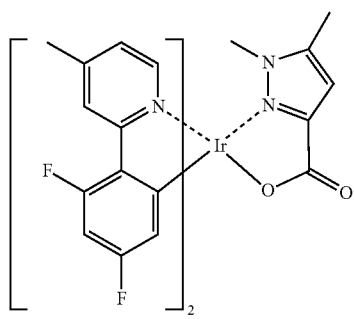
-continued
PD12
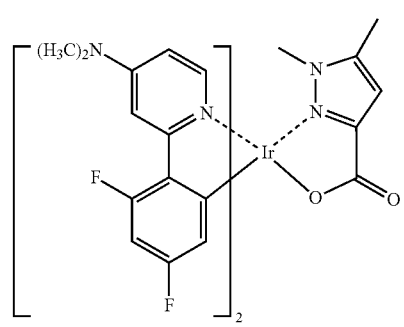
PD13
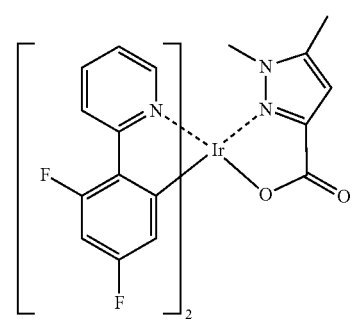
PD14
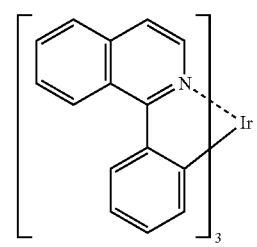
PD15
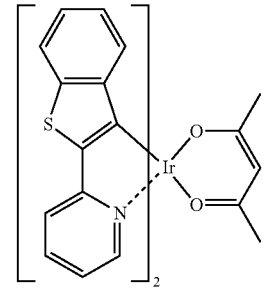
PD16
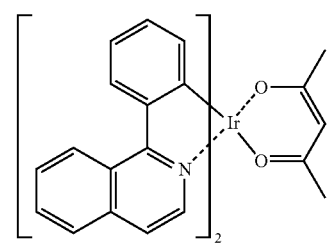

-continued
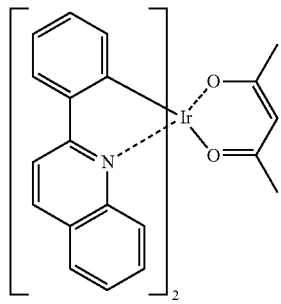
PD17
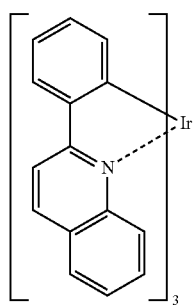
PD18
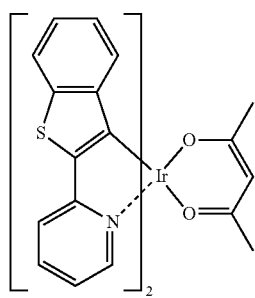
PD19
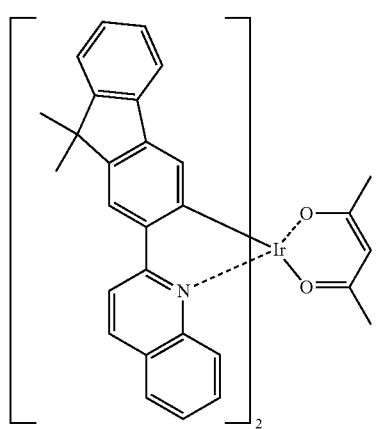
PD20
-continued
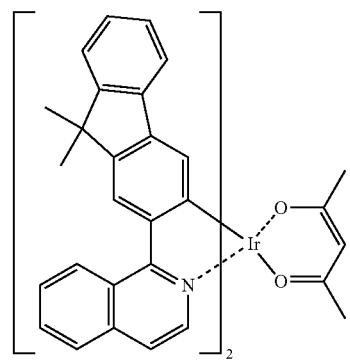
PD21
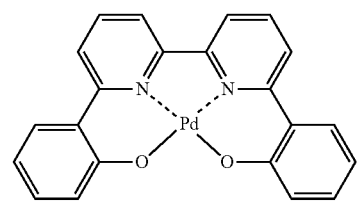
PD22
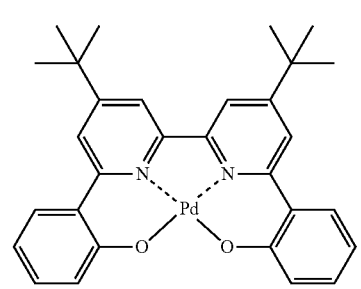
PD23
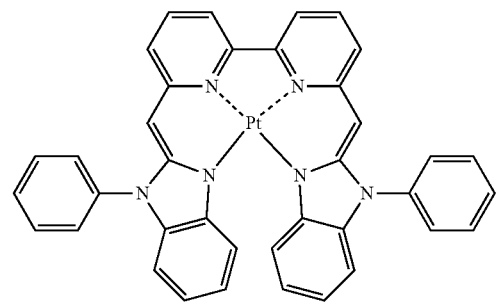
PD24
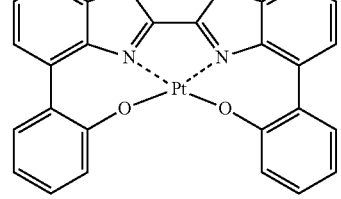
PD25
PD26

PD27 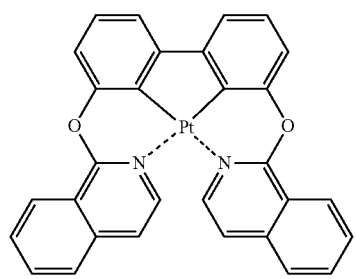
PD28 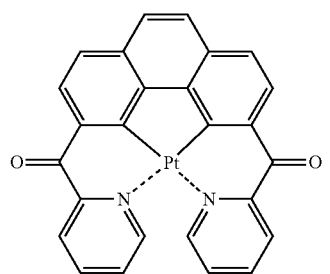
PD29 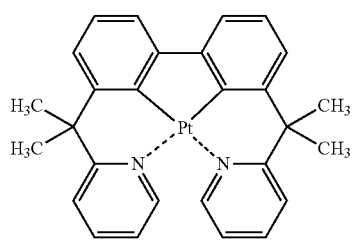
PD30 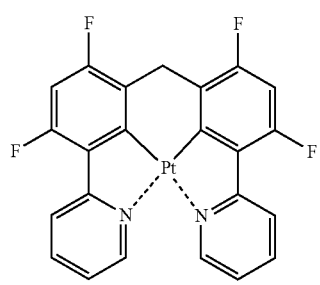
PD31 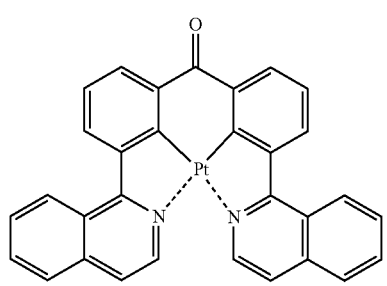
PD32 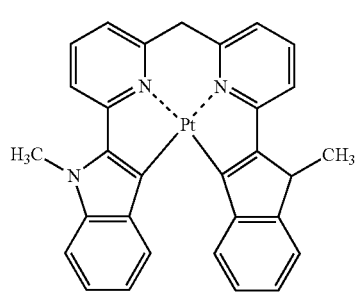
PD33 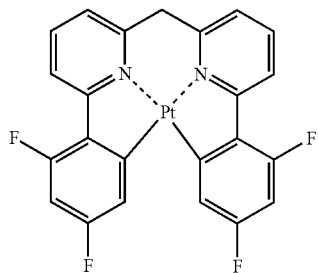
PD34 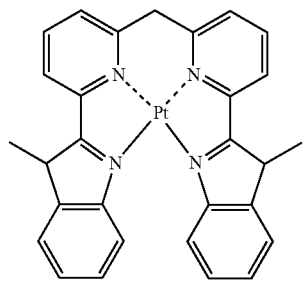
PD35 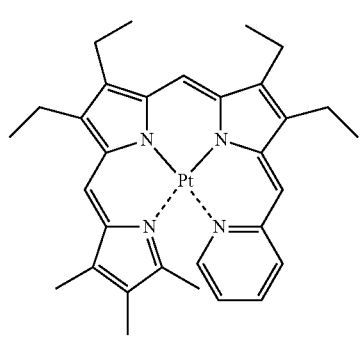
PD36 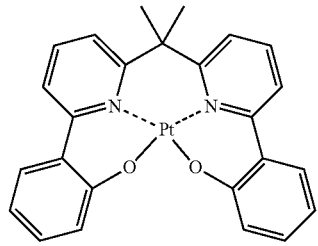
PD37 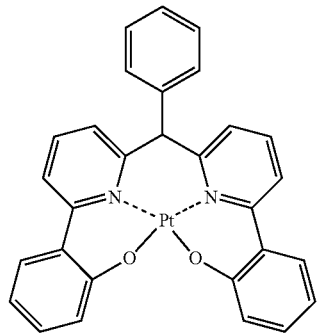

-continued
PD38
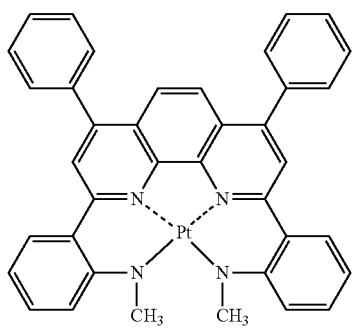
PD39
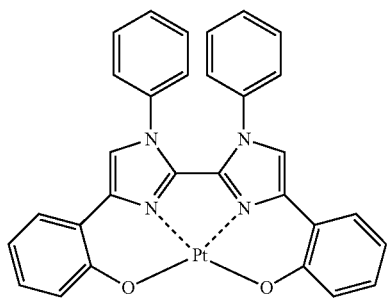
PD40
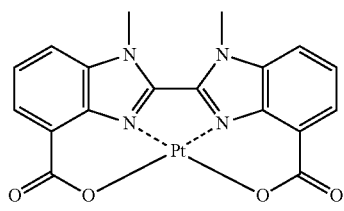
PD41
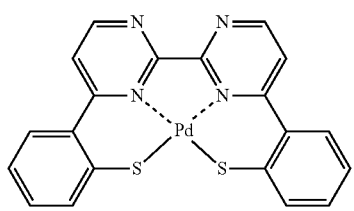
PD42
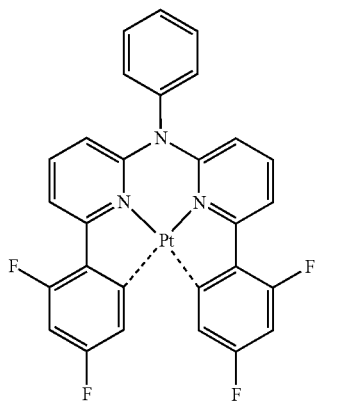
-continued
PD43
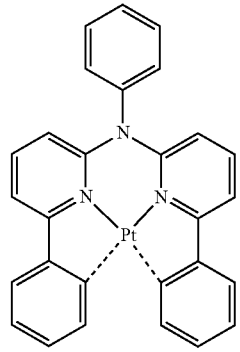
PD44
PD45
PD46
PD47
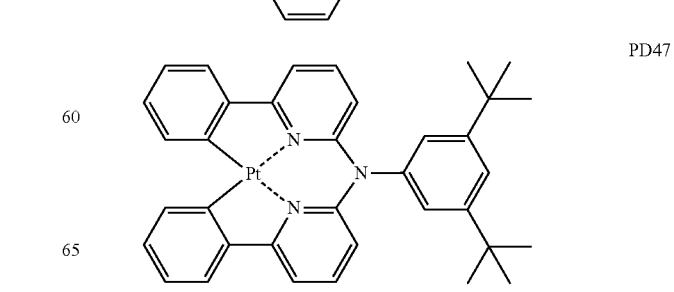

PD48 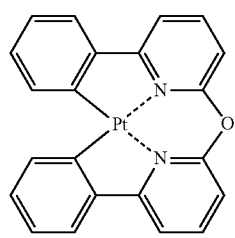
PD54 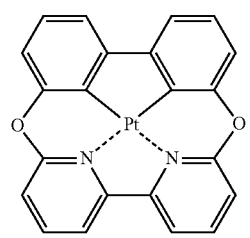
PD49 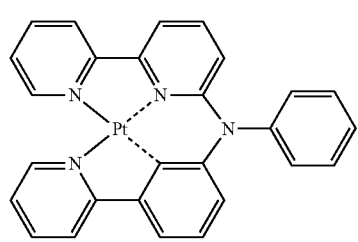
PD55 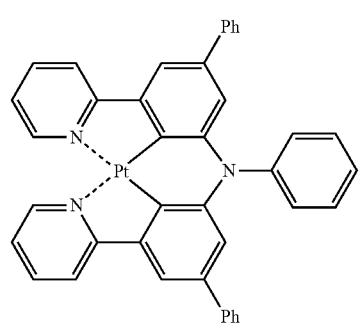
PD50 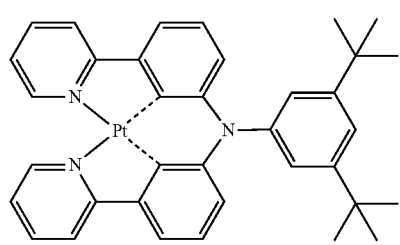
PD56 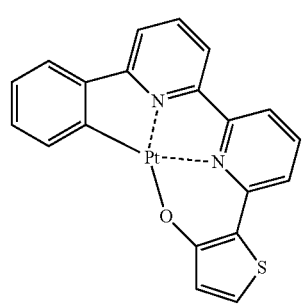
PD51 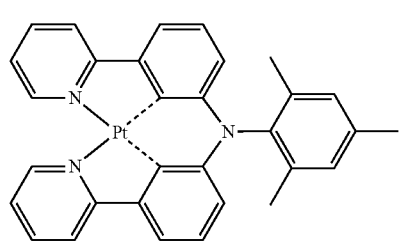
PD57 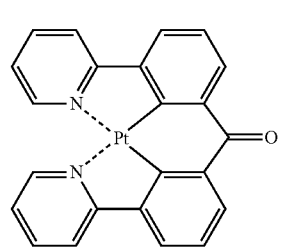
PD52 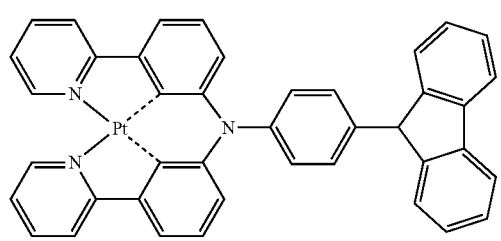
PD58 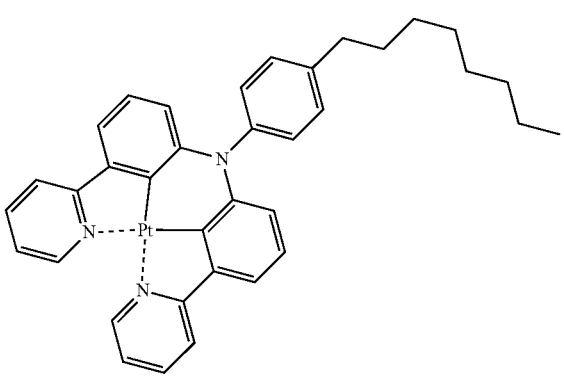
PD53 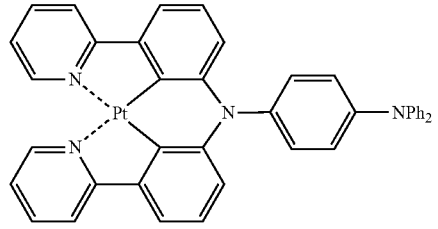

-continued
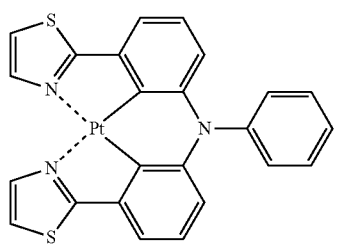
PD59
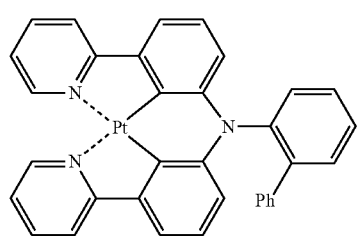
PD60
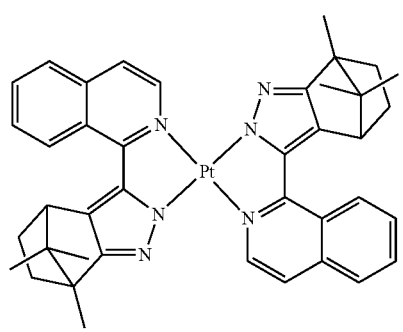
PD61
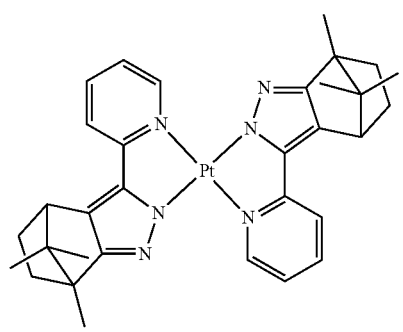
PD62
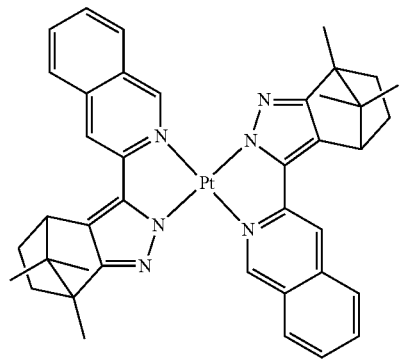
PD63
-continued
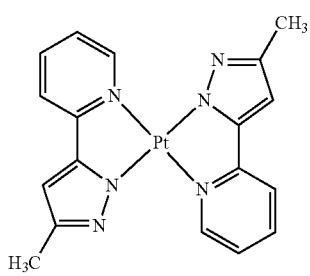
PD64
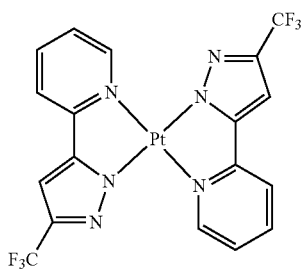
PD65
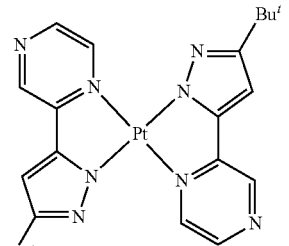
PD66
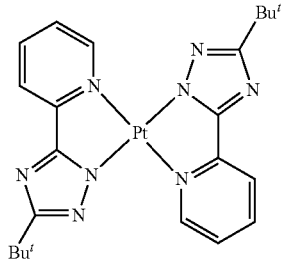
PD67
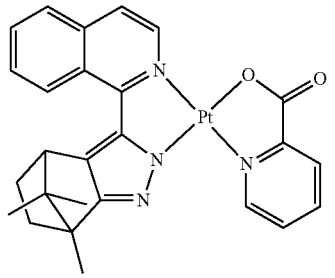
PD68
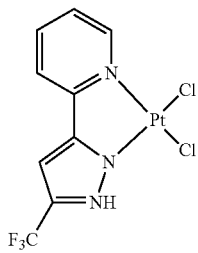
PD69

-continued
PD70 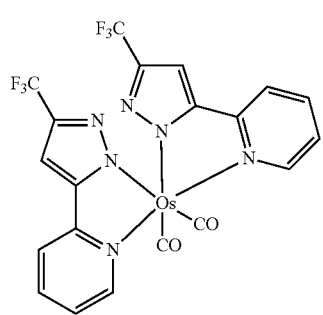
PD71 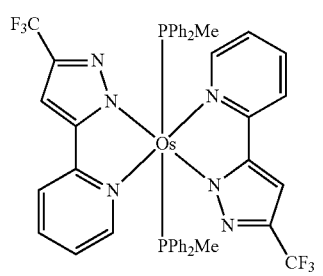
PD72 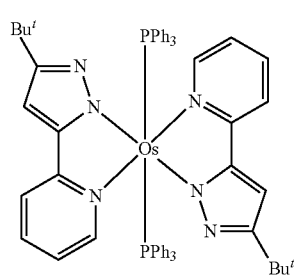
PD73 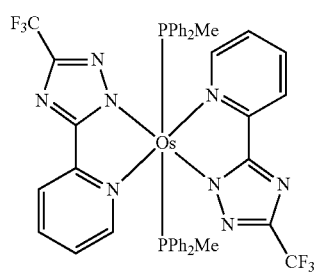
-continued
PD74 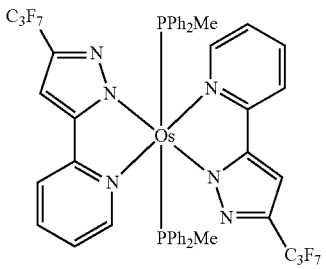
In some embodiments, the phosphorescent dopant may include PtOEP:
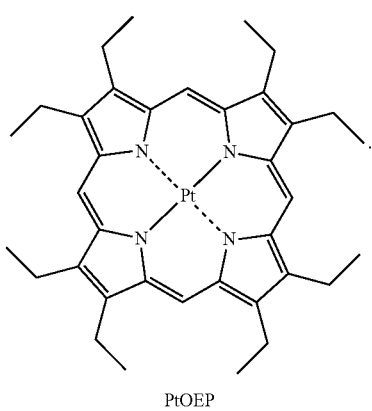
PtOEP
The fluorescent dopant may include at least one selected from DPVBi, DPAVBi, TBPe, DCM, DCJTB, Coumarin 6, and C545T.
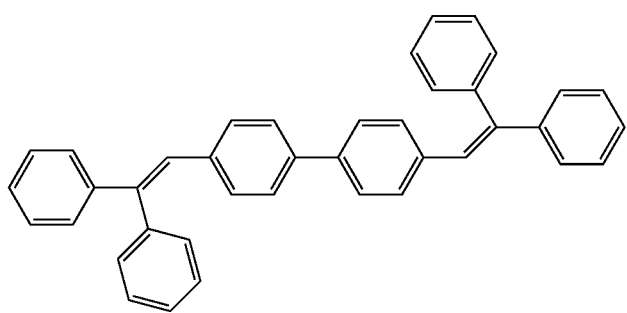
DPVBi -continued

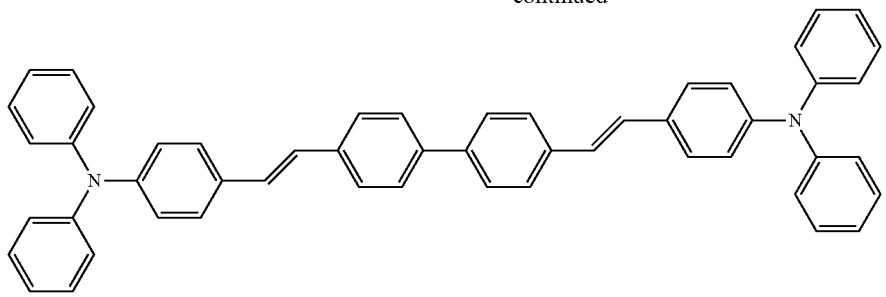

DPAVBi

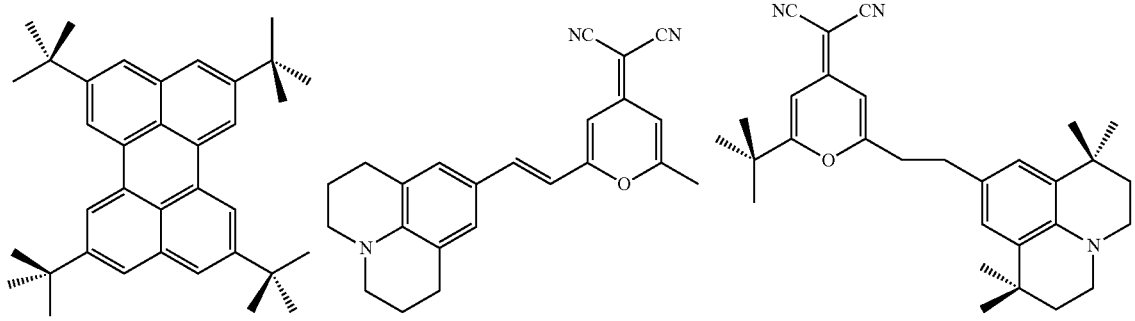

TBPe  DCM  DCJTB

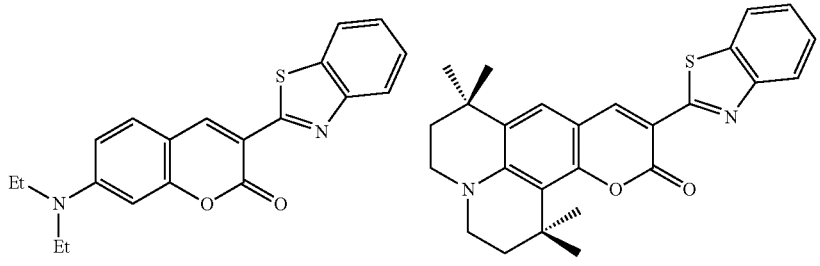

Coumarin 6  C545T

In some embodiments, the fluorescent dopant may include a compound represented by Formula 501 below.

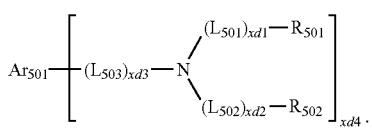

Formula 501

In Formula 501, $Ar_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (where $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), Descriptions of $L_{501}$ to $L_{503}$ may be the same as the description of $L_{201}$ provided herein;

$R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3; and xb4 may be selected from 1, 2, 3, and 4.

For example, the fluorescent dopant may include at least one of Compounds FD1 to FD8:

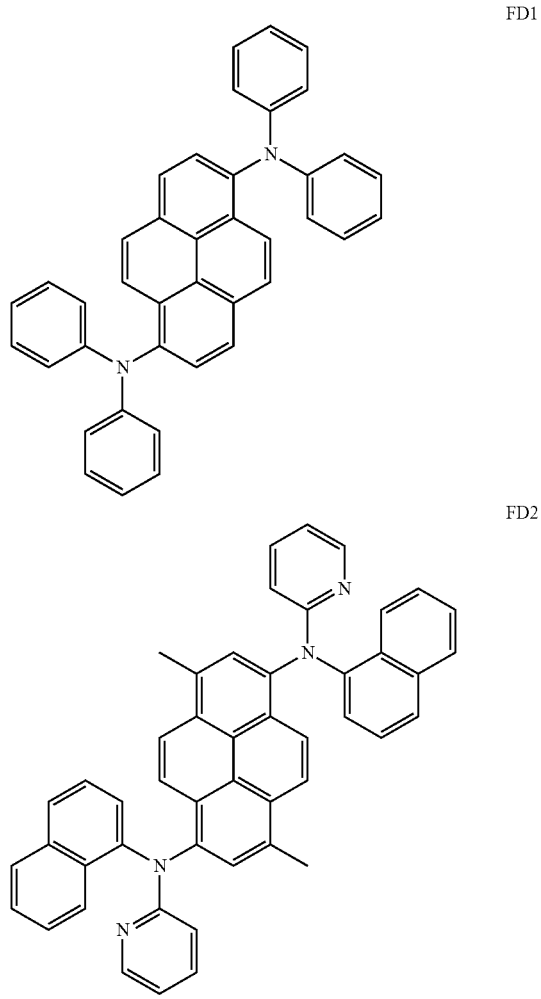

FD1

FD2

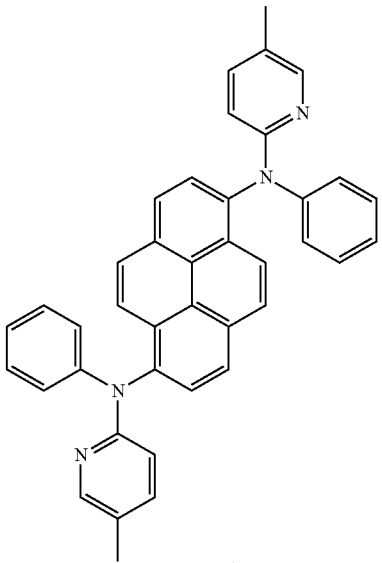

FD3

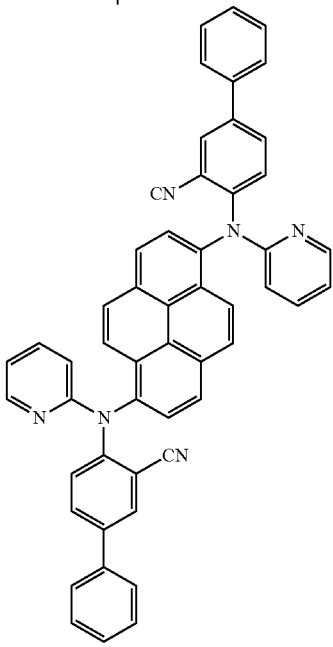

FD4

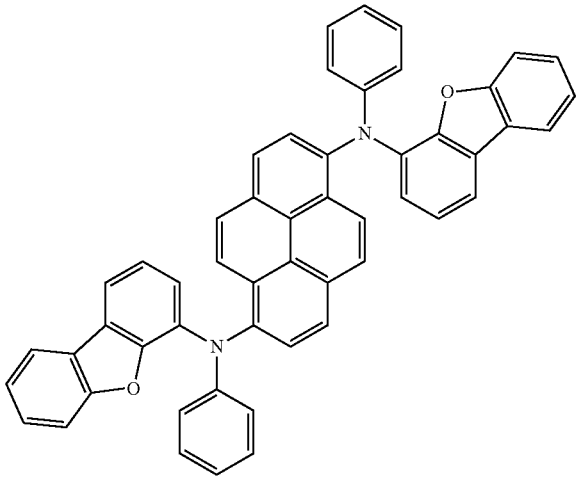

FD5

-continued

FD6

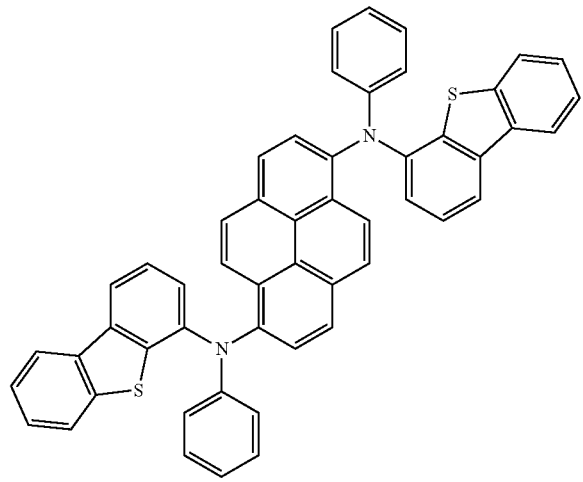

FD7

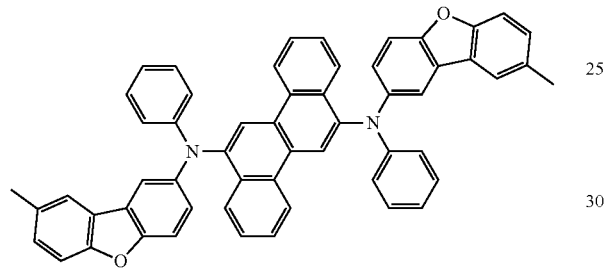

FD8

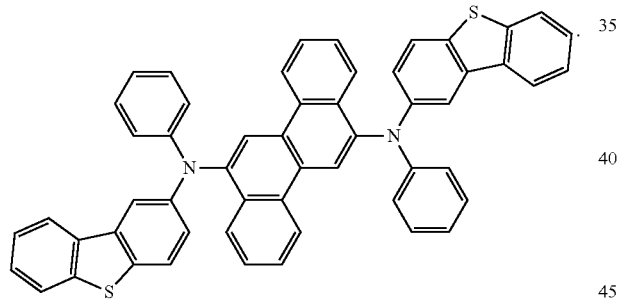

An amount of the dopant in the emission layer may be in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within any of these ranges, excellent (or suitable) light-emission characteristics may be obtained without a substantial increase in driving voltage.

An electron transport region may be disposed (e.g., positioned) on the emission layer.

The electron transport region may include at least one selected from a hole blocking layer, an electron transport layer, and an electron injection layer, but is not limited thereto.

For example, the electron transport region may have a structure of electron transport layer/electron injection layer or a structure of hole blocking layer/electron transport layer/electron injection layer, wherein the layers of each structure are sequentially stacked in a direction from the emission layer in the stated order, but the structure of the electron transport region is not limited thereto.

In some embodiments, the electron transport region may include a hole blocking layer. When the emission layer includes a phosphorescent dopant, the hole blocking layer may be formed to prevent or reduce the diffusion of excitons or holes into an electron transport layer.

When the electron transport region includes a hole blocking layer, the hole blocking layer may be formed on the emission layer by using one or more methods selected from vacuum deposition, spin coating, casting, an LB method, ink-jet printing, laser-printing, and laser-induced thermal imaging. When the hole blocking layer is formed by vacuum deposition and/or spin coating, deposition and coating conditions for the hole blocking layer may be determined by referring to the deposition and coating conditions for the hole injection layer.

The hole blocking layer may include, for example, at least one selected from BCP and Bphen, but is not limited thereto.

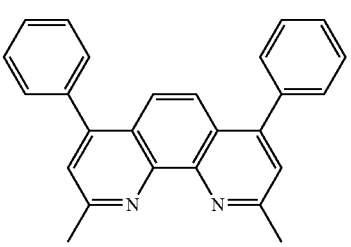

BCP

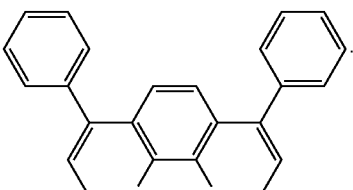

Bphen

A thickness of the hole blocking layer may be in a range of about 20 Å to about 1,000 Å, for example, about 30 Å to about 300 Å. When the thickness of the hole blocking layer is within any of these ranges, the hole blocking layer may have excellent (or suitable) hole blocking characteristics without a substantial increase in driving voltage.

The electron transport region may include an electron transport layer. The electron transport layer may be formed on the emission layer or the hole blocking layer by using one or more methods selected from vacuum deposition, spin coating, casting, an LB method, ink-jet printing, laser-printing, and laser-induced thermal imaging. When an electron transport layer is formed by vacuum deposition and/or spin coating, deposition and coating conditions for the electron transport layer may be the same as or similar to the deposition and coating conditions for the hole injection layer.

The electron transport layer may further include at least one selected from BCP, Bphen, Alq$_3$, Balq, TAZ, and NTAZ.

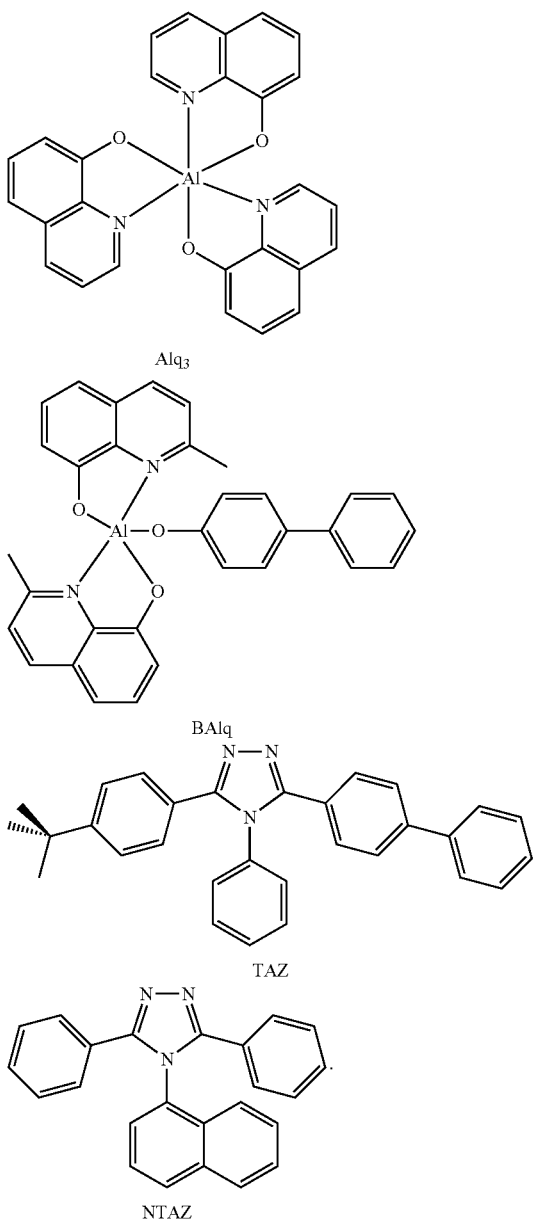

Alq₃

BAlq

TAZ

NTAZ

In some embodiments, the electron transport layer may further include at least one of compounds represented by Formula 601 below:

$$Ar_{601}-[(L_{601})_{xe1}-E_{601}]_{xe2}.$$  Formula 601

In Formula 601, a description of $Ar_{601}$ may be understood by referring to the description provided in connection with $Ar_{301}$;

a description of $L_{601}$ may be understood by referring to the description provided in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, carbazolyl, a phenanthridinyl group, an acridinyl group, a phenanthrolinyl group, a phenazinyl group, benzoimidazolyl, a benzofuranyl group, a benzothiophenyl group, isobenzothiazolyl, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In some embodiments, the electron transport layer may further include at least one of compounds represented by Formula 602 below:

Formula 602

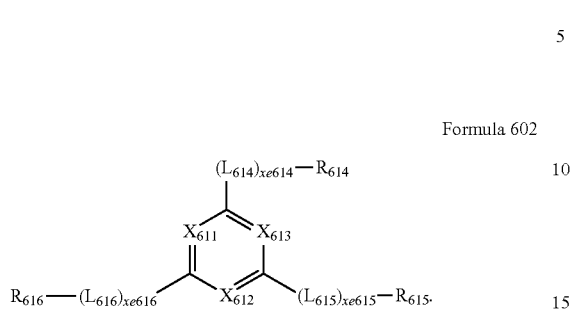

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may be each independently understood by referring to the description provided herein in connection with $L_{201}$;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may each independently include at least one of Compounds ET1 to ET16 illustrated below.

ET1
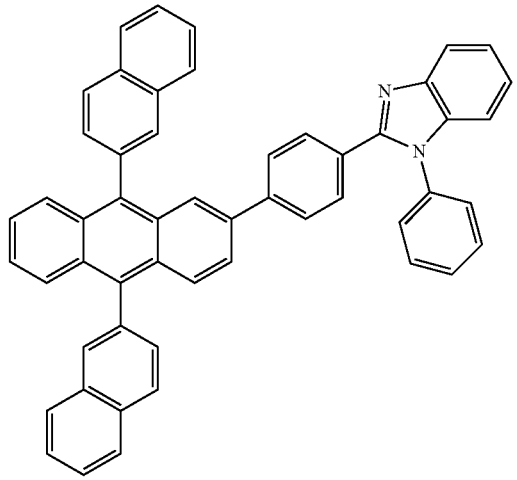

ET2
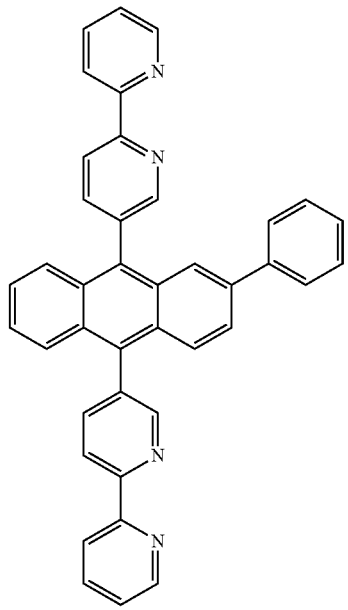

ET3
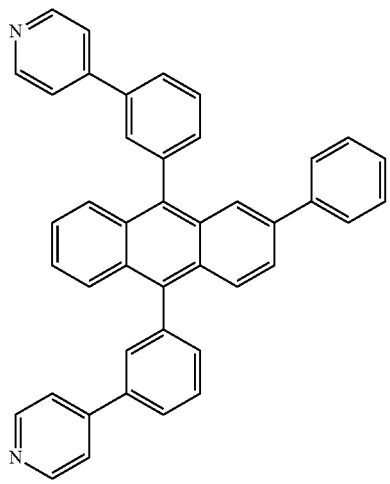

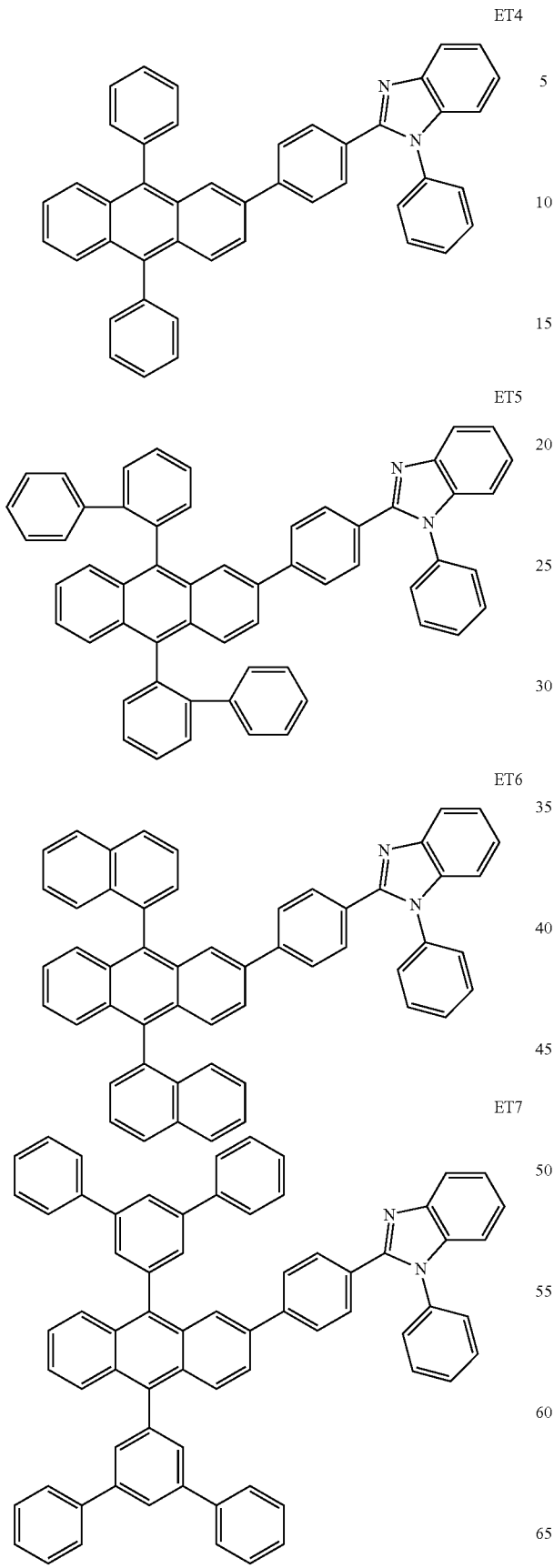
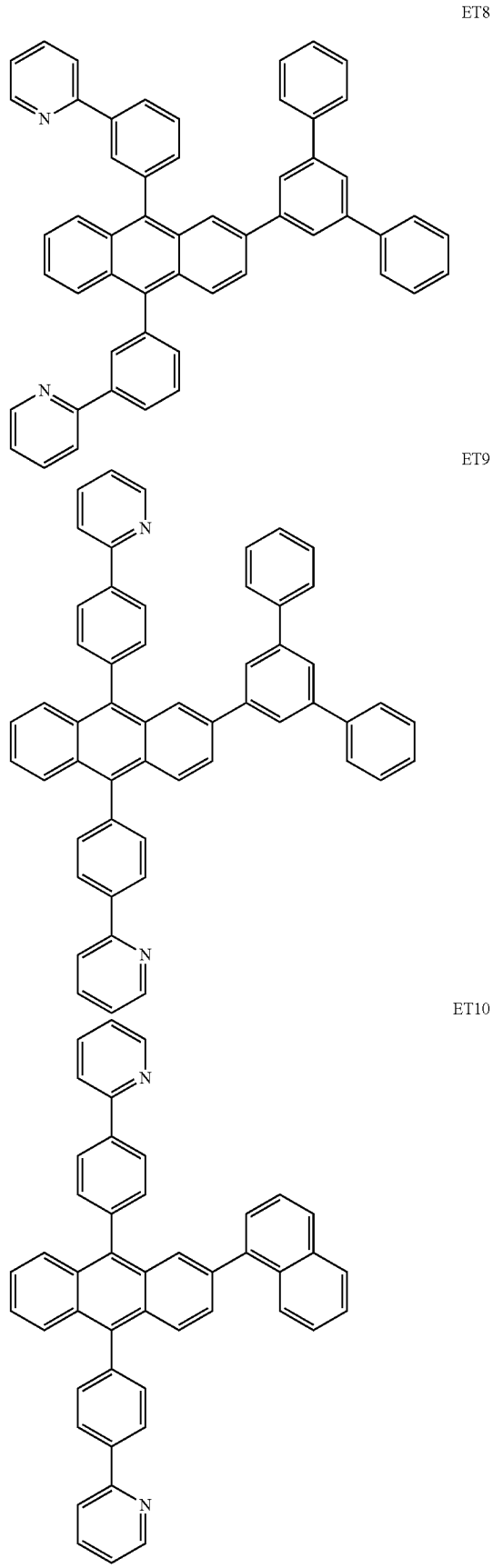

ET11

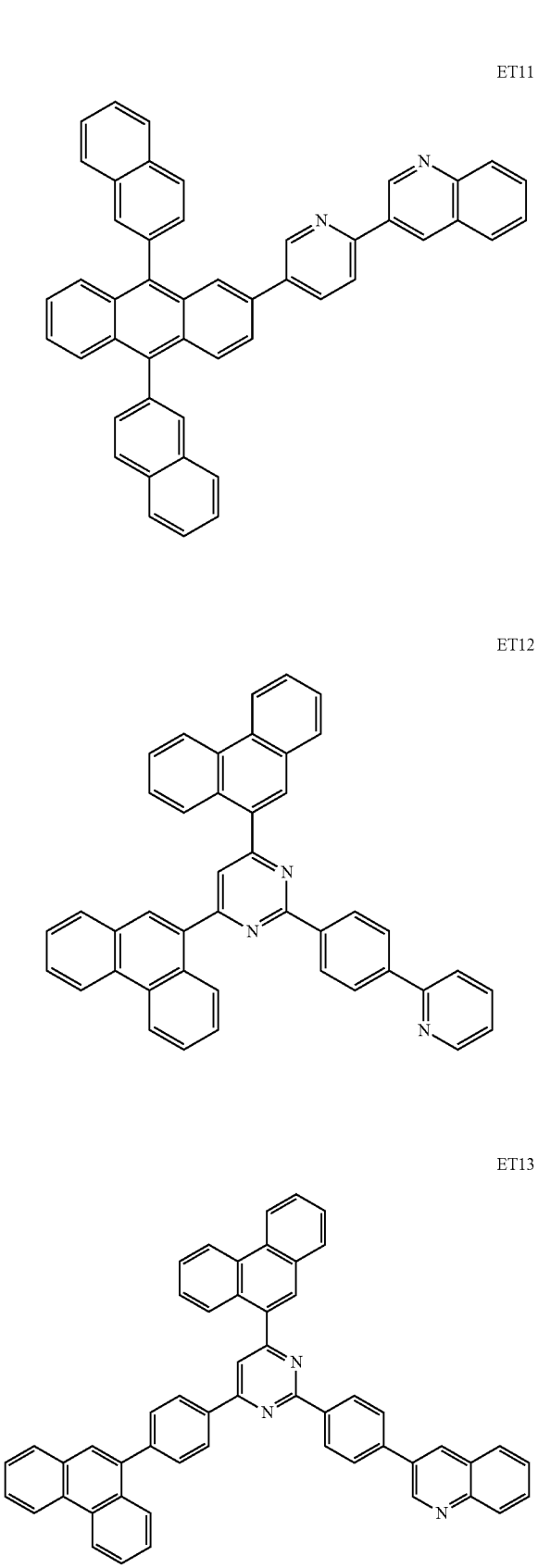

ET12

ET13

ET14

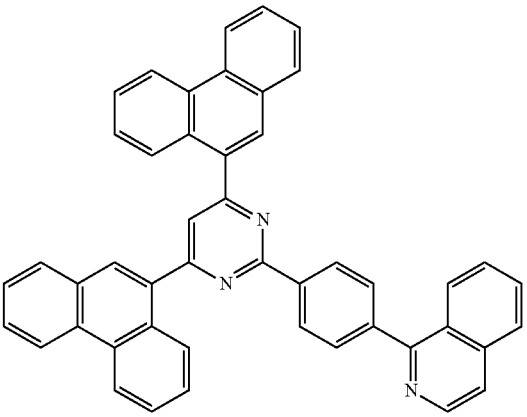

ET15

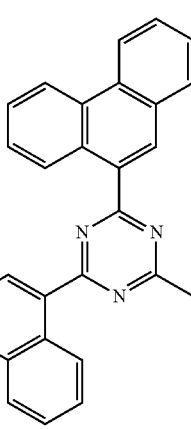

ET16

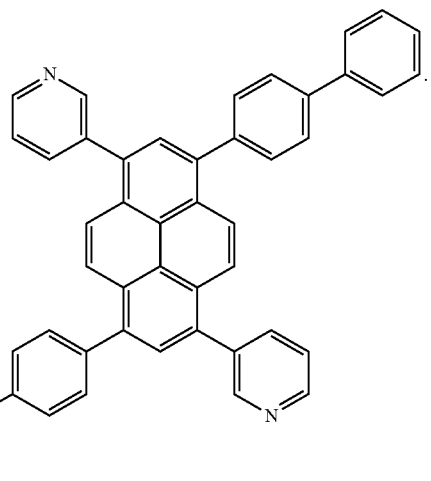

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory (or suitable) electron transport characteristics without a substantial increase in driving voltage.

The electron transport layer may further include, in addition to the materials described above, a metal-containing material.

The metal-containing material may include a Li complex. The Li complex may include, for example, Compound ET-D1 (lithium quinolate, LiQ) and/or Compound ET-D2.

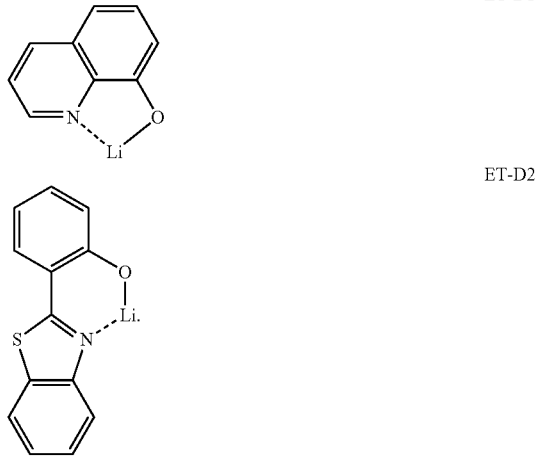

ET-D1

ET-D2

The electron transport region may include an electron injection layer that facilitates the injection of electrons from the second electrode 190.

The electron injection layer may be formed on the electron transport layer by using one or more methods selected from vacuum deposition, spin coating, casting, an LB method, ink-jet printing, laser-printing, and laser-induced thermal imaging. When an electron injection layer is formed by vacuum deposition and/or spin coating, deposition and coating conditions for the electron injection layer may be the same as or similar to those for the hole injection layer.

The electron injection layer may include at least one selected from LiF, NaCl, CsF, Li$_2$O, BaO, and LiQ.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

The second electrode 190 may be disposed (e.g., positioned) on the organic layer 150 having the structure according to embodiments of the present disclosure. The second electrode 190 may be a cathode, which is an electron injection electrode, and in this regard, a material for forming the second electrode 190 may be selected from a metal, an alloy, an electrically conductive compound, and a mixture thereof, which have a relatively low work function. Non-limiting examples of the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a reflective electrode, a semi-transmissive electrode, or a transmissive electrode.

Hereinbefore, the organic light-emitting device has been described with reference to FIG. 1, but embodiments of the present disclosure are not limited thereto.

Figure 2:
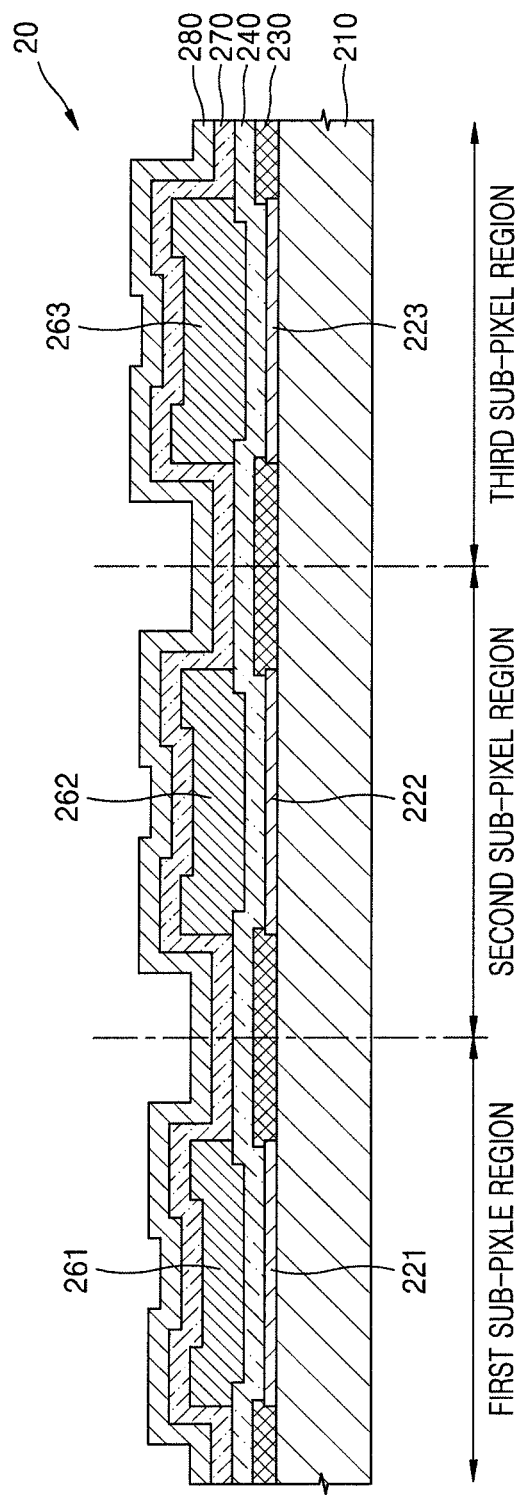
FIG. 2 is a schematic cross-sectional view of a full-color organic light-emitting device according to an example embodiment.

FIG. 2 is a schematic cross-sectional view of an organic light-emitting device 20 according to an embodiment of the present disclosure.

Referring to FIG. 2, the organic light-emitting device 20 includes a substrate 210 that is divided according to a first sub-pixel region, a second sub-pixel region, and a third sub-pixel region.

A first sub-pixel is formed in the first sub-pixel region, a second sub-pixel is formed in the second sub-pixel region, and a third sub-pixel is formed in the third sub-pixel region.

A plurality of first electrodes 221, 222, and 223 are disposed (e.g., positioned) in the first sub-pixel region, the second sub-pixel region, and the third sub-pixel region of the substrate, respectively. That is, the first electrode 221 is disposed in the first sub-pixel region, the first electrode 222 is disposed in the second sub-pixel region, and the first electrode 223 is disposed in the third sub-pixel region.

A hole transport region 240 is disposed on the first electrodes 221, 222, and 223. The hole transport region 240 may be formed as a common layer on the first electrodes 221, 222, and 223. The hole transport region 240 may include a first hole transport region formed in the first sub-pixel region; a second hole transport region formed in the second sub-pixel region; and a third hole transport region formed in the third sub-pixel region. For example, the hole transport region 240 may include the first compound represented by Formula 1 and the second compound represented by Formula 2.

In some embodiments, the hole transport region 240 includes a first layer and a second layer, where the second layer is disposed between the first layer and the first electrodes 221, 222 and 223. The first layer may include the first compound represented by Formula 1, and the second layer may include the second compound represented by Formula 2, but the structure of the hole transport region 240 is not limited thereto.

The first compound represented by Formula 1 and the second compound represented by Formula 2 are as described above.

An emission layer including a first emission layer 261, a second emission layer 262, and a third emission layer 263 may be formed on the hole transport region 240. The first emission layer 261 is formed in the first sub-pixel region and emits first color light (e.g. light of a first color), the second emission layer 262 is formed in the second sub-pixel region and emits second color light (e.g., light of a second color), and the third emission layer 263 is formed in the third sub-pixel region and emits third color light (e.g., light of a third color). For example, at least one of the first emission layer 261, the second emission layer 262, and the third emission layer 263 may include the compound represented by Formula 1.

For example, the first color light may be red light, the second color light may be green light, and the third color light may be blue light. The first color light, the second color light, and the third color light may be combined with each other to form white light.

An electron transport region 270 may be formed on the first, second, and third emission layers 261, 262, and 263. The electron transport region 270 may be formed as a common layer on the first, second, and third emission layers 261, 262, and 263. The electron transport region 270 may include an electron transport layer and an electron injection layer, which are sequentially stacked on the first, second, and third emission layers 261, 262, and 263 in this stated order.

A second electrode 280 may be formed as a common layer on the electron transport region 270.

The expression "common layer" used herein may refer to a layer that is commonly formed in the first sub-pixel region, the second sub-pixel region, and the third sub-pixel region, without being patterned according to the first sub-pixel region, the second sub-pixel region, and the third sub-pixel region.

A pixel insulating film 230 may be formed on the edges of each of the first electrodes 221, 222, and 223. The pixel insulating film 230 may define a pixel region, and may include any suitable organic insulating material, inorganic insulating material (such as a silicon-based material), and/or an organic/inorganic composite insulating material.

The descriptions of the first electrodes 221, 222, and 223, the hole transport region 240, the first, second, and third emission layers 261, 262, and 263, the electron transport region 270 and the second electrode 280 may be understood by referring to the descriptions provided in connection with FIG. 1.

The organic light-emitting device 20 may be included in a flat panel display device including a thin film transistor. The thin film transistor may include a gate electrode, source and drain electrodes, a gate insulating film, and an active layer, and one of the source electrode and drain electrode may electrically contact (e.g., may be electrically coupled to) the first electrodes 221, 222, and 223 of the organic light-emitting device 20. The active layer may include crystalline silicon, amorphous silicon, organic semiconductor, oxide semiconductor, and/or the like, but embodiments of the present disclosure are not limited thereto.

Hereinbefore, a full-color organic light-emitting device 20 has been described with reference to FIG. 2, but embodiments of the present disclosure are not limited thereto. For example, the third emission layer 263 may extend to the first sub-pixel region and the second sub-pixel region, thereby forming a common emission layer.

A $C_1$-$C_{60}$ alkyl group used herein may refer to a linear or branched aliphatic hydrocarbon monovalent group having 1 to 60 carbon atoms, and non-limiting examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein may refer to a divalent group having the same structure as the $C_1$-$C_{60}$ alkyl group.

A $C_1$-$C_{60}$ alkoxy group used herein may refer to a monovalent group represented by —$OA_{101}$ (wherein $A_{101}$ is the $C_1$-$C_{60}$ alkyl group), and non-limiting examples thereof are a methoxy group, an ethoxy group, and an isopropoxy group.

A $C_2$-$C_{60}$ alkenyl group used herein may refer to a hydrocarbon group having at least one carbon double bond at one or more positions along the hydrocarbon chain of the $C_2$-$C_{60}$ alkyl group (e.g., in the middle or at either terminal end of the $C_2$-$C_{60}$ alkyl group), and non-limiting examples thereof are an ethenyl group, a propenyl group, and a butenyl group. A $C_2$-$C_{60}$ alkenylene group used herein may refer to a divalent group having the same structure as the $C_2$-$C_{60}$ alkenyl group.

A $C_2$-$C_{60}$ alkynyl group used herein may refer to a hydrocarbon group having at least one carbon triple bond at one or more positions along the hydrocarbon chain of the $C_2$-$C_{60}$ alkyl group (e.g., in the middle or at either terminal end of the $C_2$-$C_{60}$ alkyl group), and non-limiting examples thereof are an ethynyl group and a propynyl group. A $C_2$-$C_{60}$ alkynylene group used herein may refer to a divalent group having the same structure as the $C_2$-$C_{60}$ alkynyl group.

A $C_3$-$C_{10}$ cycloalkyl group used herein may refer to a monovalent hydrocarbon monocyclic group having 3 to 10 carbon atoms, and non-limiting examples thereof are a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as the $C_3$-$C_{10}$ cycloalkyl group.

A $C_1$-$C_{10}$ heterocycloalkyl group used herein may refer to a monovalent monocyclic group having at least one heteroatom selected from N, O, P, and S as a ring-forming atom, and 1 to 10 carbon atoms, and non-limiting examples thereof are a tetrahydrofuranyl group and a tetrahydrothiophenyl group. A $C_1$-$C_{10}$ heterocycloalkylene group used herein may refer to a divalent group having the same structure as the $C_1$-$C_{10}$ heterocycloalkyl group.

A $C_3$-$C_{10}$ cycloalkenyl group used herein may refer to a monovalent monocyclic group that has 3 to 10 carbon atoms and at least one double bond in the ring thereof, and does not have aromaticity, and non-limiting examples thereof are a cyclopentenyl group, a cyclohexenyl group, and a cycloheptenyl group. A $C_3$-$C_{10}$ cycloalkenylene group used herein may refer to a divalent group having the same structure as the $C_3$-$C_{10}$ cycloalkenyl group.

A $C_1$-$C_{10}$ heterocycloalkenyl group used herein may refer to a monovalent monocyclic group that has at least one heteroatom selected from N, O, P, and S as a ring-forming atom, 1 to 10 carbon atoms, and at least one double bond in its ring. Non-limiting examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein may refer to a divalent group having the same structure as the $C_1$-$C_{10}$ heterocycloalkenyl group.

A $C_6$-$C_{60}$ aryl group used herein may refer to a monovalent group having a carbocyclic aromatic system having 6 to 60 carbon atoms, and a $C_6$-$C_{60}$ arylene group used herein may refer to a divalent group having a carbocyclic aromatic system having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused to each other.

A $C_1$-$C_{60}$ heteroaryl group used herein may refer to a monovalent group having a carbocyclic aromatic system that has at least one heteroatom selected from N, O, P, and S as a ring-forming atom, and 1 to 60 carbon atoms. A $C_1$-$C_{60}$ heteroarylene group used herein may refer to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused to each other.

A $C_6$-$C_{60}$ aryloxy group used herein may refer to a monovalent group represented by —$OA_{102}$ (wherein $A_{102}$ is the $C_6$-$C_{60}$ aryl group), and a $C_6$-$C_{60}$ arylthio group may refer to a monovalent group represented by —$SA_{103}$ (wherein $A_{103}$ is the $C_6$-$C_{60}$ aryl group).

A monovalent non-aromatic condensed polycyclic group used herein may refer to a monovalent group that has two or more rings condensed to each other, only carbon atoms (for example, the number of carbon atoms may be in a range of 8 to 60) as ring-forming atoms, and does not have overall aromaticity in the entire molecular structure. A non-limiting example of the monovalent non-aromatic condensed polycyclic group is a fluorenyl group. A divalent non-aromatic condensed polycyclic group used herein may refer to a divalent group having the same structure as the monovalent non-aromatic condensed polycyclic group.

A monovalent non-aromatic condensed heteropolycyclic group used herein may refer to a monovalent group that has two or more rings condensed to each other, has at least one heteroatom selected from N, O P, and S, and carbon atoms (for example, the number of carbon atoms may be in a range of 2 to 60), as ring-forming atoms, and does not have overall aromaticity in the entire molecular structure. A non-limiting example of the monovalent non-aromatic condensed heteropolycyclic group is a carbazolyl group. A divalent non-aromatic condensed heteropolycyclic group used herein may refer to a divalent group having the same structure as the monovalent non-aromatic condensed heteropolycyclic group.

At least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$) and —B($Q_{36}$)($Q_{37}$), wherein $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, a substituted divalent non-aromatic condensed polycyclic group, a substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{30}$ alkyl group, a $C_2$-$C_{30}$ alkenyl group, a $C_2$-$C_{30}$ alkynyl group, and a $C_1$-$C_{30}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group and $C_1$-$C_{30}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$) and —B($Q_{36}$)($Q_{37}$), wherein $Q_{11}$ to $Q_{17}$, $Q_{21}$ to $Q_{27}$, and $Q_{31}$ to $Q_{37}$ may be each independently selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from deuterium, a $C_1$-$C_{30}$ alkyl group, a $C_2$-$C_{30}$ alkenyl group, a $C_2$-$C_{30}$ alkynyl group, a $C_1$-$C_{30}$ alkoxy group, a cyclopentyl group, a cyclohexyl group, a cycloheptyl group, a cyclooctyl group, a cyclopentenyl group, a cyclohepcenyl group, a cycloheptenyl group, a phenyl group, a biphenyl group, a terphenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, but are not limited thereto.

The term "Ph" used herein may refer to a phenyl group, the term "Me" used herein may refer to a methyl group, the term "Et" used herein may refer to an ethyl group, and the term "ter-Bu" or "Bu$^t$" used herein may refer to a tert-butyl group.

Hereinafter, an organic light-emitting device according to one or more embodiments of the present disclosure is described in more detail with reference to Synthesis Example and Examples. However, the organic light-emitting device of the present embodiments is not limited thereto.

The expression "B was used instead of A" used in describing Synthesis Examples may refer to a molar equivalent of A being identical to a molar equivalent of B. As used herein, the term "eq" may refer to a molar equivalent.

EXAMPLES

Synthesis Examples: Synthesis of Intermediates

1) Synthesis of Int-1

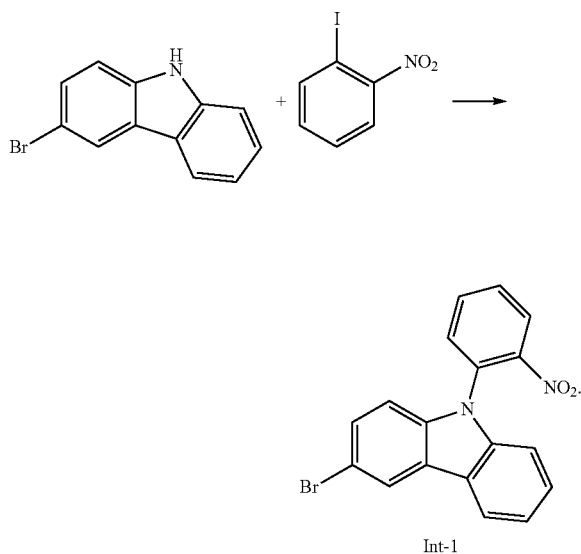

Pd(dba)₃ (0.03 eq), (t-Bu)₃P (0.06 eq), and toluene (0.1M based on 1-iodo-2-nitrobenzene) were added to a flask containing 3-bromo-9H-carbazole (0.8 eq) and 1-iodo-2-nitrobenzene (1 eq), and the resulting mixture was reflux-stirred for 12 hours. Once the reaction was complete, the mixture was cooled to room temperature, and then, subjected to an extraction process using methylene chloride, and then, the extraction result was washed with distilled water. A collected organic layer was dried by using $MgSO_4$ and distilled under reduced pressure. The obtained residual was purified by column chromatography to obtain Int-1 (yield of 68%). Int-1 was identified by High Resolution Mass Spectrometry (HRMS).

$C_{18}H_{11}BrN_2O_2$ [M]+: calculated: 367.20, found: 366.

2) Synthesis of Int-2 and Int-3

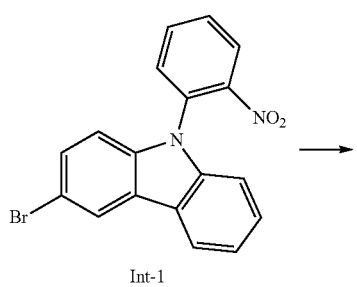

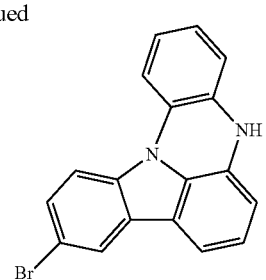

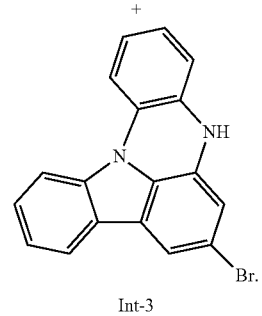

Int-1 (1 eq) was dissolved in triethylphosphite (10 eq), and then, reflux-stirred under nitrogen stream for 12 hours. Once the reaction was complete, the remaining triethylphosphite was removed therefrom by vacuum distillation. Then, the result was purified by column chromatography (using hexane:methylene chloride=4:1 (v/v) as solvent) to obtain Int-2 (yield of 46.5%) and Int-3 (yield of 41.6%). Int-2 and Int-3 were each identified by HRMS.

$C_{18}H_{11}BrN_2$ [M]+: calculated: 335.20, found: 334.

3) Synthesis of Int-4

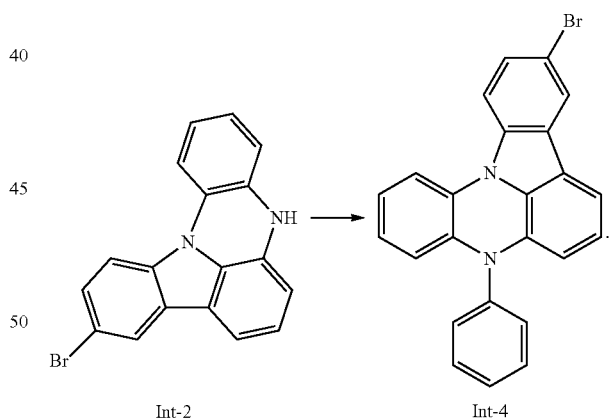

Pd(dba)₃ (0.03 eq), (t-Bu)₃P (0.06 eq), and toluene (0.1M based on iodobenzene) were added to a flask containing Int-2 (0.8 eq) and iodobenzene (1 eq), and then, the resulting mixture was reflux-stirred for 3 hours. Once the reaction was complete, the mixture was cooled to room temperature and subjected to an extraction process using methylene chloride, and the extraction result was washed with distilled water. A collected organic layer was dried by using $MgSO_4$ and distilled under reduced pressure to obtain the residual, which was then purified by column chromatography to obtain Int-4 (yield of 82%). Int-4 was identified by HRMS.

$C_{24}H_{15}BrN_2$ [M]+: calculated: 411.30, found: 410.

4) Synthesis of Int-5

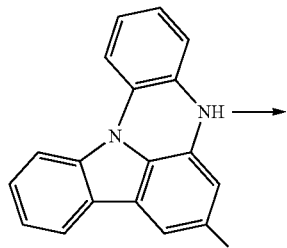
Int-3

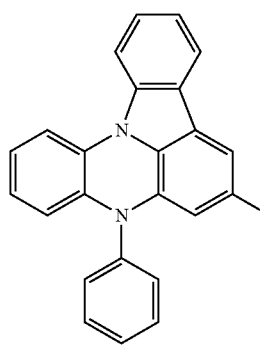
Int-5

Pd(dba)₃ (0.03 eq), (t-Bu)₃P (0.06 eq), and toluene (0.1M based on iodobenzene) were added to a flask containing Int-3 (0.8 eq) and iodobenzene (1 eq), and then, the resulting mixture was reflux-stirred for 3 hours. Once the reaction was complete, the mixture was cooled to room temperature and subjected to an extraction process using methylene chloride, and the extraction result was washed with distilled water. A collected organic layer was dried by using MgSO₄ and distilled under reduced pressure to obtain the residual, which was then purified by column chromatography to obtain Int-5 (yield of 82%). Int-5 was identified by HRMS.

$C_{24}H_{15}BrN_2$ [M]+: calculated: 411.30, found: 410.

5) Synthesis of Int-6

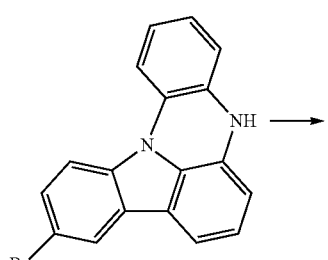
Int-2

-continued

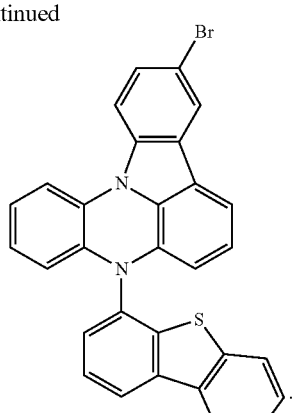
Int-6

Pd(dba)₃ (0.03 eq), (t-Bu)₃P (0.06 eq), and toluene (0.1M based on 4-iodobenzo[b,d]thiophene) were added to a flask containing Int-2 (0.8 eq) and 4-iodobenzo[b,d]thiophene (1 eq), and then, the resulting mixture was reflux-stirred for 3 hours. Once the reaction was complete, the mixture was cooled to room temperature and subjected to an extraction process using methylene chloride, and the extraction result was washed with distilled water. A collected organic layer was dried by using MgSO₄ and distilled under reduced pressure to obtain the residual, which was then purified by column chromatography to obtain Int-6 (yield of 76%). Int-6 was identified by HRMS.

$C_{30}H_{17}BrN_2S$[M]+: calculated: 517.44, found: 516.

6) Synthesis of Int-7

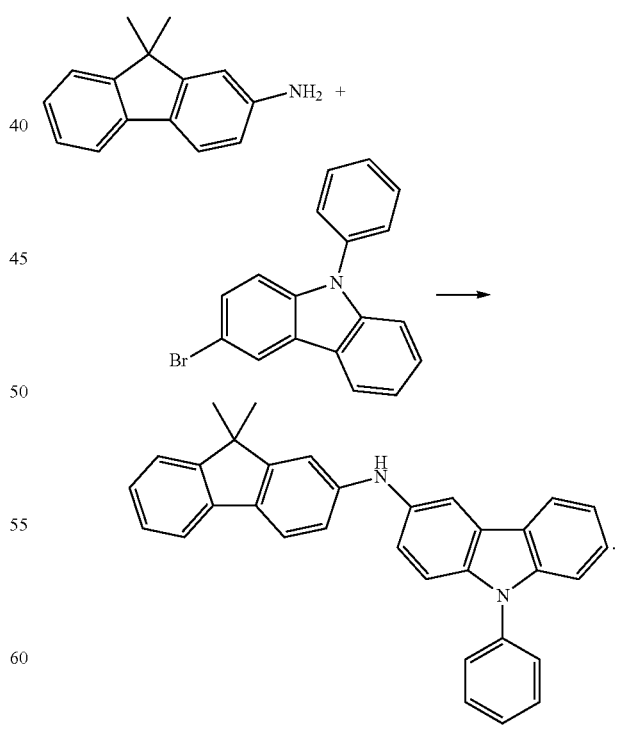
Int-7

Pd(dba)₃ (0.03 eq), (t-Bu)₃P (0.06 eq), and toluene (0.1M based on 9,9-dimethyl-9H-fluorene-2-amine) were added to a flask containing 9,9-dimethyl-9H-fluorene-2-amine (1 eq) and 3-bromo-9-phenyl-9H-carbazole (0.9 eq), and then, the resulting mixture was reflux-stirred for 3 hours. Once the reaction was complete, the mixture was cooled to room temperature and subjected to an extraction process using methylene chloride, and the extraction result was washed with distilled water. A collected organic layer was dried by using MgSO$_4$ and distilled under reduced pressure to obtain the residual, which was then purified by column chromatography to obtain Int-7(yield of 69%). Int-7 was identified by HRMS.

HRMS (C$_{33}$H$_{26}$N$_2$ [M]+): calculated; 450.59, found; 449.

7) Synthesis of Int-8

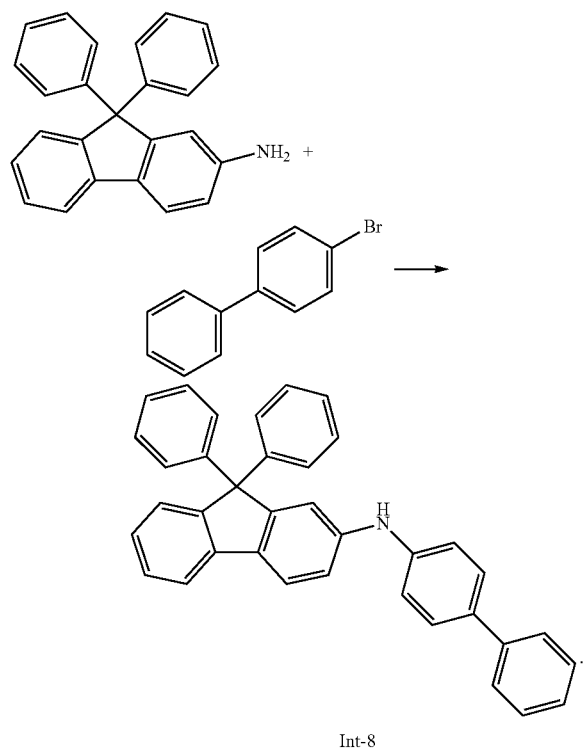

Int-8

Pd(dba)$_3$ (0.03 eq), (t-Bu)$_3$P (0.06 eq), and toluene(0.1M based on 9,9-diphenyl-9H-fluorene-2-amine) were added to a flask containing 9,9-diphenyl-9H-fluorene-2-amine (1 eq) and 4-bromo-1,1'-biphenyl (0.9 eq), and then, the resulting mixture was reflux-stirred for 3 hours. Once the reaction was complete, the mixture was cooled to room temperature and subjected to an extraction process using methylene chloride, and the extraction result was washed with distilled water. A collected organic layer was dried by using MgSO$_4$ and distilled under reduced pressure to obtain the residual, which was then purified by column chromatography to obtain Int-8(yield of 71%).

HRMS (C$_{37}$H$_{27}$N [M]+): calculated; 485.63, found; 484.

Synthesis Example 1: Synthesis of Compound A1

Int-5 (1 eq), (3-(dibenzo[b,d]thiophene-4-yl)phenyl)boronic acid (1.2 eq), Pd(PPh$_3$)$_4$ (0.02 eq), Na$_2$CO$_3$ (1.2 eq), and a mixture of toluene, distilled water, and ethanol (5:3:2 (v/v), 0.1M based on Int-5) were loaded into a flask, and then, reflux-stirred for 12 hours. Once the reaction was complete, the mixture was cooled to room temperature and subjected to an extraction process using methylene chloride, and the extraction result was washed with distilled water. A collected organic layer was dried by using MgSO$_4$ and distilled under reduced pressure to obtain the residual, which was then purified by column chromatography to obtain Compound A1 (yield of 74%). Compound A1 was identified by Elemental analysis and HRMS.

Elemental analysis (C$_{42}$H$_{26}$N$_2$S): C (85.39), H (4.44), N (4.74), S (5.43), HRMS (C$_{42}$H$_{26}$N$_2$S [M]+): calculated; 590.74, found: 589.

Synthesis Example 2: Synthesis of Compound A14

Compound A14 (yield of 83%) was prepared in the same (or substantially the same) manner as in Synthesis Example 1, except that Int-4 was used instead of Int-5, and (9-phenyl-9H-carbazole-3-yl)boronic acid was used instead of (3-(dibenzo[b,d]thiophene-4-yl)phenyl)boronic acid. Compound A14 was confirmed by Elemental analysis and HRMS.

Elemental analysis (C$_{42}$H$_{27}$N$_3$): C (87.93), H (4.74), N (7.32),

HRMS (C$_{42}$H$_{27}$N$_3$ [M]+): calculated; 573.70, found: 572.

Synthesis Example 3: Synthesis of Compound A17

Compound A17 (yield of 84%) was prepared in the same (or substantially the same) manner as in Synthesis Example 1, except that Int-6 was used instead of Int-5, and dibenzo[b,d]thiophene-2-ylboronic acid was used instead of (3-(dibenzo[b,d]thiophene-4-yl)phenyl)boronic acid. Compound A17 was identified by Elemental analysis and HRMS.

Elemental analysis (C$_{42}$H$_{24}$N$_2$S$_2$): C (81.26), H (3.90), N (4.51), S (10.33), HRMS (C$_{42}$H$_{24}$N$_2$S$_2$ [M]+): calculated; 620.79, found: 619.

Synthesis Example 4: Synthesis of Compound A22

Compound A22 (yield of 79.2%) was prepared in the same (or substantially the same) manner as in Synthesis Example 1, except that Int-4 was used instead of Int-5, and dibenzo[b,d]furan-4-ylboronic acid was used instead of (3-(dibenzo[b,d]thiophene-4-yl)phenyl)boronic acid. Compound A22 was identified by Elemental analysis and HRMS.

Elemental analysis (C$_{36}$H$_{22}$N$_2$O): C (86.72), H (4.45), N (5.62), O (3.21), HRMS (C$_{36}$H$_{22}$N$_2$O [M]+): calculated; 498.59, found; 497.

Synthesis Example 5: Synthesis of Compound A23

Compound A23 (yield of 79.2%) was prepared in the same (or substantially the same) manner as in Synthesis Example 1, except that Int-6 was used instead of Int-5, and dibenzo[b,d]thiophene-4-ylboronic acid was used instead of (3-(dibenzo[b,d]thiophene-4-yl)phenyl)boronic acid. Compound A23 was identified by Elemental analysis and HRMS.

Elemental analysis (C$_{42}$H$_{24}$N$_2$S$_2$): C (81.26), H (3.90), N (4.51), S (10.33).

HRMS (C$_{42}$H$_{24}$N$_2$S$_2$ [M]+): calculated; 620.79, found; 619.

Synthesis Example 6: Synthesis of Compound H-01

Int-7 (1 eq), bromobenzene (1.2 eq), Pd(dba)$_3$ (0.03 eq), (t-Bu)$_3$P (0.06 eq), and toluene (0.1M based on Int-7) were loaded into a flask, and then, the resulting mixture was reflux-stirred for 12 hours. Once the reaction was complete, the mixture was cooled to room temperature and subjected to an extraction process using methylene chloride, and the extraction result was washed with distilled water. A collected organic layer was dried by using MgSO$_4$ and distilled under reduced pressure to obtain the residual, which was then purified by column chromatography to obtain Compound H-01 (yield of 86.4%). Compound H-01 was identified by Elemental analysis and HRMS.

Elemental analysis (C$_{39}$H$_{30}$N$_2$): calculated; C (88.94), H (5.74), N (5.32).

HRMS (C$_{39}$H$_{30}$N$_2$ [M]+): calculated; 526.68, found; 525.

Synthesis Example 7: Synthesis of Compound H-03

Compound H-03 (yield of 82.6%) was prepared in the same (or substantially the same) manner as in Synthesis Example 6, except that 1-bromo-2-methylbenzene was used instead of bromobenzene. Compound H-03 was identified by Elemental analysis and HRMS.

Elemental analysis (C$_{40}$H$_{32}$N$_2$): calculated; C (88.85), H (5.97), N (5.18).

HRMS (C$_{40}$H$_{32}$N$_2$ [M]+): calculated; 540.26, found; 539.

Synthesis Example 8: Synthesis of Compound H-06

Compound H-06 (yield of 77.4%) was prepared in the same (or substantially the same) manner as in Synthesis Example 6, except that 2-bromonaphthalene was used instead of bromobenzene. Compound H-06 was identified by Elemental analysis and HRMS.

Elemental analysis (C$_{43}$H$_{32}$N$_2$): calculated; C (89.55), H (5.59), N (4.86).

HRMS (C$_{43}$H$_{32}$N$_2$ [M]+): calculated; 576.74, found; 575.

Synthesis Example 9: Synthesis of Compound H-09

Compound H-09 (yield of 72.6%) was prepared in the same (or substantially the same) manner as in Synthesis Example 6, except that 3-bromo-9-phenyl-9H-carbazole was used instead of bromobenzene. Compound H-09 was identified by Elemental analysis and HRMS.

Elemental analysis (C$_{51}$H$_{37}$N$_3$): calculated; C (88.54), H (5.39), N (6.07).

HRMS (C$_{51}$H$_{37}$N$_3$ [M]+): calculated; 691.88, found; 690.

Synthesis Example 10: Synthesis of Compound H-17

Compound H-17 (yield of 71.4%) was prepared in the same (or substantially the same) manner as in Synthesis Example 6, except that Int-8 was used instead of Int-7, and 3-bromo-9-phenyl-9H-carbazole was used instead of bromobenzene. Compound H-17 was identified by Elemental analysis and HRMS.

Elemental analysis (C$_{55}$H$_{38}$N$_2$): calculated; C (90.88), H (5.27), N (3.85).

HRMS (C$_{55}$H$_{38}$N$_2$ [M]+): calculated; 726.92, found; 725.

Synthesis Example 11: Synthesis of Compound H-18

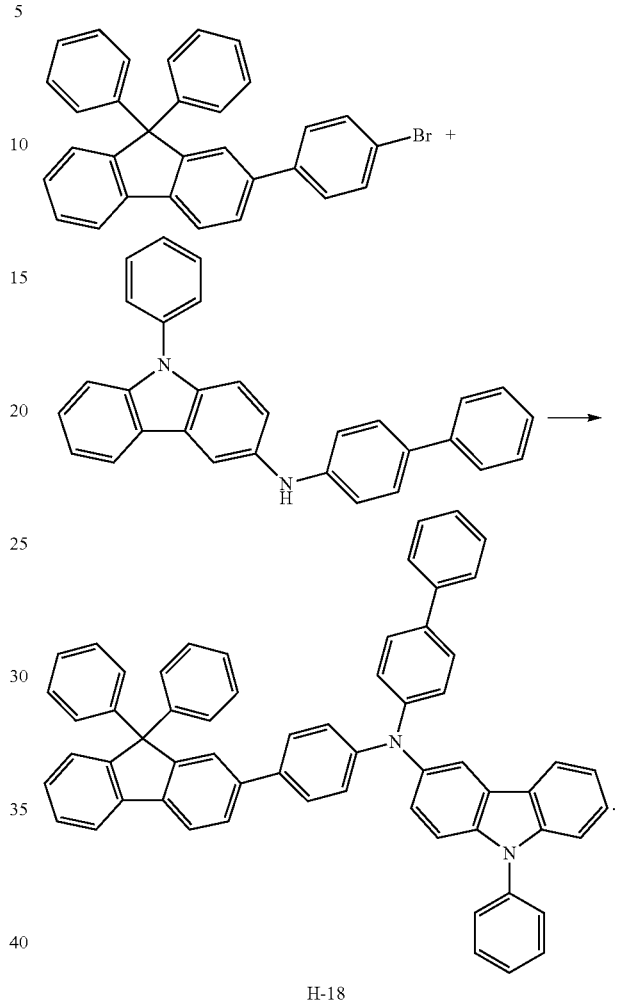

H-18

Compound H-18 (yield of 72%) was prepared in the same (or substantially the same) manner as in Synthesis Example 6, except that N-([1,1'-biphenyl]-4-yl)-9-phenyl-9H-carbazole-3-amine was used instead of Int-7, and 2-(4-bromophenyl)-9,9-diphenyl-9H-fluorene was used instead of bromobenzene. Compound H-18 was identified by Elemental analysis and HRMS.

Elemental analysis (C$_{61}$H$_{42}$N$_2$): calculated; C (91.24), H (5.27), N (3.49).

HRMS (C$_{61}$H$_{42}$N$_2$ [M]+): calculated; 803.02, found; 802.

Synthesis Example 12: Synthesis of Compound H-21

Compound H-21 (yield of 70.1%) was prepared in the same (or substantially the same) manner as in Synthesis Example 6, except that Int-8 was used instead of Int-7, and 3-(4-bromophenyl)-9-phenyl-9H-carbazole was used instead of bromobenzene. Compound H-21 was identified by Elemental analysis and HRMS.

Elemental analysis (C$_{61}$H$_{42}$N$_2$): calculated; C (91.24), H (5.27), N (3.49).

HRMS (C$_{61}$H$_{42}$N$_2$ [M]+): calculated; 803.02, found; 802.

Synthesis Example 13: Synthesis of Compound H-27

Compound H-27 (yield of 73%) was prepared in the same (or substantially the same) manner as in Synthesis Example 6, except that Int-8 was used instead of Int-7, and 3-(4'-bromo-[1,1'-biphenyl]-3-yl)-9-phenyl-9H-carbazole was used instead of bromobenzene. Compound H-27 was identified by Elemental analysis and HRMS.

Elemental analysis ($C_{67}H_{46}N_2$): calculated; C (91.54), H (5.27), N (3.19).

HRMS ($C_{67}H_{46}N_2$ [M]+): calculated; 879.12, found; 878.

Example 1

15 $\Omega/cm^2$ (500 Å) ITO glass substrate available from Corning Inc. (as anode) was cut to a size of 50 mm×50 mm×0.5 mm and then sonicated with isopropyl alcohol and pure water, each for 10 minutes, and then, exposed to ultraviolet rays for 10 minutes, and then to ozone. The result was mounted on a vacuum deposition apparatus.

Compound H-01 was vacuum-deposited on the ITO glass substrate to form a second layer having a thickness of 600 Å, and subsequently, Compound A1 was vacuum-deposited thereon to form a first layer having a thickness of 300 Å, thereby forming a hole transport region.

CBP and PD1 were co-deposited on the hole transport region at a weight ratio of 85:15 to form an emission layer having a thickness of 300 Å.

$Alq_3$ was deposited on the emission layer to form an electron transport layer having a thickness of 300 Å, and Al was deposited on the electron transport layer to form an Al electrode (as cathode) having a thickness of 1,200 Å, thereby completing the manufacture of an organic light-emitting device.

Example 2 to 12 and Comparative Examples 1 to 3

Organic light-emitting devices were manufactured in the same (or substantially the same) manner as in Example 1, except that compounds as shown in Table 1 were used in forming the first layer and the second layer.

TABLE 1

|  | second layer | first layer |
|---|---|---|
| Example 1 | H-01 | A1 |
| Example 2 | H-03 | A1 |
| Example 3 | H-06 | A1 |
| Example 4 | H-09 | A1 |
| Example 5 | H-17 | A1 |
| Example 6 | H-18 | A1 |
| Example 7 | H-21 | A1 |
| Example 8 | H-27 | A1 |
| Example 9 | H-01 | A14 |
| Example 10 | H-01 | A17 |
| Example 11 | H-01 | A22 |
| Example 12 | H-01 | A23 |
| Comparative Example 1 | 2-TNATA | NPB |
| Comparative Example 2 | 2-TNATA | A1 |
| Comparative Example 3 | H-01 | NPB |

Evaluation Example

The efficiency and lifespan (at a current density of 300 mA/cm²) of the organic light-emitting devices of Examples 1 to 12 and Comparative Examples 1 to 3 were evaluated by using PR650 Source Measurement Unit (a product of PhotoResearch, Inc.). Results thereof are shown in Table 2. Herein, lifespan refers to a period of time that lapsed until the luminance of the organic light-emitting device was reduced to 95% of the initial luminance thereof:

TABLE 2

|  | Second layer | First layer | Efficiency (cd/A) | Lifespan (time) |
|---|---|---|---|---|
| Example 1 | H-01 | A1 | 47.3 | 970 |
| Example 2 | H-03 | A1 | 44.1 | 921 |
| Example 3 | H-06 | A1 | 45 | 943 |
| Example 4 | H-09 | A1 | 49.5 | 921 |
| Example 5 | H-17 | A1 | 50.2 | 991 |
| Example 6 | H-18 | A1 | 41.5 | 937 |
| Example 7 | H-21 | A1 | 46.8 | 897 |
| Example 8 | H-27 | A1 | 43.9 | 911 |
| Example 9 | H-01 | A14 | 46.1 | 956 |
| Example 10 | H-01 | A17 | 45.7 | 971 |
| Example 11 | H-01 | A22 | 48.2 | 923 |
| Example 12 | H-01 | A23 | 49.6 | 970 |
| Comparative Example 1 | 2-TNATA | NPB | 39.8 | 456 |
| Comparative Example 2 | 2-TNATA | A1 | 40.3 | 731 |
| Comparative Example 3 | H-01 | NPB | 39.6 | 689 |

As shown in Table 2, the efficiency and lifespan of the organic light-emitting devices of Examples 1 to 12 were higher than those of the organic light-emitting devices of Comparative Examples 1 to 3.

An organic light-emitting device according to embodiments of the present inventive concept may have high efficiency and long lifespan.

It will be understood that if a substituent that appears in the present disclosure is not expressly defined above, the definition of the substituent is consistent with a general definition thereof, unless stated otherwise.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:
a first electrode;
a second electrode; and
an organic layer comprising an emission layer and a hole transport region between the first electrode and the second electrode,
wherein the hole transport region is between the first electrode and the emission layer, and
the hole transport region comprises a first compound selected from Compounds A1 to A5, A7 to A17, A19 to A28, A30 to A35, A37 to A46, and A48 to A52, and a second compound represented by Formula 2:

A1

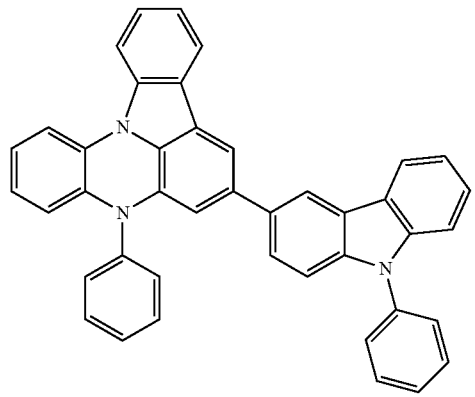

A2

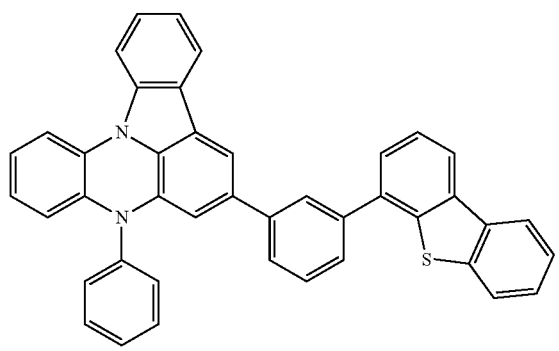

A3

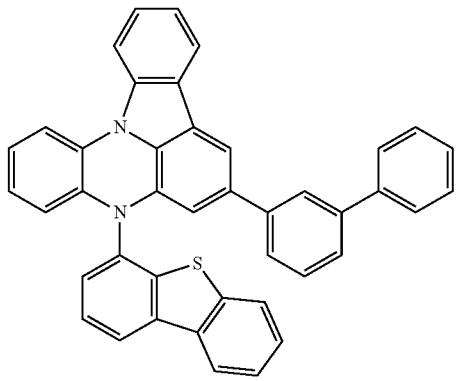

A4

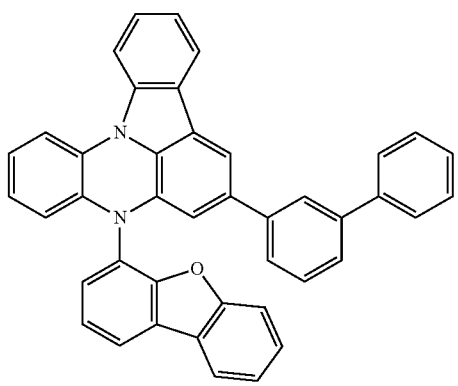

A5

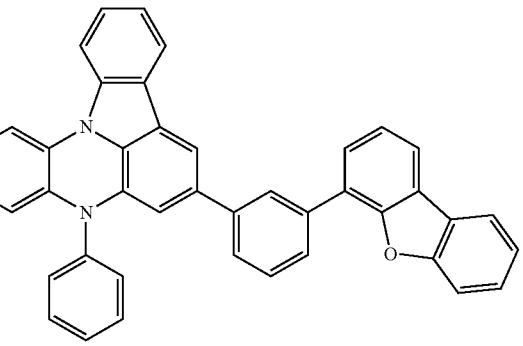

A7

A8
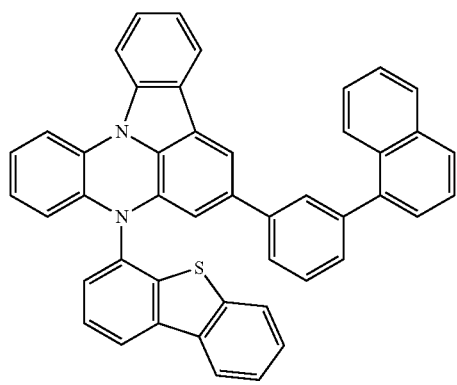
A9
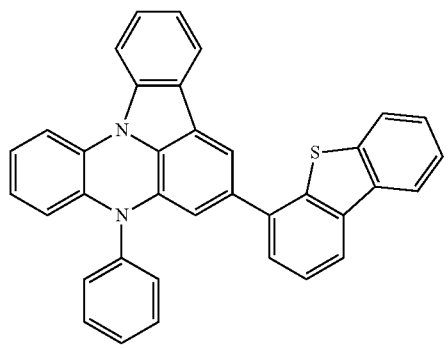
A10
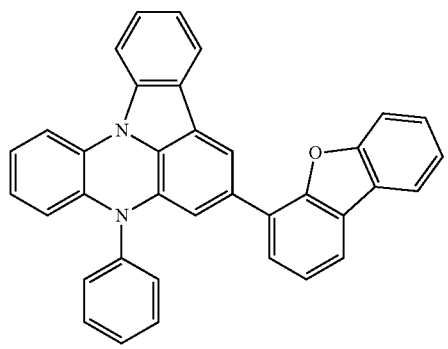
A11
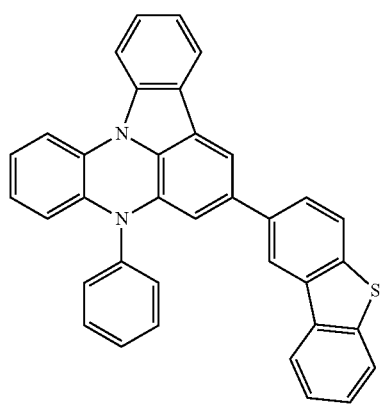
A12
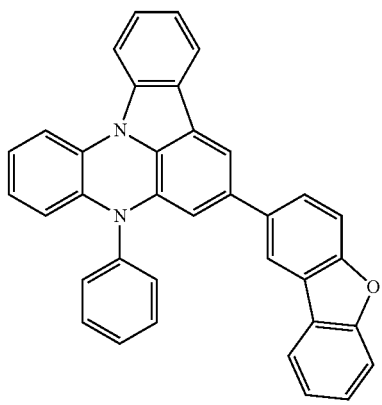
A13
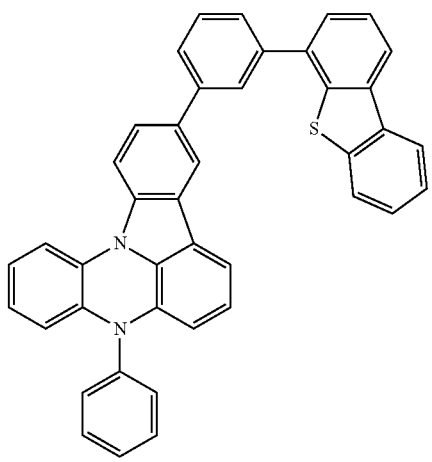
A14
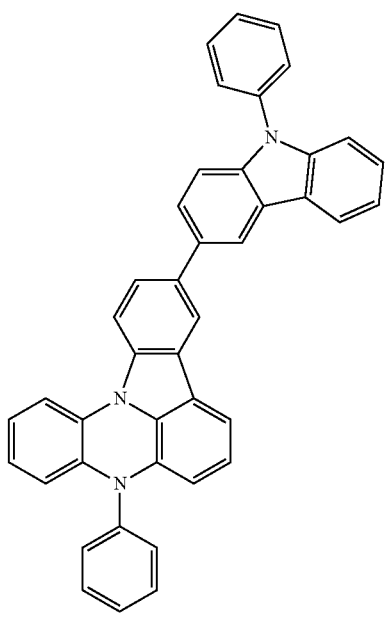

A15
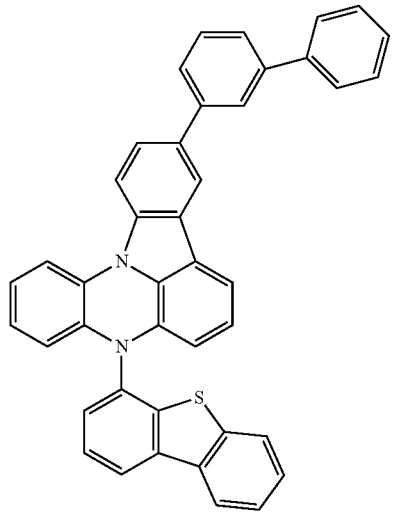
A16
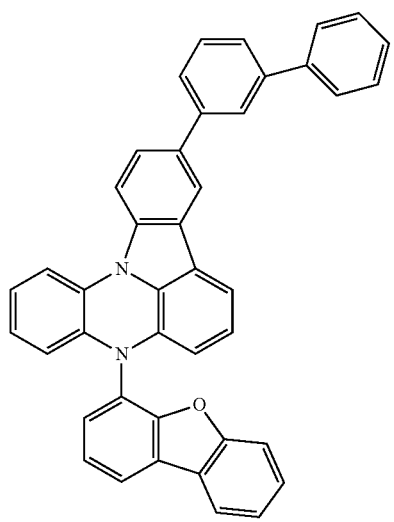
A17
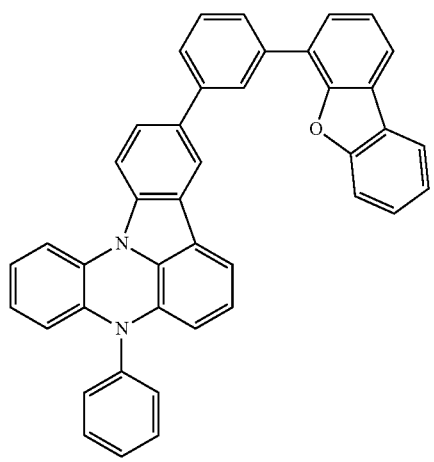
A19
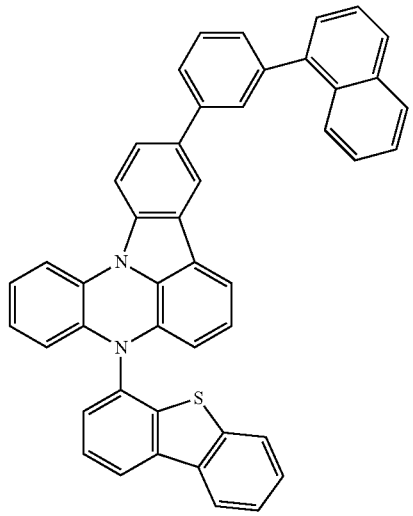
A20
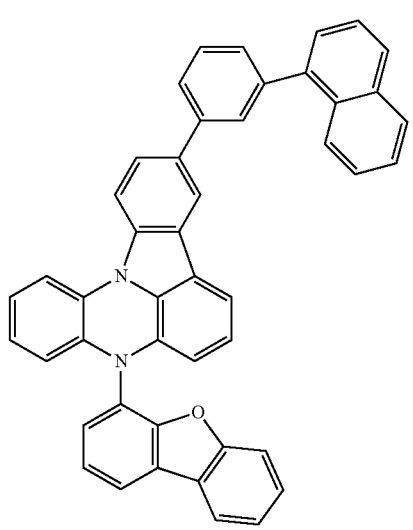
A21
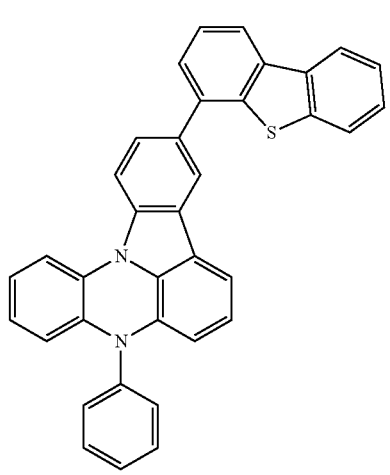

-continued
A22
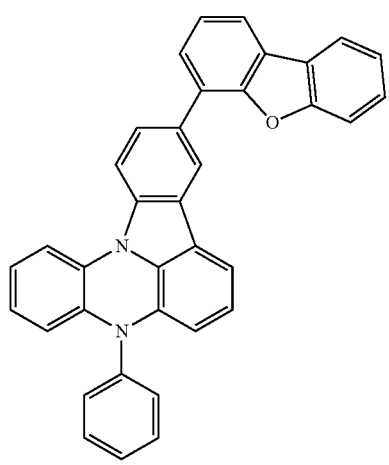
A23
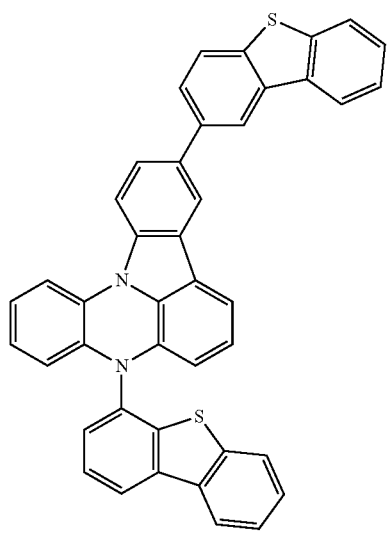
A24
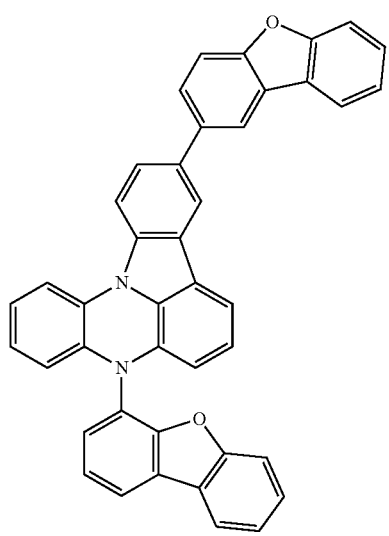
-continued
A25
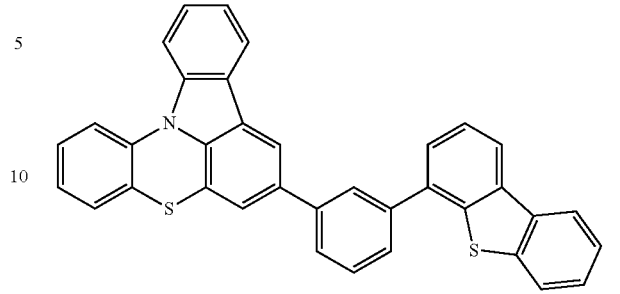
A26
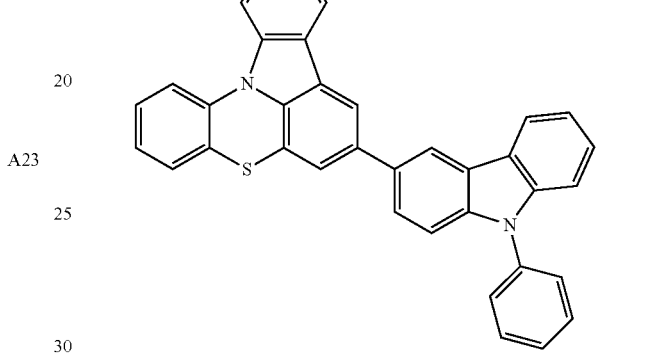
A27
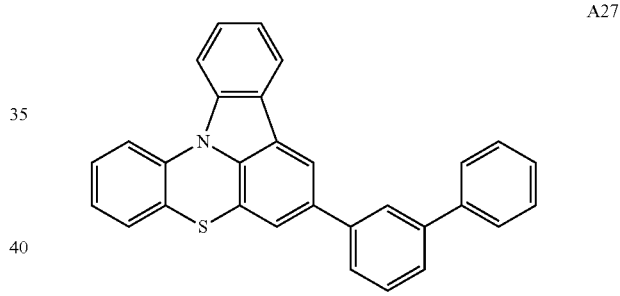
A28
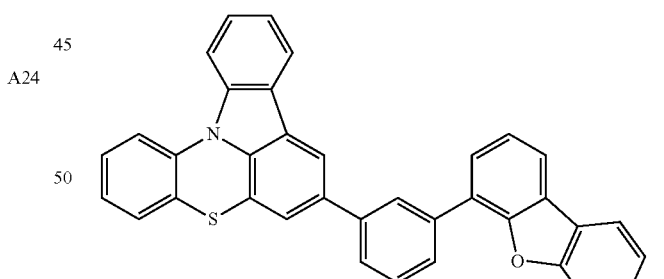
A30
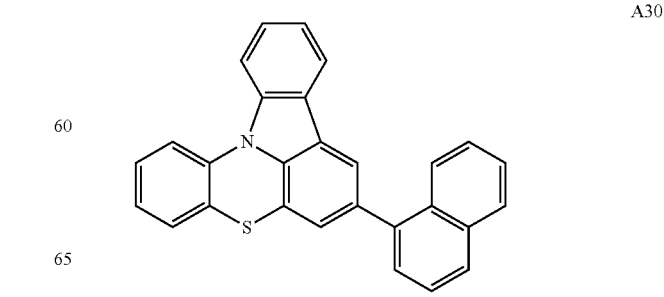

A31
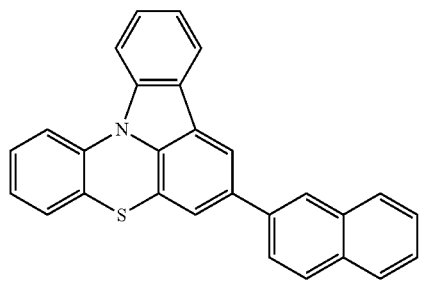
A32
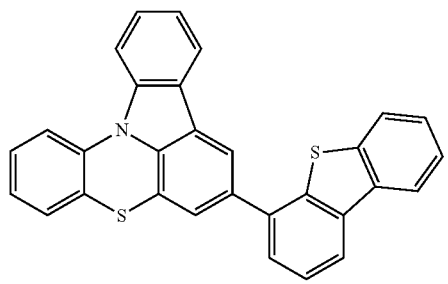
A33
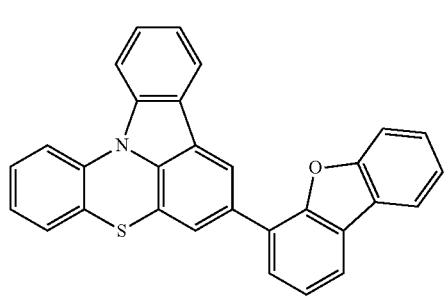
A34
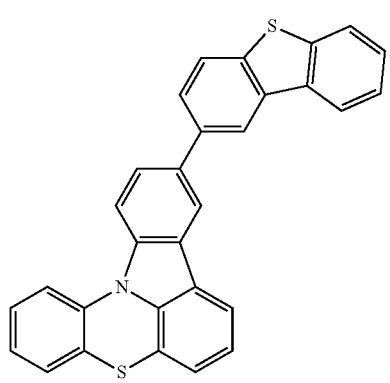
A35
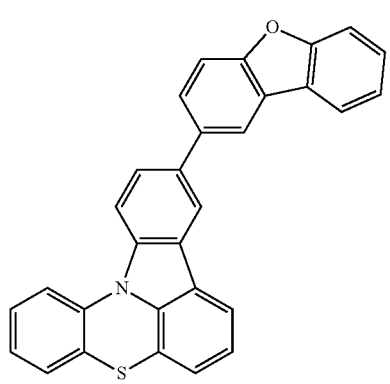
A37
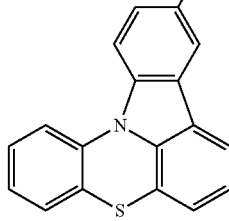
A38
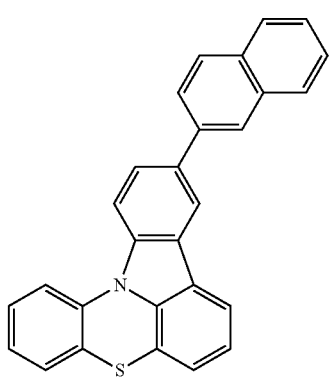
A39
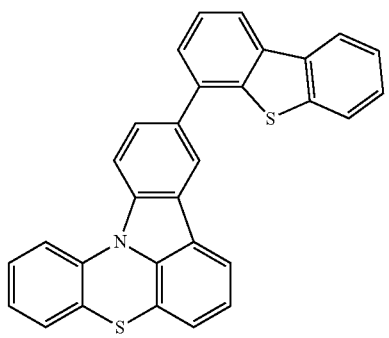
A40
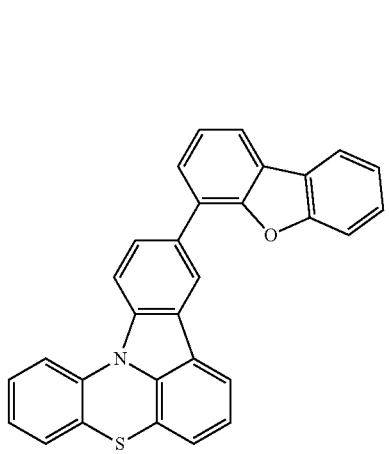

-continued
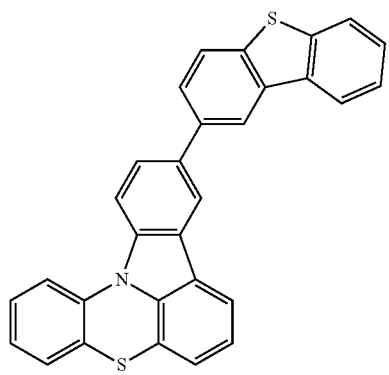
A41
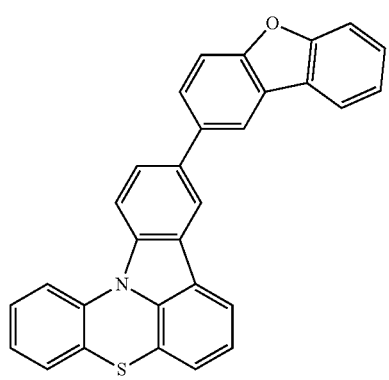
A42
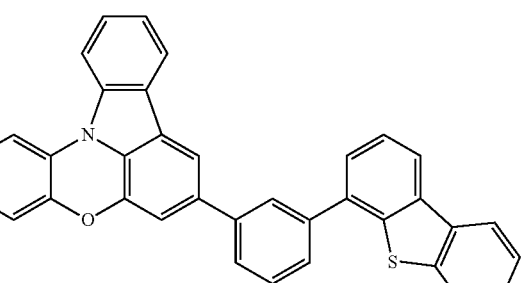
A43
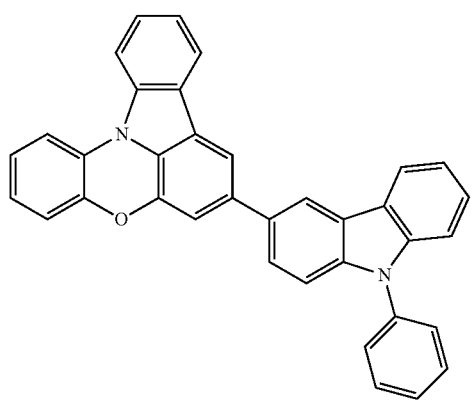
A44
-continued
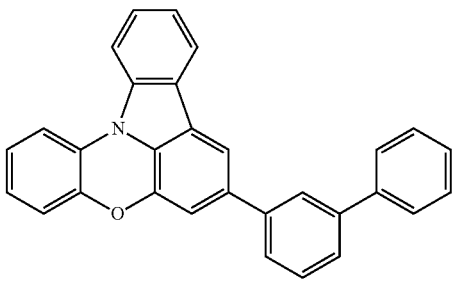
A45
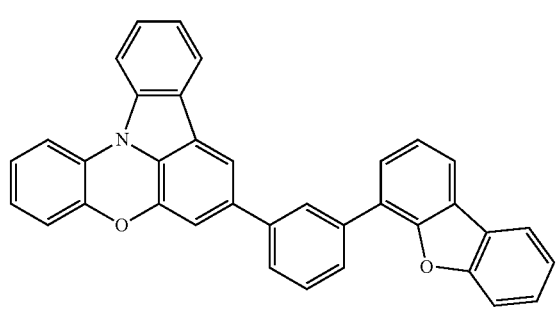
A46
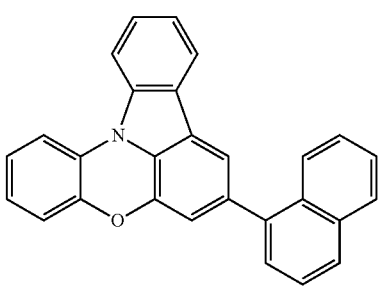
A48
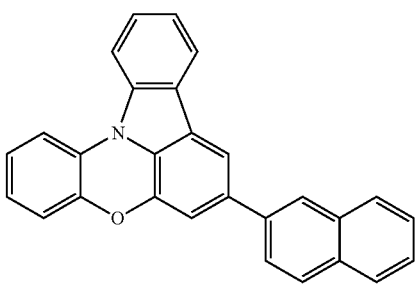
A49
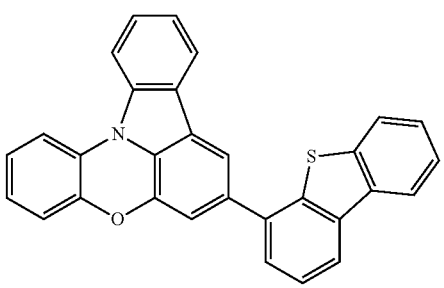
A50

-continued

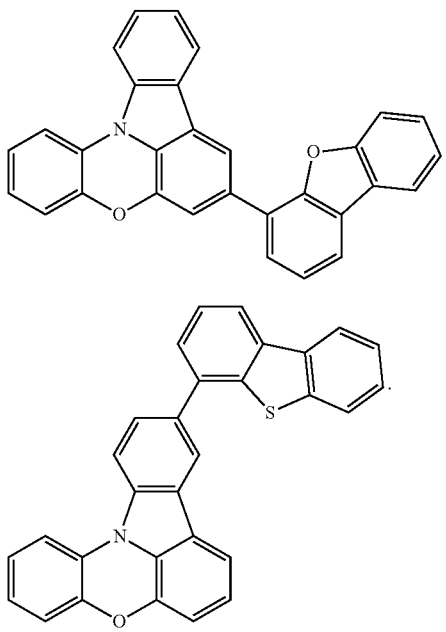

A51

A52

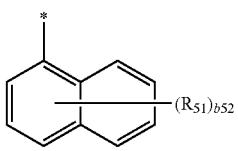
Formula 2 wherein, in Formula 2, $X_{21}$ is selected from B, N, and P;

$L_{21}$ to $L_{23}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a23 are each independently selected from 0, 1, 2, 3, 4, and 5;

$R_{21}$ to $R_{23}$ are each independently selected from groups represented by Formulae 5-1 to 5-7, and 5-9 to 5-12:

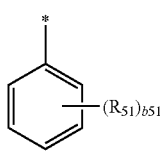
5-1

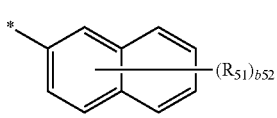
5-2

5-3

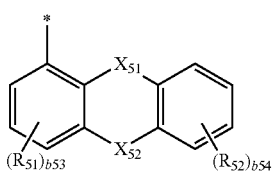
5-4

5-5

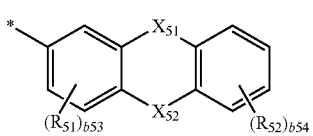
5-6

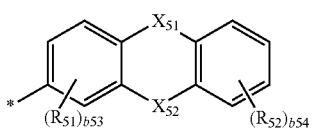
5-7

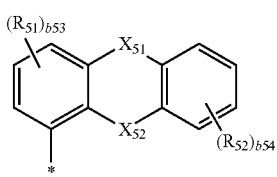

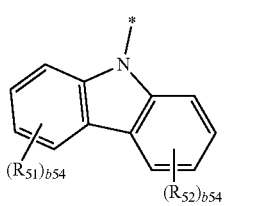
5-8

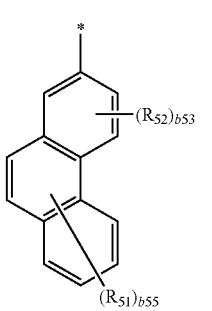
5-9

-continued 5-10
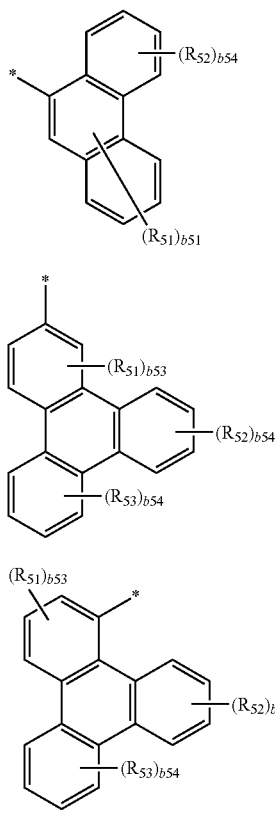

5-11

5-12 wherein, in Formulae 5-1 to 5-7, and 5-9 to 5-12,
$X_{51}$ is selected from a single bond, $N(R_{54})$, $C(R_{54})(R_{55})$, O, and S;
$X_{52}$ is selected from $N(R_{56})$, $C(R_{56})(R_{57})$, O, and S;
$R_{51}$ to $R_{57}$ are each independently selected from:
hydrogen, deuterium, a cyano group, a $C_1$-$C_{20}$ alkyl group, a phenyl group, a naphthyl group, and a fluorenyl group, and $R_{54}$ and $R_{55}$ are optionally combined with each other to form a ring;
b51 is selected from 1, 2, 3, 4, and 5;
b52 is selected from 1, 2, 3, 4, 5, 6, and 7;
b53 is selected from 1, 2, and 3;
b54 is selected from 1, 2, 3, and 4;
b55 is selected from 1, 2, 3, 4, 5, and 6; and
* indicates a binding site to a neighboring atom.

2. The organic light-emitting device of claim 1, wherein the hole transport region comprises a first layer and a second layer;
the second layer is between the first layer and the first electrode;
the first layer comprises the first compound, and
the second layer comprises the second compound.

3. The organic light-emitting device of claim 1, wherein $L_{21}$ to $L_{23}$ are each independently a group represented by Formulae 3-1 to 3-19:

3-1
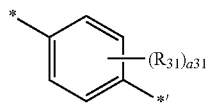

3-2
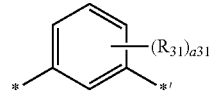

3-3
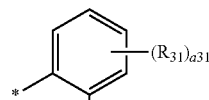

3-4
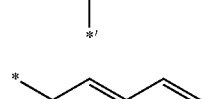

3-5
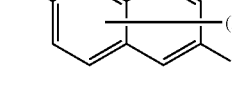

3-6
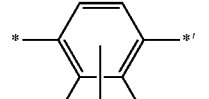

3-7
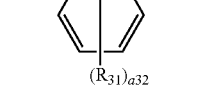

3-8
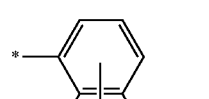

3-9
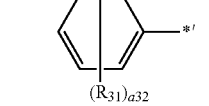

3-10
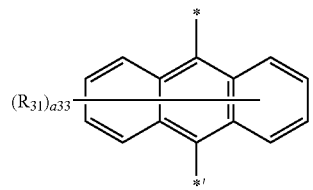

3-11
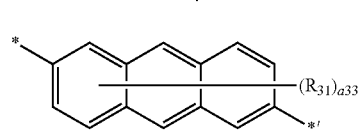

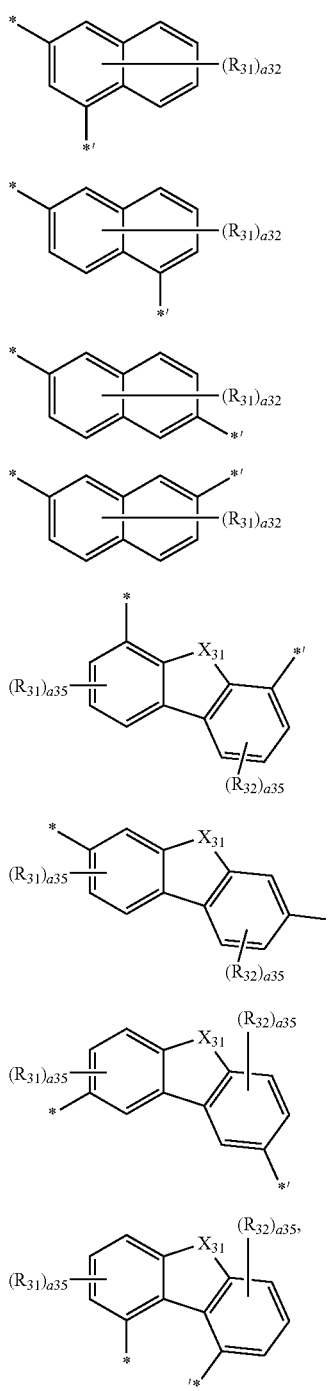

wherein, in Formulae 3-1 to 3-19,
$X_{31}$ is selected from O, S, and $C(R_{33})(R_{34})$;
$R_{31}$ to $R_{34}$ are each independently selected from hydrogen, deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 is selected from 1, 2, 3, and 4;
a32 is selected from 1, 2, 3, 4, 5, and 6;
a33 is selected from 1, 2, 3, 4, 5, 6, 7, and 8;
a34 is selected from 1, 2, 3, 4, and 5;
a35 is selected from 1, 2, and 3; and
* and *' are each independently a binding site to a neighboring atom.

4. The organic light-emitting device of claim 1, wherein $(L_{21})_{a21}$, $(L_{22})_{a22}$, and $(L_{23})_{a23}$ are each independently a group represented by any one of Formulae 4-1 to 4-14:

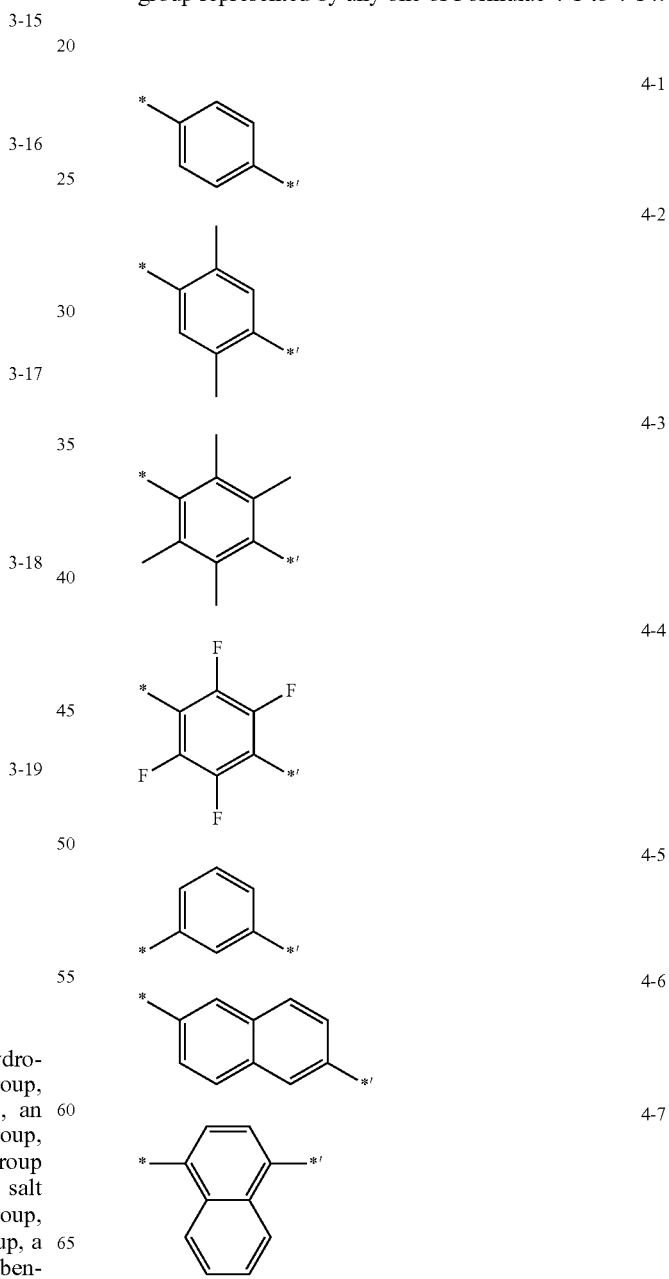

-continued 4-8

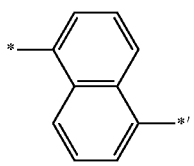

4-9

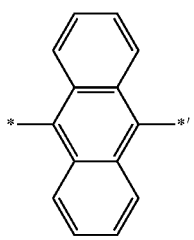

4-10

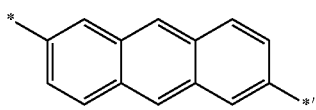

4-11

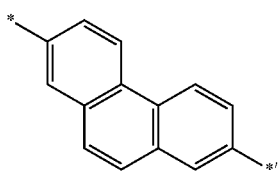

4-12

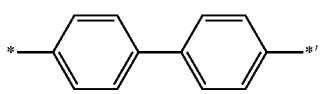

4-13

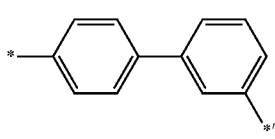

4-14

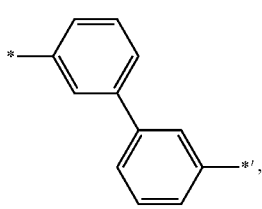

wherein, in Formulae 4-1 to 4-14,

* and *' are each independently a binding site to a neighboring atom.

5. The organic light-emitting device of claim 1, wherein the second compound represented by Formula 2 is represented by Formula 2-1:

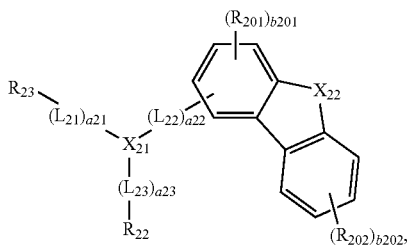

Formula 2-1 wherein, in Formula 2-1,
$X_{21}$, $L_{21}$ to $L_{23}$, a21 to a23, $R_{22}$, and $R_{23}$ are the same as described in connection with Formula 2;
$X_{22}$ is selected from $N(R_{203})$, $C(R_{203})(R_{204})$, O, and S;
$R_{201}$ to $R_{204}$ are each independently selected from hydrogen, deuterium, a cyano group, a $C_1$-$C_{20}$ alkyl group, a phenyl group, a naphthyl group, and a fluorenyl group;
b201 is selected from 1, 2, and 3; and
b202 is selected from 1, 2, 3, and 4.

6. The organic light-emitting device of claim 1, wherein the second compound represented by Formula 2 is represented by Formula 2-11:

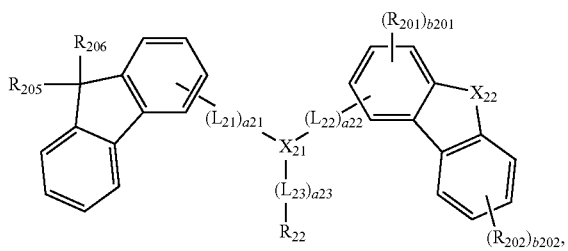

Formula 2-11 wherein, in Formula 2-11,
$X_{21}$, $L_{21}$ to $L_{23}$, a21 to a23, and $R_{22}$ are the same as described in connection with Formula 2;
$X_{22}$ is selected from $N(R_{203})$, O, and S;
$R_{201}$ to $R_{203}$, $R_{205}$, and $R_{206}$ are each independently selected hydrogen, deuterium, a cyano group, a $C_1$-$C_{20}$ alkyl group, a phenyl group, a naphthyl group, and a fluorenyl group, and $R_{205}$ and $R_{206}$ are optionally combined with each other to form a ring;
b201 is selected from 1, 2, and 3; and
b202 is selected from 1, 2, 3, and 4.

7. The organic light-emitting device of claim 1, wherein the second compound represented by Formula 2 is represented by any one of Formulae 2-21 to 2-36:

2-21

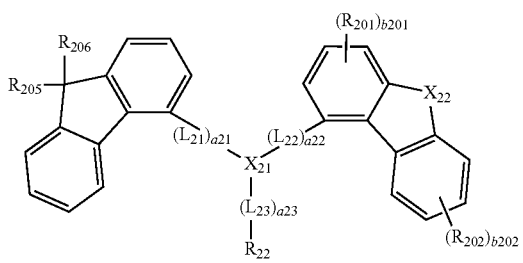

2-22
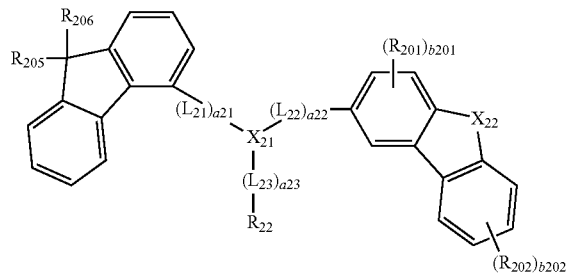
2-23
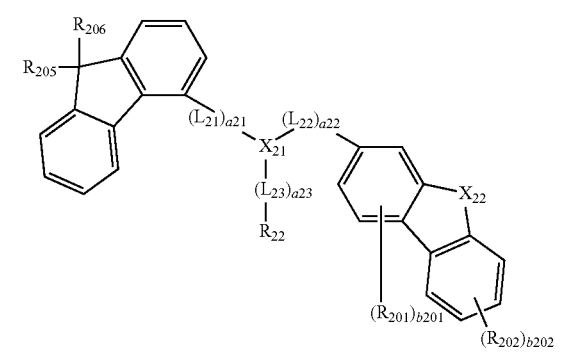
2-24
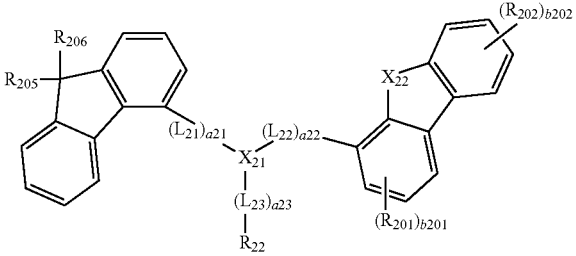
2-25
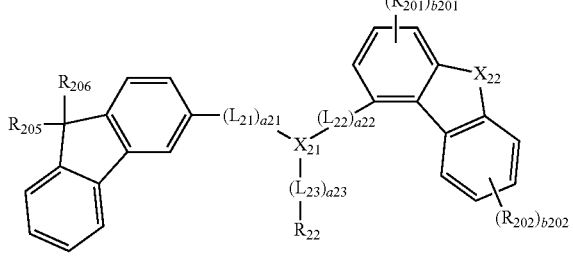
2-26
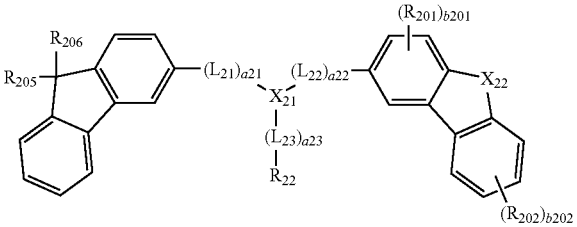
2-27
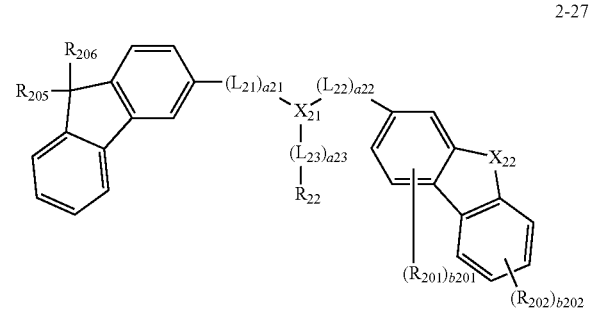
2-28
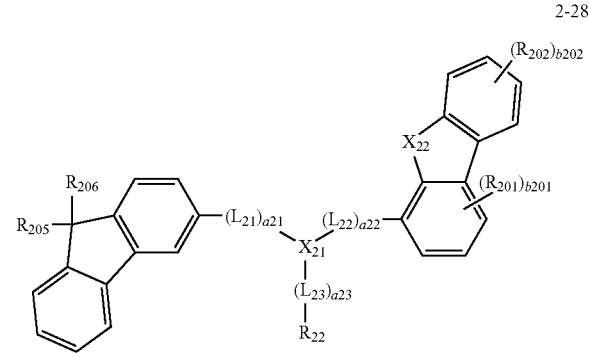
2-29
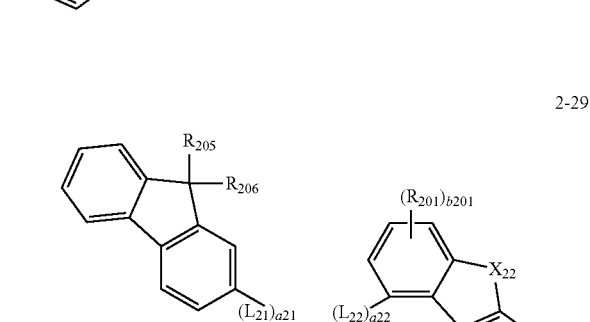
2-30
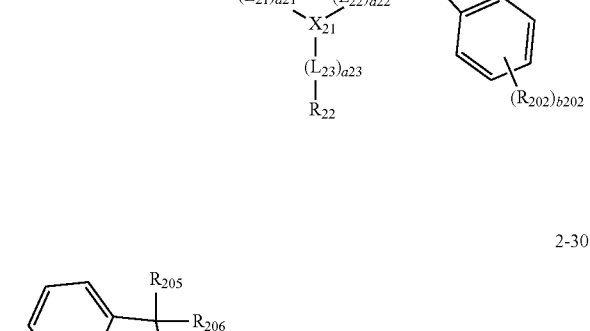

2-31

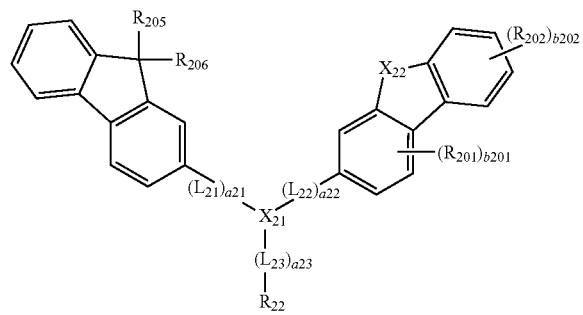

2-32

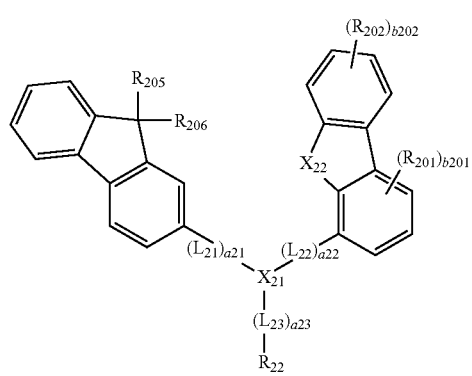

2-33

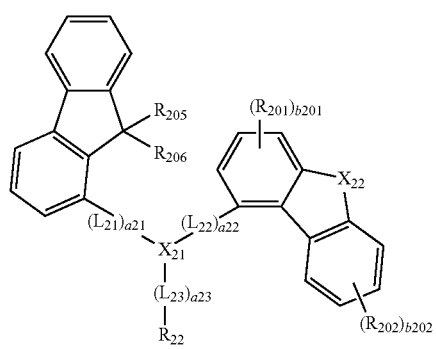

2-34

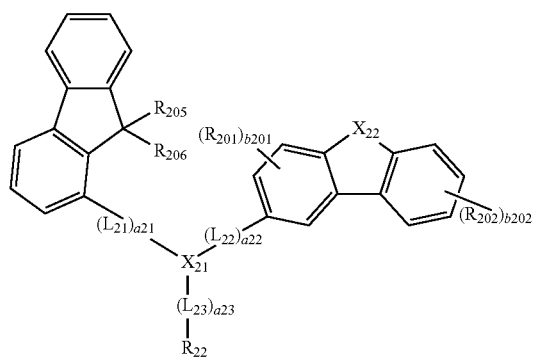

2-35

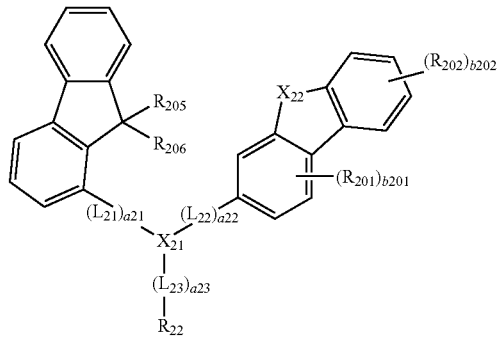

2-36

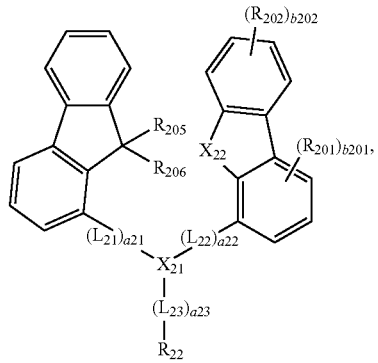

wherein, in Formulae 2-21 to 2-36, $X_{21}$, $L_{21}$ to $L_{23}$, a21 to a23, and $R_{22}$ are the same as described in connection with Formula 2;

$X_{22}$ is selected from $N(R_{203})$, O, and S;

$R_{201}$ to $R_{203}$, $R_{205}$, and $R_{206}$ are each independently selected from hydrogen, deuterium, a cyano group, a $C_1$-$C_{20}$ alkyl group, a phenyl group, a naphthyl group, and a fluorenyl group, and $R_{205}$ and $R_{206}$ are optionally combined with each other to form a ring;

b201 is selected from 1, 2, and 3; and b202 is selected from 1, 2, 3, and 4.

8. The organic light-emitting device of claim 1, wherein the second compound represented by Formula 2 is represented by any one of Formulae 2-41 to 2-44:

1-1

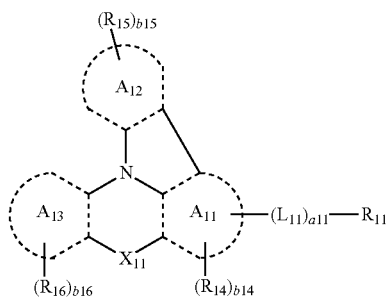

-continued 1-2

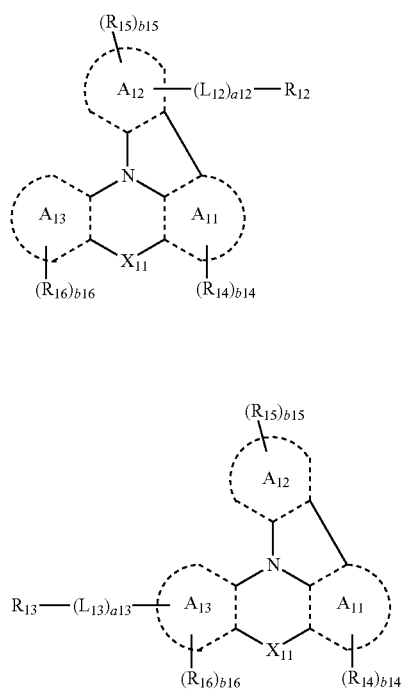

1-3 wherein, in Formulae 2-41 to 2-44, $X_{21}$, $L_{21}$, $L_{23}$, a21, a23, and $R_{22}$ are the same as described in Formula 2;

$X_{22}$ is selected from $N(R_{203})$, O, and S;

$R_{201}$ to $R_{203}$, $R_{205}$, and $R_{206}$ are each independently selected from hydrogen, deuterium, a cyano group, a $C_1$-$C_{20}$ alkyl group, a phenyl group, a naphthyl group, and a fluorenyl group, and $R_{205}$ and $R_{206}$ are optionally combined with each other to form a ring;

b201 is selected from 1, 2, and 3; and b202 is selected from 1, 2, 3, and 4.

9. The organic light-emitting device of claim 1, wherein the second compound represented by Formula 2 is selected from Compounds H-01 to H-15 and H-17 to H-36:

H-01

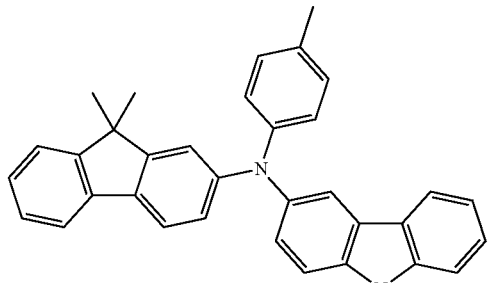

H-02

H-03

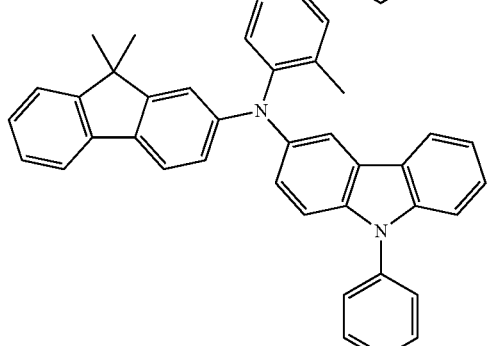

H-04

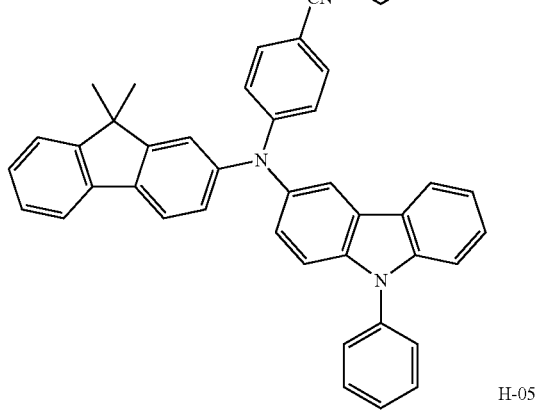

H-05

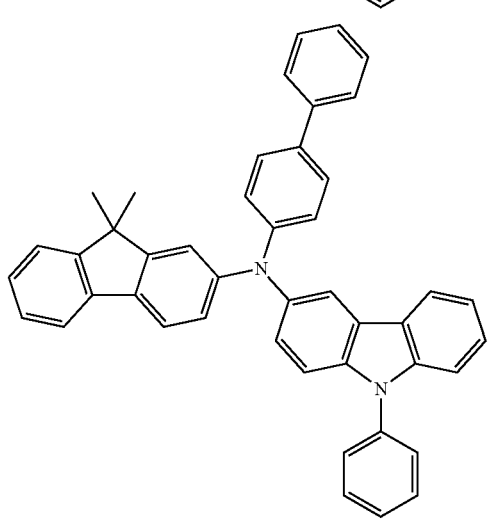

H-06
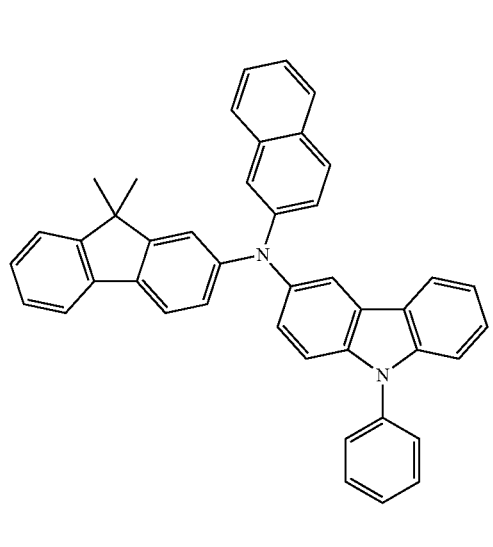
H-07
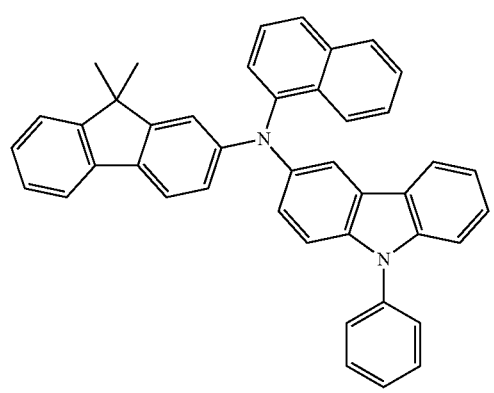
H-08
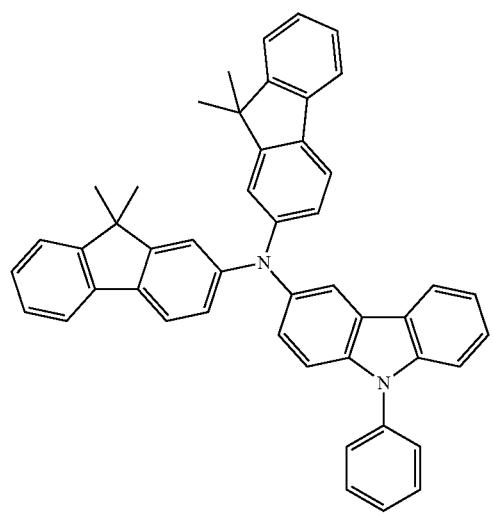
H-09
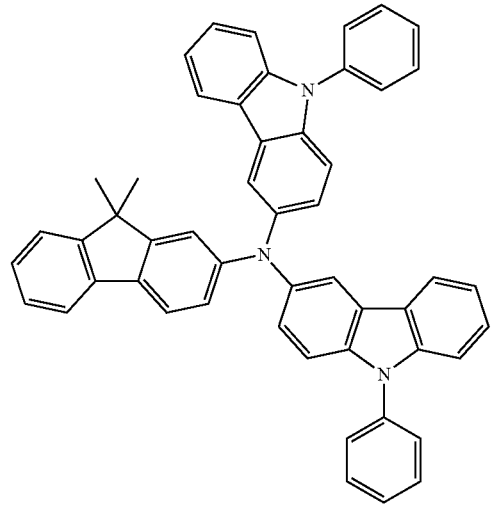
H-10
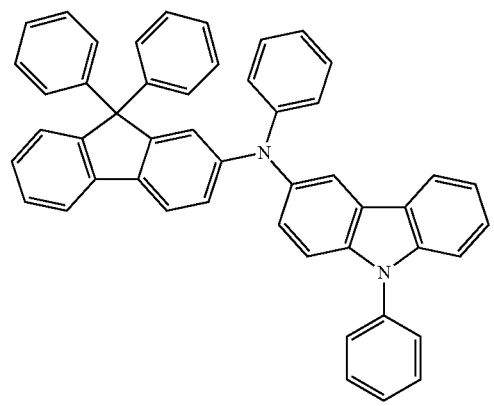
H-11
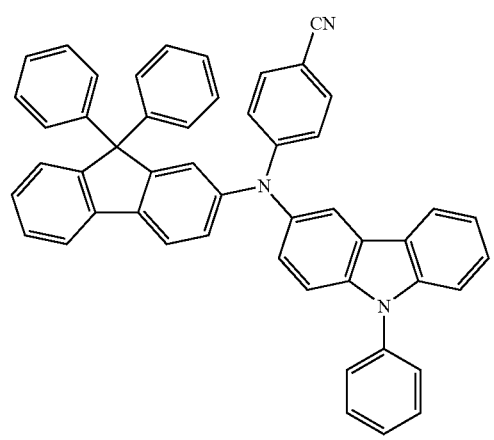

H-12
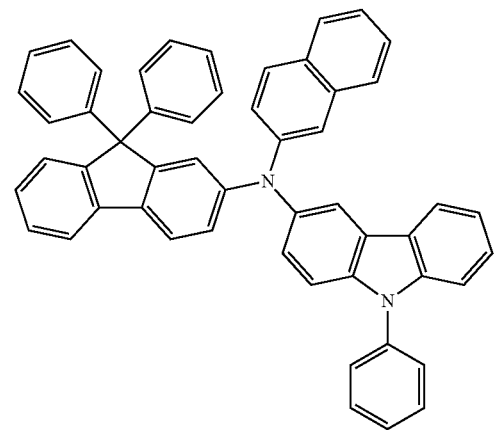
H-15
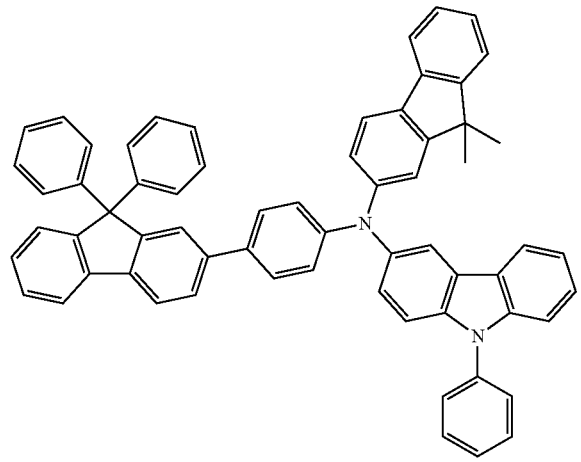
H-13
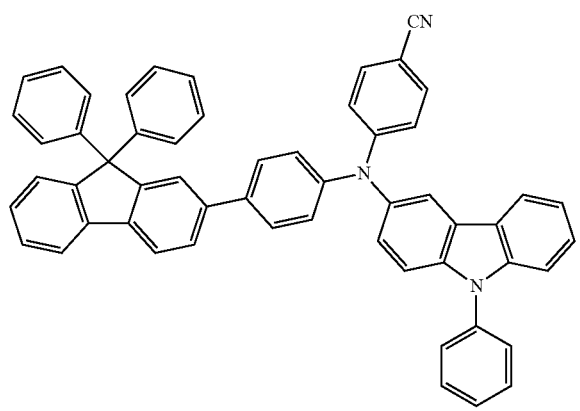
H-17
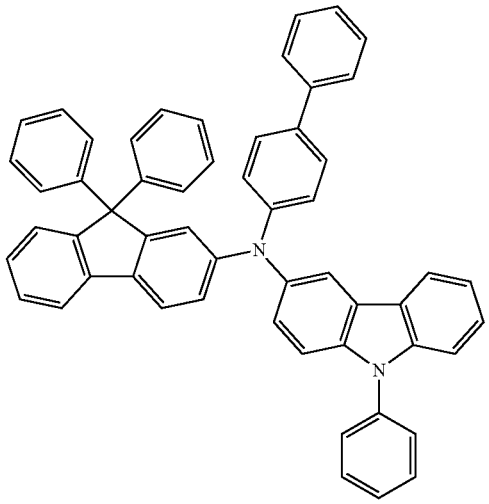
H-14
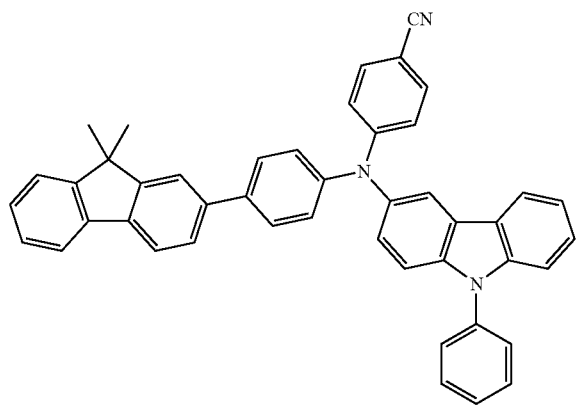
H-18
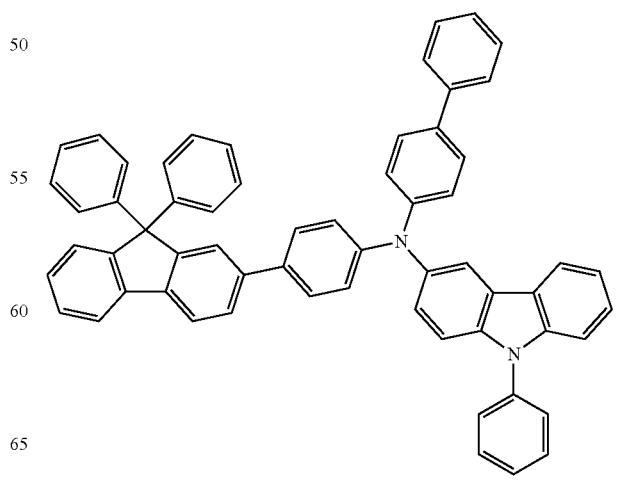

H-19
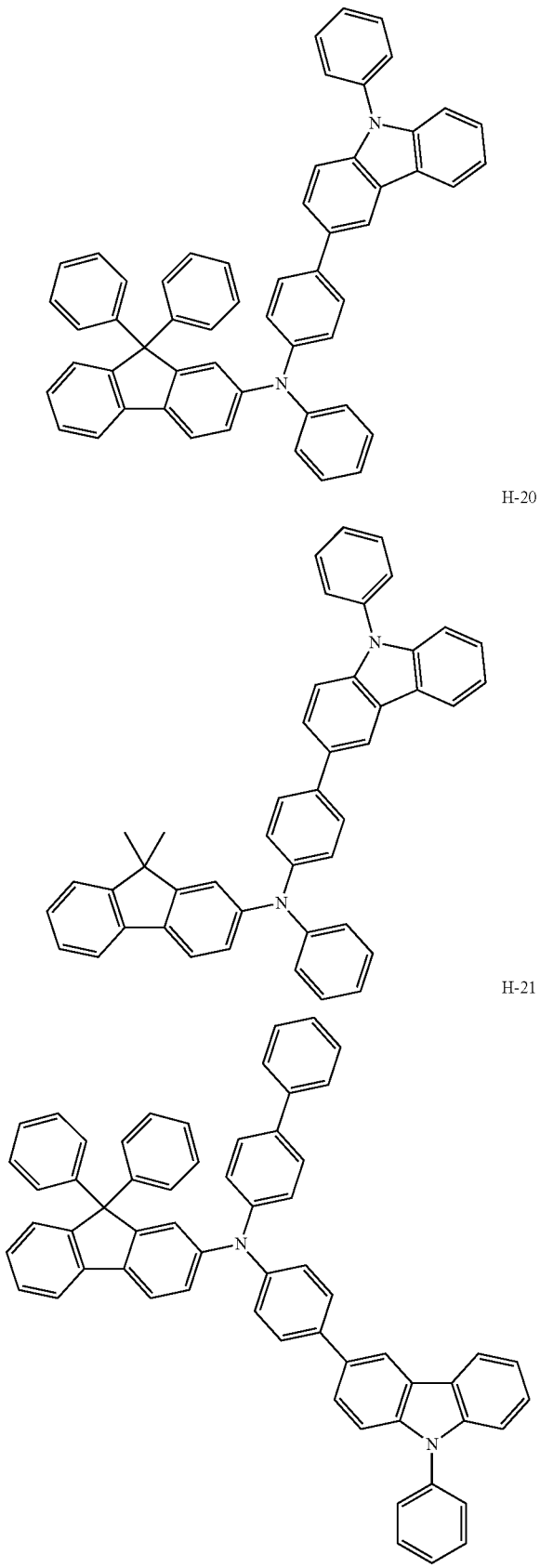
H-20
H-21
H-22
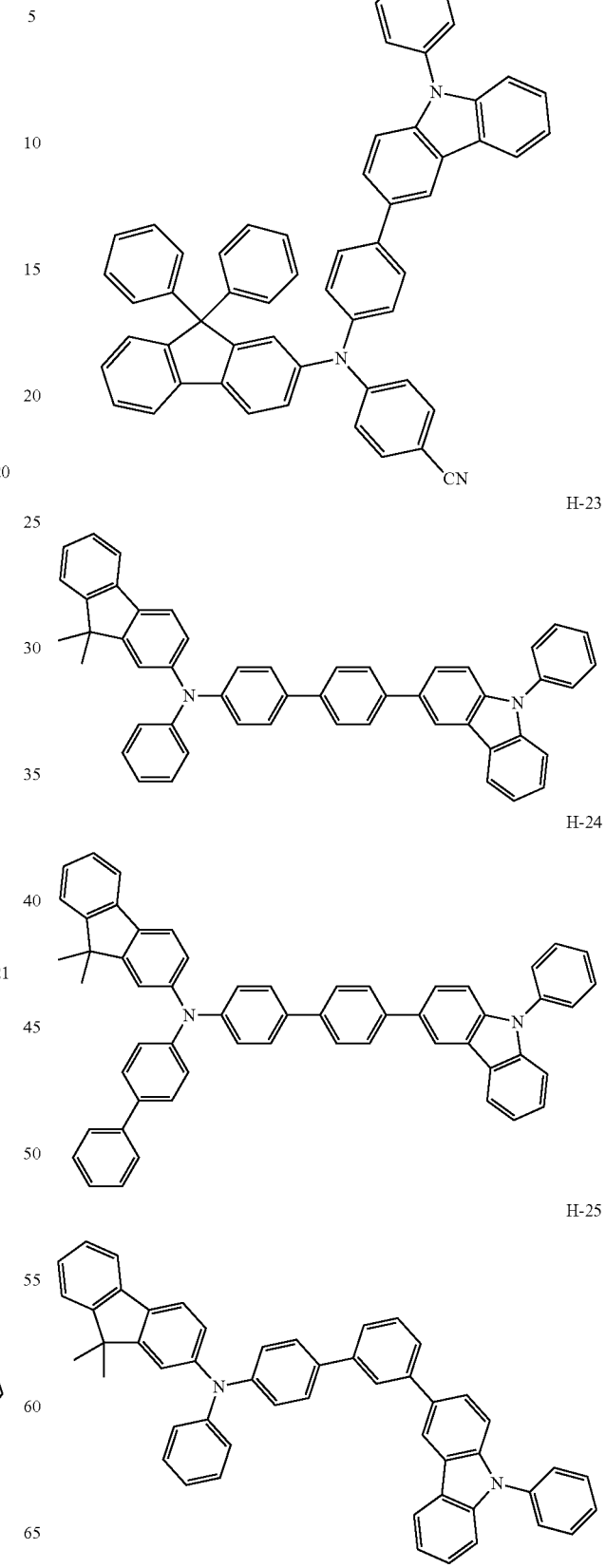
H-23
H-24
H-25

-continued
H-26
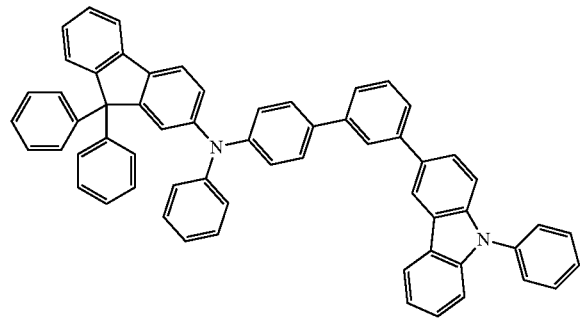
H-30
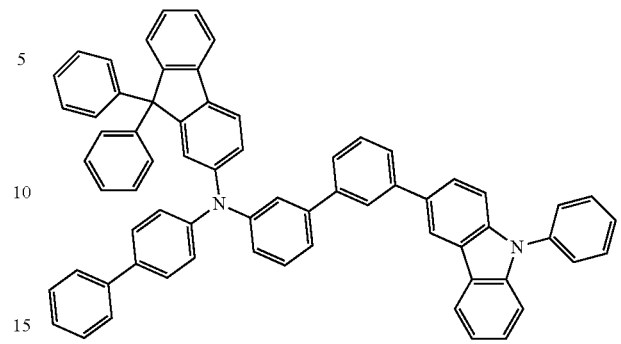
H-27
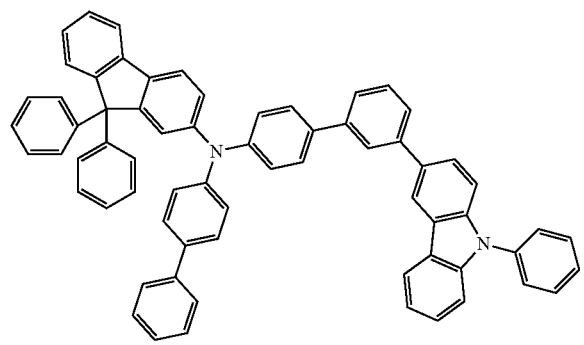
H-31
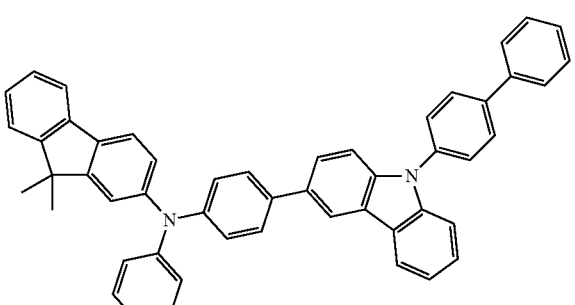
H-28
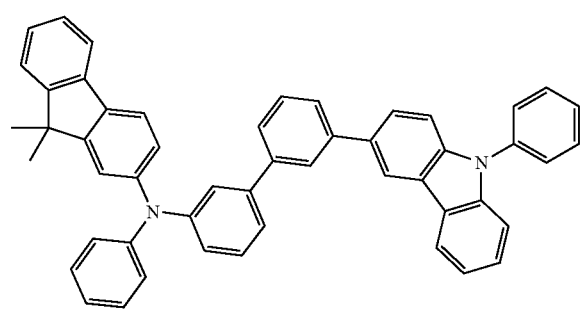
H-32
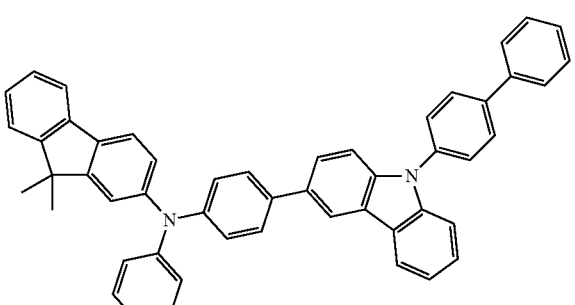
H-29
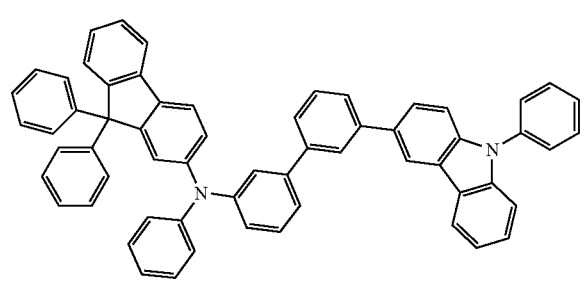
H-33
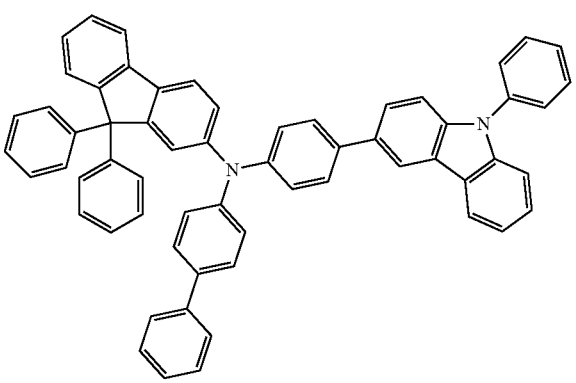

-continued

H-34
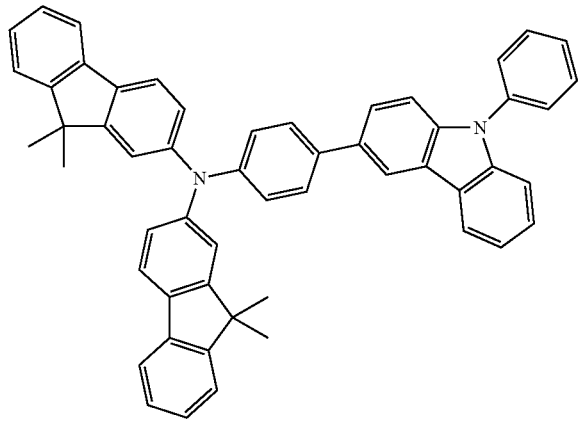

H-35
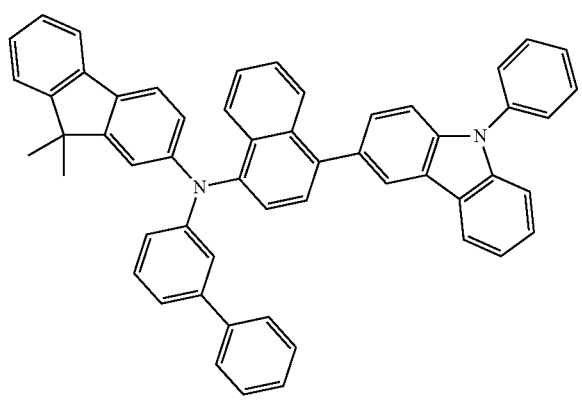

H-36
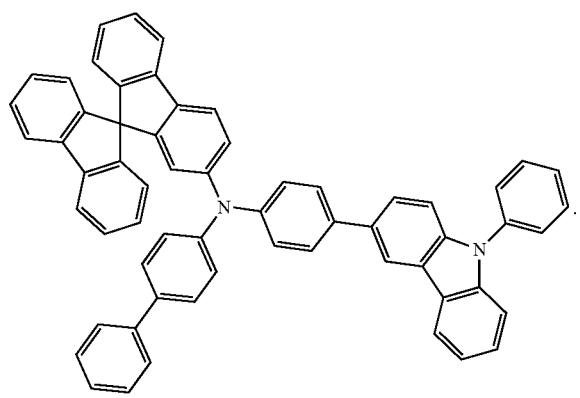

10. An organic light-emitting device comprising:
a substrate divided according to a first sub-pixel region, a second sub-pixel region, and a third sub-pixel region;
a plurality of first electrodes in the first sub-pixel region, the second sub-pixel region, and the third sub-pixel region of the substrate;
a second electrode facing the plurality of first electrodes; and
an organic layer between the second electrode and the plurality of first electrodes, the organic layer comprising an emission layer and a hole transport region;
wherein the hole transport region is between the emission layer and the plurality of first electrodes; and
the hole transport region comprises a first compound selected from Compounds A1 to A5, A7 to A17, A19 to A28, A30 to A35, A37 to A46, and A48 to A52, and a second compound represented by Formula 2:

A1
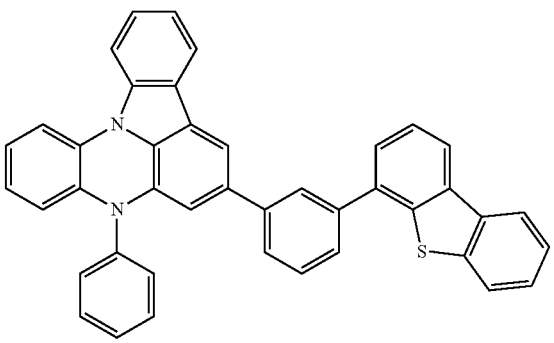

A2
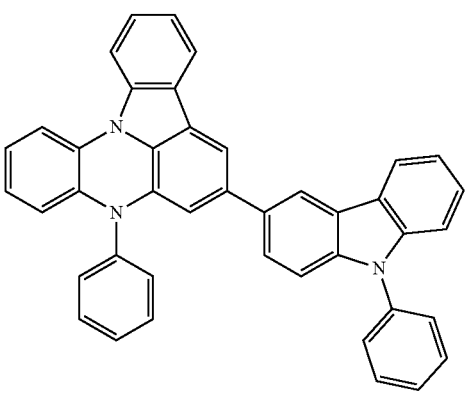

A3
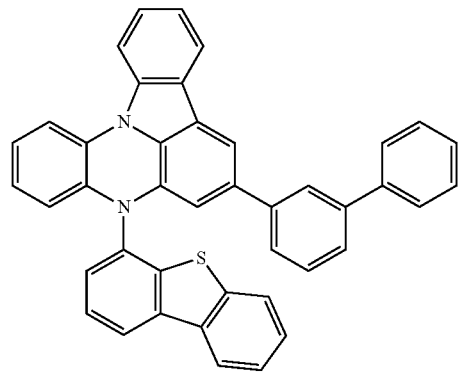

A4
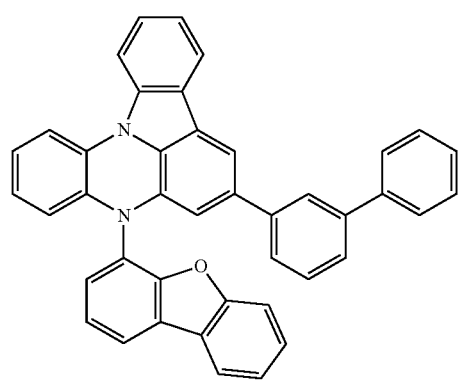

-continued
A5
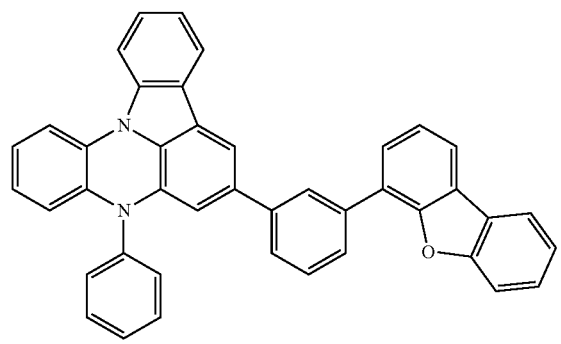
A7
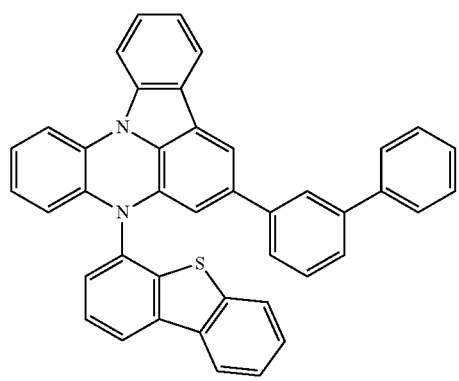
A8
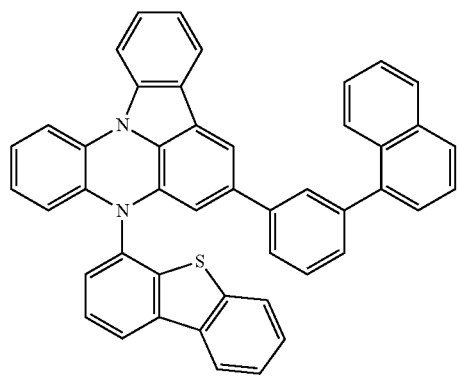
A9
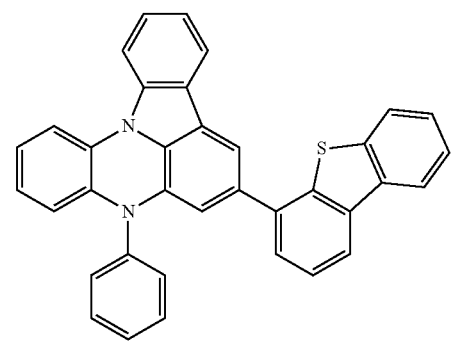
-continued
A10
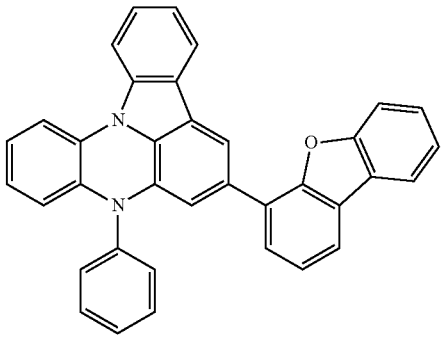
A11
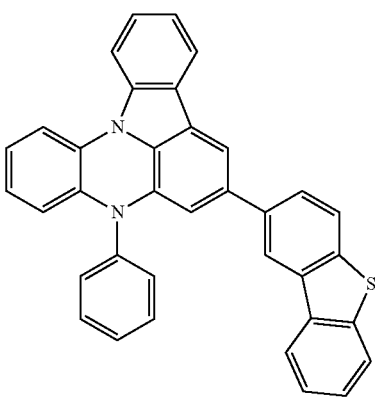
A12
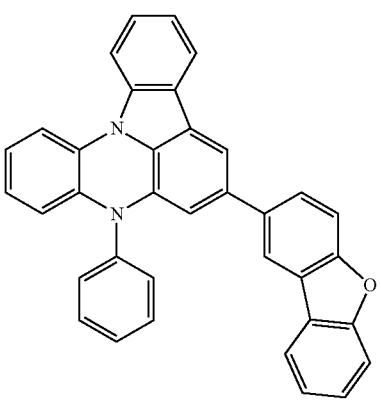
A13
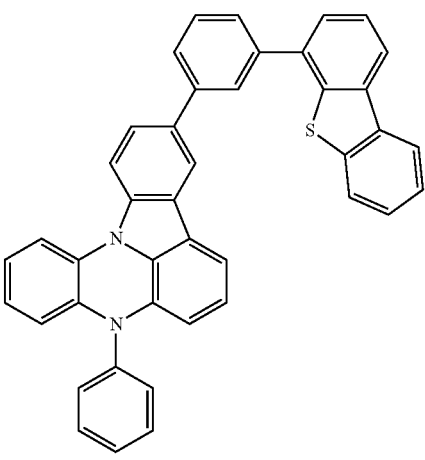

A14
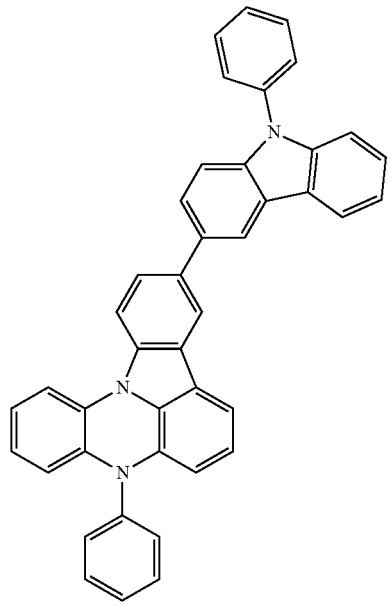
A15
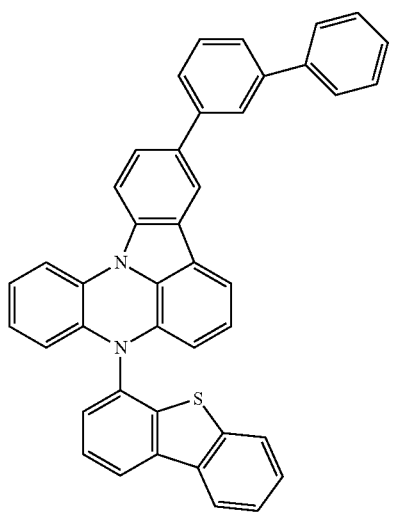
A16
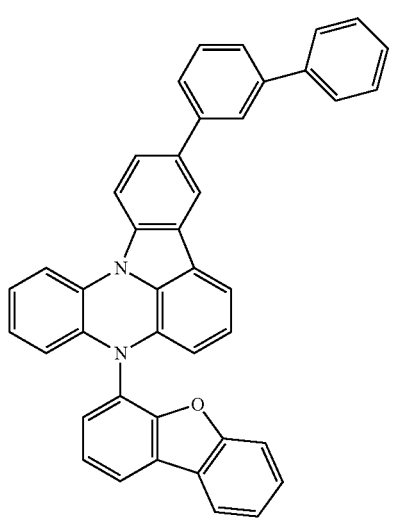
A17
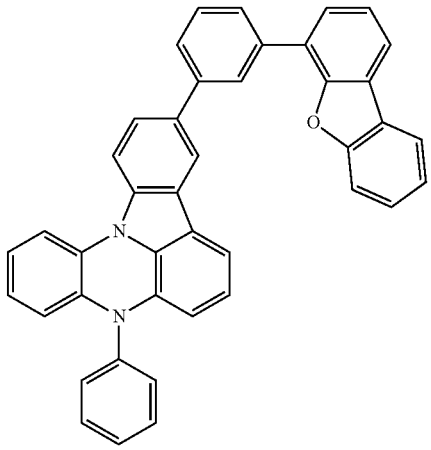
A19
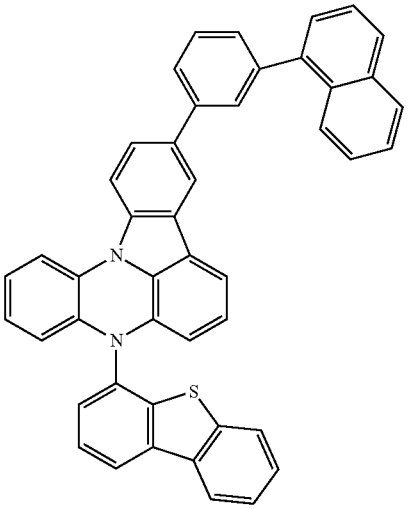
A20
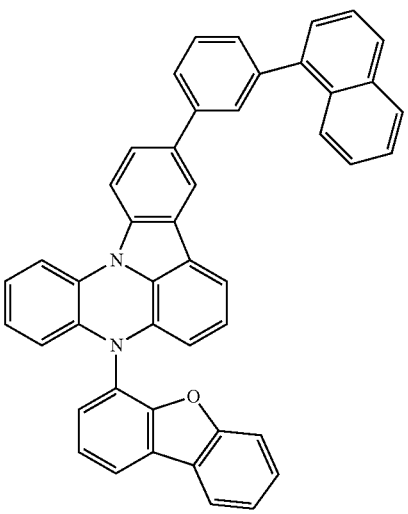

A21
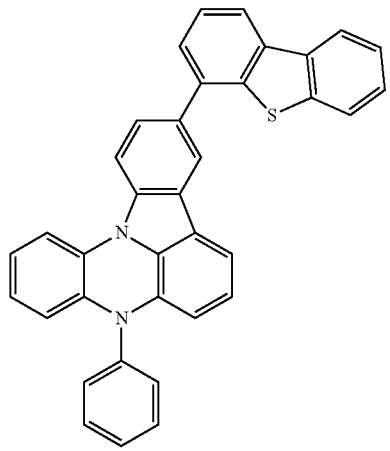
A22
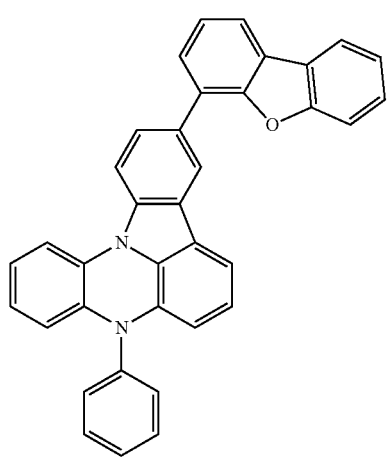
A23
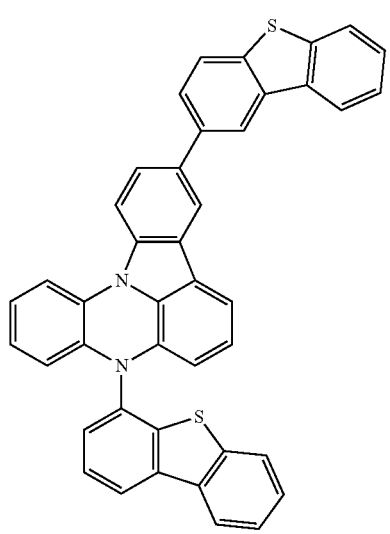
A24
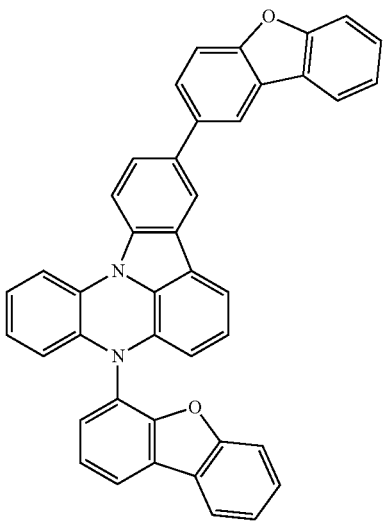
A25
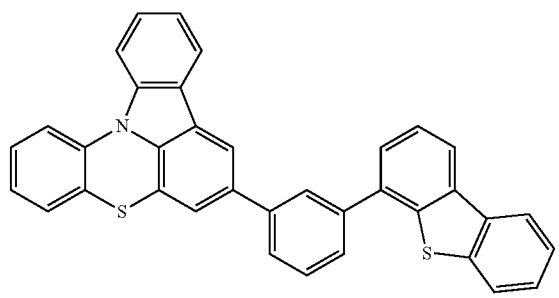
A26
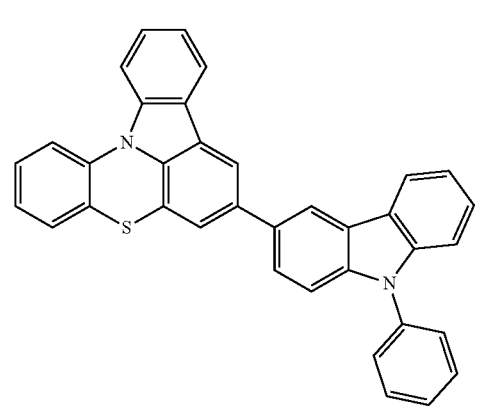
A27
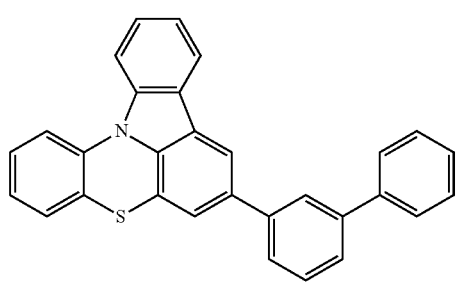

-continued
A28
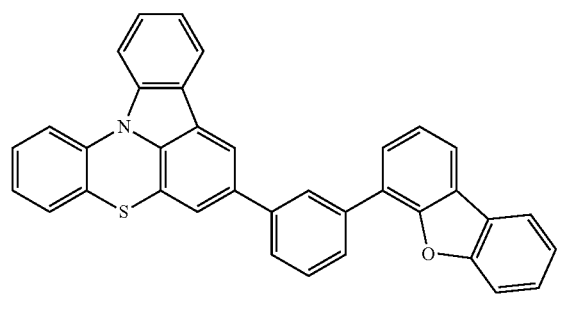
A30
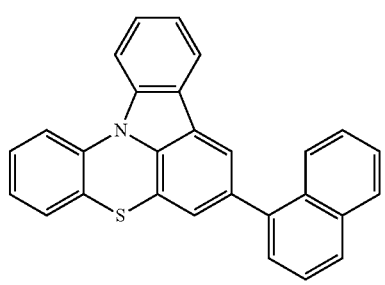
A31
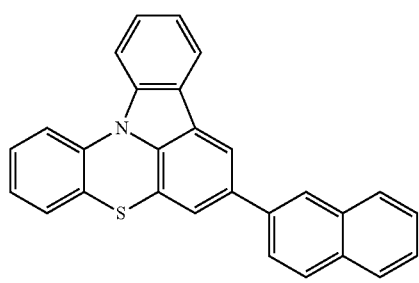
A32
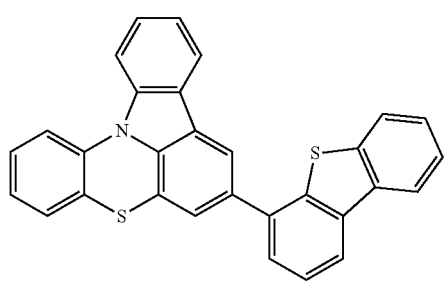
A33
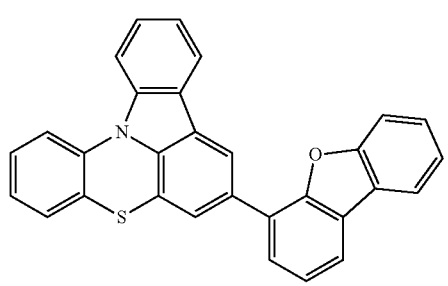
-continued
A34
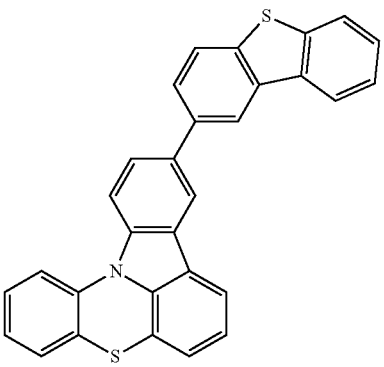
A35
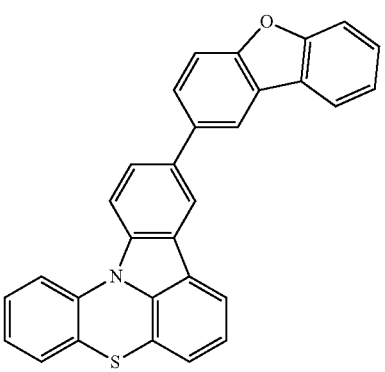
A37
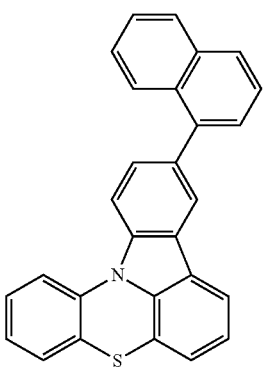
A38
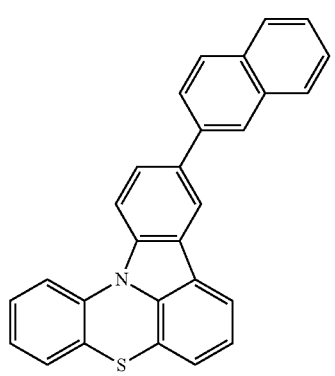

-continued
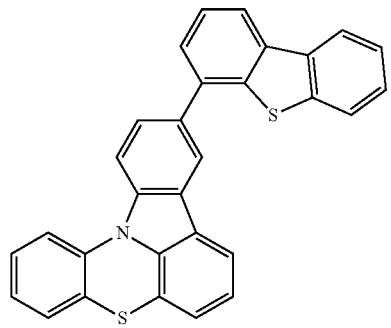
A39
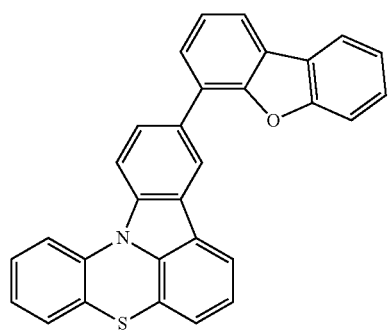
A40
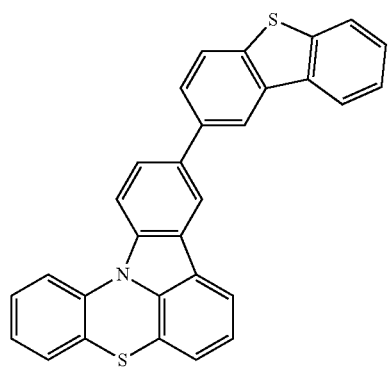
A41
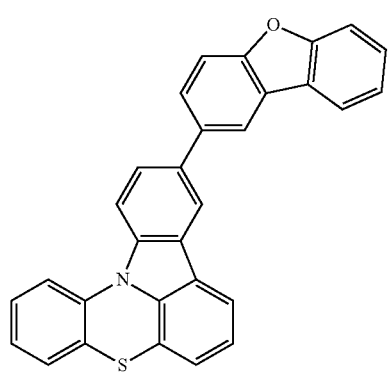
A42
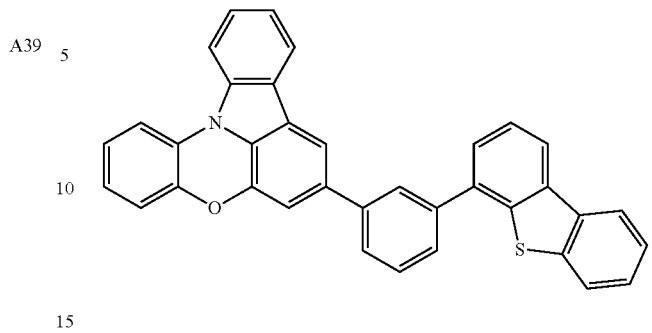
A43
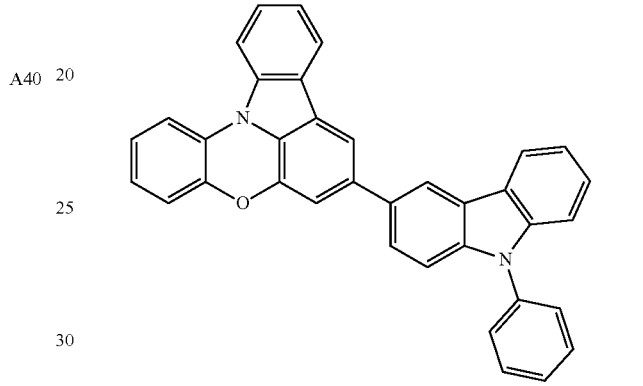
A44
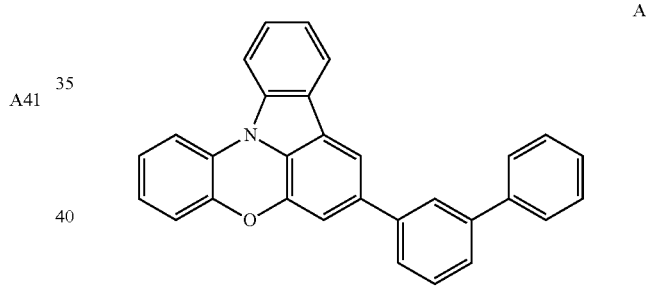
A45
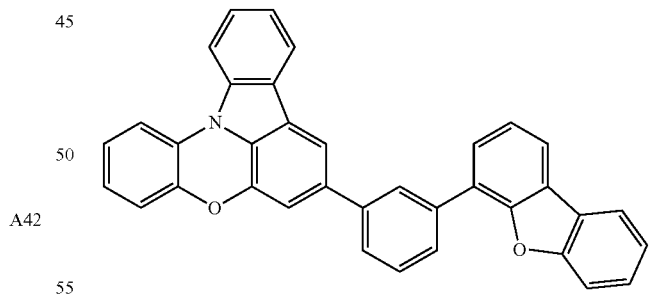
A46
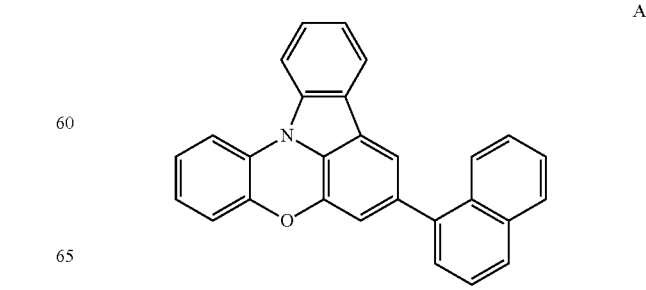
A48

-continued

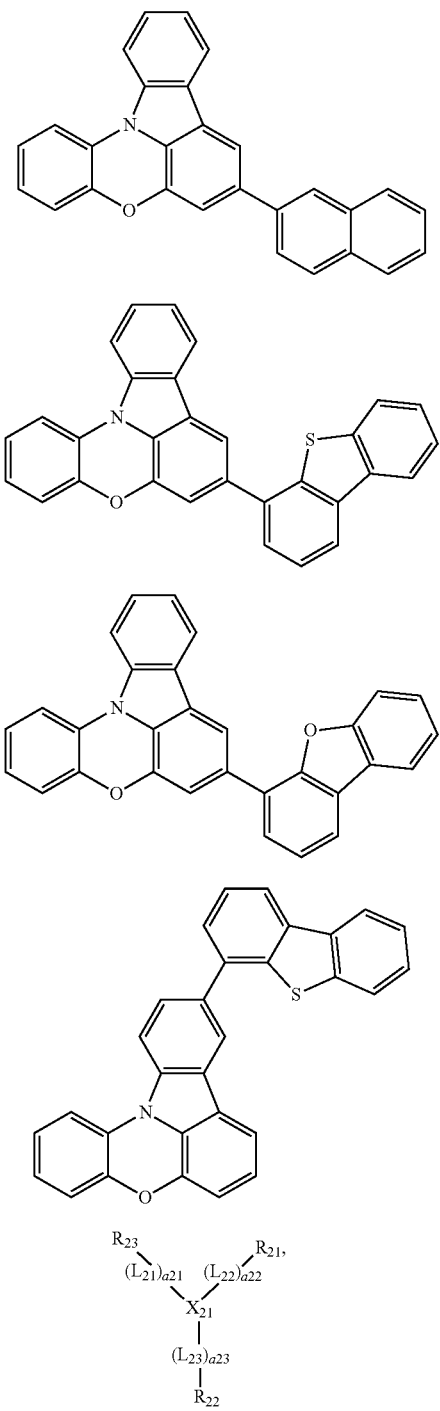

wherein, in Formula 2, $X_{21}$ is selected from B, N, and P;

$L_{21}$ to $L_{23}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a23 are each independently selected from 0, 1, 2, 3, 4, and 5;

$R_{21}$ to $R_{23}$ are each independently selected from groups represented by Formulae 5-1 to 5-7, and 5-9 to 5-12:

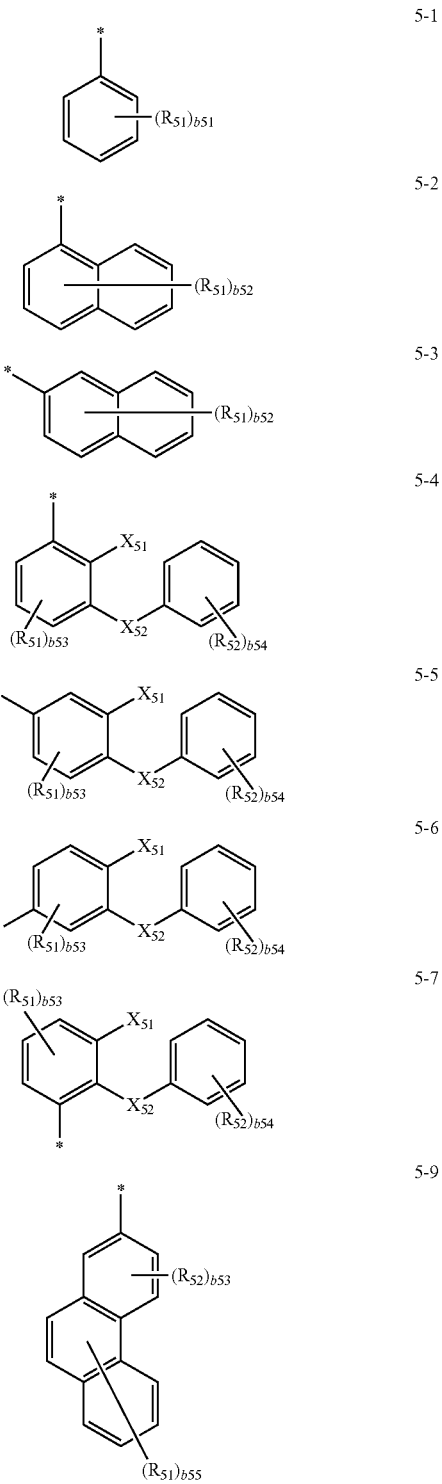

5-10

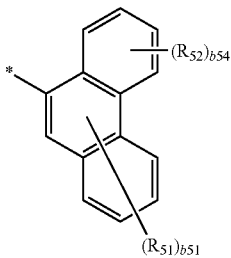

5-11

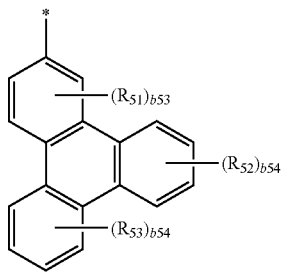

5-12

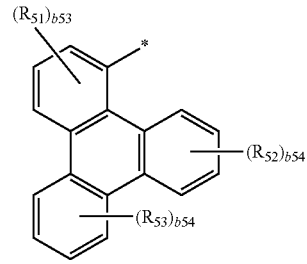

wherein, in Formulae 5-1 to 5-7, and 5-9 to 5-12,
$X_{51}$ is selected from a single bond, $N(R_{54})$, $C(R_{54})(R_{55})$, O, and S;
$X_{52}$ is selected from $N(R_{56})$, $C(R_{56})(R_{57})$, O, and S;
$R_{51}$ to $R_{57}$ are each independently selected from:
hydrogen, deuterium, a cyano group, a $C_1$-$C_{20}$ alkyl group, a phenyl group, naphthyl group, and a fluorenyl group, and $R_{54}$ and $R_{55}$ are optionally combined with each other to form a ring;
b51 is selected from 1, 2, 3, 4, and 5;
b52 is selected from 1, 2, 3, 4, 5, 6, and 7;
b53 is selected from 1, 2, and 3;
b54 is selected from 1, 2, 3, and 4;
b55 is selected from 1, 2, 3, 4, 5, and 6; and
* indicates a binding site to a neighboring atom.

\* \* \* \* \*